US009357040B2

(12) United States Patent
Song et al.

(10) Patent No.: US 9,357,040 B2
(45) Date of Patent: May 31, 2016

(54) TRANSMITTING SYSTEM AND METHOD FOR TRANSMITTING DIGITAL BROADCAST SIGNAL

(71) Applicant: LG ELECTRONICS INC., Seoul (KR)

(72) Inventors: Won Gyu Song, Gyeonggi-do (KR); Byoung Gill Kim, Seoul (KR); Jin Woo Kim, Seoul (KR); Hyoung Gon Lee, Gyonggi-do (KR); Jae Hyung Song, Seoul (KR); In Hwan Choi, Gyeonggi-do (KR); Chul Kyu Mun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/175,817

(22) Filed: Feb. 7, 2014

(65) Prior Publication Data

US 2014/0153585 A1  Jun. 5, 2014

Related U.S. Application Data

(63) Continuation of application No. 12/972,378, filed on Dec. 17, 2010, now Pat. No. 8,681,679.

(60) Provisional application No. 61/288,842, filed on Dec. 21, 2009.

(51) Int. Cl.
*H04L 27/02* (2006.01)
*H04L 29/06* (2006.01)
(Continued)

(52) U.S. Cl.
CPC ........... *H04L 69/26* (2013.01); *H03M 13/2909* (2013.01); *H03M 13/2921* (2013.01);
(Continued)

(58) Field of Classification Search
CPC .......... H04N 21/235; H04N 21/23614; H04N 21/4348; H04N 21/2381; H04M 13/15; H04M 13/6538; H04H 20/57; H03M 13/09; H03M 13/1515; H03M 13/2909; H03M 13/2921; H03M 13/2957; H03M 13/296; H03M 13/2966; H03M 13/2972; H03M 13/356; H03M 13/6356; H03M 13/15; H04L 69/26; H04L 1/0042; H04L 1/0047; H04L 1/0057; H04L 1/006; H04L 1/007; H04L 1/0071; H04L 27/02; H04L 69/03
USPC ................. 370/310, 312, 321, 337, 347, 442; 375/240.27
See application file for complete search history.

(56) References Cited

U.S. PATENT DOCUMENTS 4,887,260 A 12/1989 Carden et al.
5,506,848 A  4/1996 Drakopoulos et al.
(Continued)

OTHER PUBLICATIONS

Advanced Television Systems Committee (ATSC), "ATSC Standard: A/153 Part 9 Scalable Full Channel Mobile Mode," ATSC, Doc. A/153 Part 9:2011, Jun. 2011, 370 pages.

*Primary Examiner* — Gary Mui
*Assistant Examiner* — Michael Phillips
(74) *Attorney, Agent, or Firm* — Dentons US LLP

(57) ABSTRACT

A transmitting system and a method of transmitting digital broadcast signal are disclosed. The method of transmitting digital broadcast signal includes generating signaling data including a transmission parameter, wherein the transmission parameter includes a protocol version field identifying between a first transmission mode and a second transmission mode, forming a data group including mobile service data and the signaling data, forming mobile service data packets including the mobile service data and the signaling data in the data group, transmitting the digital broadcast signal including the data group.

6 Claims, 61 Drawing Sheets

(51) Int. Cl.
*H03M 13/29* (2006.01)
*H03M 13/35* (2006.01)
*H03M 13/00* (2006.01)
*H04L 1/00* (2006.01)
*H03M 13/09* (2006.01)
*H03M 13/15* (2006.01)

(52) U.S. Cl.
CPC ........ *H03M13/2966* (2013.01); *H03M 13/356* (2013.01); *H03M 13/6356* (2013.01); *H04L 1/006* (2013.01); *H04L 1/007* (2013.01); *H04L 1/0042* (2013.01); *H04L 1/0047* (2013.01); *H04L 1/0057* (2013.01); *H04L 1/0071* (2013.01); *H04L 27/02* (2013.01); *H04L 69/03* (2013.01); *H03M 13/09* (2013.01); *H03M 13/15* (2013.01); *H03M 13/1515* (2013.01); *H03M 13/296* (2013.01); *H03M 13/2957* (2013.01); *H03M 13/2972* (2013.01)

(56) References Cited

U.S. PATENT DOCUMENTS

| | | | |
|---|---|---|---|
| 5,570,355 | A | 10/1996 | Dail et al. |
| 5,671,156 | A | 9/1997 | Weerackody et al. |
| 5,799,012 | A | 8/1998 | Ayerst et al. |
| 5,864,557 | A | 1/1999 | Lyons |
| 5,878,236 | A | 3/1999 | Kleineberg et al. |
| 5,963,557 | A | 10/1999 | Eng |
| 6,055,242 | A | 4/2000 | Doshi et al. |
| 6,198,728 | B1 | 3/2001 | Hulyalkar et al. |
| 6,266,330 | B1 | 7/2001 | Jokinen et al. |
| 6,327,476 | B1 | 12/2001 | Koscal |
| 6,356,546 | B1 | 3/2002 | Beshai |
| 6,366,761 | B1 | 4/2002 | Montpetit |
| 6,456,605 | B1 | 9/2002 | Laakso et al. |
| 6,570,890 | B1 | 5/2003 | Keenan et al. |
| 6,611,536 | B1 | 8/2003 | Ahmed |
| 6,798,736 | B1 | 9/2004 | Black et al. |
| 6,934,752 | B1 | 8/2005 | Gubbi |
| 6,973,055 | B1 | 12/2005 | Du |
| 7,031,259 | B1 | 4/2006 | Guttman et al. |
| 7,298,728 | B2 | 11/2007 | Golla et al. |
| 7,385,999 | B1 | 6/2008 | Young et al. |
| 7,564,818 | B2 | 7/2009 | Black et al. |
| 7,710,938 | B2 | 5/2010 | Choi et al. |
| 7,818,446 | B2 | 10/2010 | Katayama |
| 8,311,096 | B2* | 11/2012 | Rusch-Ihwe ............ 375/240.02 |
| 8,356,320 | B2* | 1/2013 | Song ................... H04H 20/67 725/54 |
| 2001/0036174 | A1 | 11/2001 | Herring |
| 2002/0063924 | A1 | 5/2002 | Kimbrough et al. |
| 2002/0141436 | A1 | 10/2002 | Toskala |
| 2002/0174248 | A1 | 11/2002 | Morriss |
| 2003/0137975 | A1 | 7/2003 | Song et al. |
| 2004/0100929 | A1 | 5/2004 | Garcia-Luna-Aceves |
| 2004/0106417 | A1 | 6/2004 | Schieder et al. |
| 2004/0151212 | A1 | 8/2004 | Gerszberg et al. |
| 2004/0213174 | A1 | 10/2004 | Engels et al. |
| 2004/0218563 | A1 | 11/2004 | Porter et al. |
| 2004/0252725 | A1* | 12/2004 | Sun ................... H04L 1/0057 370/503 |
| 2005/0111397 | A1 | 5/2005 | Attar et al. |
| 2005/0193408 | A1 | 9/2005 | Sull et al. |
| 2006/0013342 | A1* | 1/2006 | Rhee ................. H03M 13/2707 375/340 |
| 2006/0023717 | A1* | 2/2006 | Trachtman ............ H04L 1/0009 370/392 |
| 2006/0026492 | A1* | 2/2006 | Rhee ................. H03M 13/2782 714/784 |
| 2006/0045001 | A1 | 3/2006 | Jalali |
| 2006/0176881 | A1 | 8/2006 | Ma et al. |
| 2007/0136055 | A1 | 6/2007 | Hetherington |
| 2007/0230406 | A1 | 10/2007 | Kim et al. |
| 2007/0293157 | A1 | 12/2007 | Haartsen et al. |
| 2008/0080363 | A1 | 4/2008 | Black et al. |
| 2008/0080422 | A1 | 4/2008 | Frederiksen et al. |
| 2008/0083000 | A1* | 4/2008 | Orrell et al. ...................... 725/53 |
| 2008/0134007 | A1* | 6/2008 | Lee ...................... H04L 1/0041 714/776 |
| 2008/0186850 | A1* | 8/2008 | Lee et al. ...................... 370/232 |
| 2008/0192858 | A1* | 8/2008 | Kim et al. ...................... 375/295 |
| 2008/0212504 | A1 | 9/2008 | Venkataraman et al. |
| 2008/0219338 | A1* | 9/2008 | Chrabieh ...................... 375/231 |
| 2008/0225901 | A1 | 9/2008 | Gerszberg et al. |
| 2008/0240065 | A1* | 10/2008 | Choi et al. ...................... 370/342 |
| 2009/0022111 | A1 | 1/2009 | Cho et al. |
| 2009/0028079 | A1 | 1/2009 | Song et al. |
| 2009/0028080 | A1 | 1/2009 | Song et al. |
| 2009/0028081 | A1 | 1/2009 | Song et al. |
| 2009/0028272 | A1 | 1/2009 | Song et al. |
| 2009/0034442 | A1 | 2/2009 | Song et al. |
| 2009/0034556 | A1 | 2/2009 | Song et al. |
| 2009/0034630 | A1 | 2/2009 | Cho et al. |
| 2009/0037792 | A1* | 2/2009 | Choi et al. ...................... 714/755 |
| 2009/0040969 | A1 | 2/2009 | Kim et al. |
| 2009/0042592 | A1 | 2/2009 | Cho et al. |
| 2009/0044073 | A1* | 2/2009 | Cho et al. ...................... 714/758 |
| 2009/0055871 | A1 | 2/2009 | Song et al. |
| 2009/0059086 | A1* | 3/2009 | Lee et al. ...................... 348/725 |
| 2009/0060030 | A1* | 3/2009 | Song et al. ............ 375/240.01 |
| 2009/0080435 | A1 | 3/2009 | Choi et al. |
| 2009/0083606 | A1* | 3/2009 | Choi et al. ...................... 714/776 |
| 2009/0092148 | A1 | 4/2009 | Zhang et al. |
| 2009/0100148 | A1 | 4/2009 | Murali et al. |
| 2009/0103530 | A1 | 4/2009 | Fartmann et al. |
| 2009/0175218 | A1 | 7/2009 | Song et al. |
| 2009/0181683 | A1 | 7/2009 | Ryu |
| 2009/0201827 | A1 | 8/2009 | Kwon et al. |
| 2009/0228764 | A1 | 9/2009 | Lee et al. |
| 2009/0228765 | A1* | 9/2009 | Lee ................... H03M 13/2966 714/776 |
| 2009/0257391 | A1 | 10/2009 | Song et al. |
| 2009/0271687 | A1 | 10/2009 | Lee et al. |
| 2009/0304065 | A1 | 12/2009 | Choi et al. |
| 2009/0310588 | A1 | 12/2009 | Padovani et al. |
| 2009/0323729 | A1 | 12/2009 | Simon et al. |
| 2009/0323823 | A1* | 12/2009 | Limberg ............ H03M 13/256 375/240.25 |
| 2010/0061465 | A1* | 3/2010 | Limberg ...................... 375/240.27 |
| 2010/0100793 | A1* | 4/2010 | Limberg ............ H03M 13/258 714/756 |
| 2010/0269013 | A1* | 10/2010 | Choi et al. ...................... 714/755 |
| 2010/0296506 | A1* | 11/2010 | Ryu ...................... H04L 1/0086 370/350 |
| 2011/0096796 | A1* | 4/2011 | Zhang et al. ...................... 370/474 |
| 2011/0138247 | A1* | 6/2011 | Limberg ............ H04L 1/0041 714/751 |
| 2011/0164174 | A1 | 7/2011 | Limberg |
| 2012/0020276 | A1 | 1/2012 | Markman |
| 2012/0236922 | A1* | 9/2012 | Jeong et al. ...................... 375/232 |

\* cited by examiner

FIG. 8

| Group Type | Group Division Primary / AB | Group Division Scondary | Group Format | # pkt / Slot M/H | # pkt / Slot Main | Description |
|---|---|---|---|---|---|---|
| 0 | ABCD / AB | - / CD | G0 | 118 | 38 | CMM (no Region E) |
| 1-0 | ABCD | E | G1-0 | 156 | 0 | Region ABCD: CMM<br>Region E: EMM |
| 1-1 | ABCD | E | G1-1 | 155 | 1 | |
| 1-2 | ABCD | E | G1-2 | 154 | 2 | |
| 1-4 | ABCD | E | G1-4 | 152 | 4 | |
| 1-8 | ABCD | E | G1-8 | 148 | 8 | |
| 2-0 | AB | CDE | G2-0 | 156 | 0 | Region AB: CMM<br>Region CDE: EMM |
| 2-1 | AB | CDE | G2-1 | 155 | 1 | |
| 2-2 | AB | CDE | G2-2 | 154 | 2 | |
| 2-4 | AB | CDE | G2-4 | 152 | 4 | |
| 2-8 | AB | CDE | G2-8 | 148 | 8 | |
| 3-0 | ABCD | - | G2-0 | 156 | 0 | All Region: EMM |
| 3-1 | ABCD | - | G2-1 | 155 | 1 | |
| 3-2 | ABCD | - | G2-2 | 154 | 2 | |
| 3-4 | ABCD | - | G2-4 | 152 | 4 | |
| 3-8 | ABCD | - | G2-8 | 148 | 8 | |
| 4 | ABCD | - | G3 | 156 | 0 | Increased Bandwidth Mode (Special Use Case)<br>No MPEG2 Headers, No VSB RS parities.<br>Output packet of Pre-processor has 207 bytes not 188 bytes |

Black: A/153-compatible (CMM)
Bold: A/153-non-compatible (EMM)

Note: A Parade consists of Group Divisions from Groups having an identical Group Type

FIG. 46

| Type Indicator (3) | Error Indicator (1) | Stuff Indicator (1) | Pointer Indicator (11) | Payload (N-2) bytes |

FIG. 47
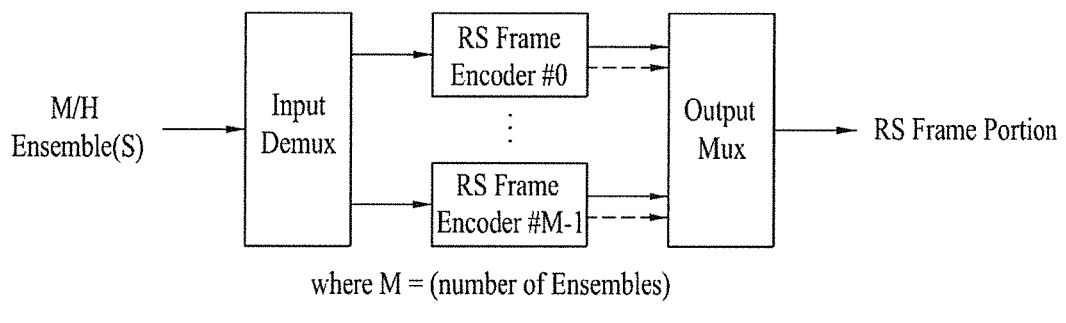
(a)
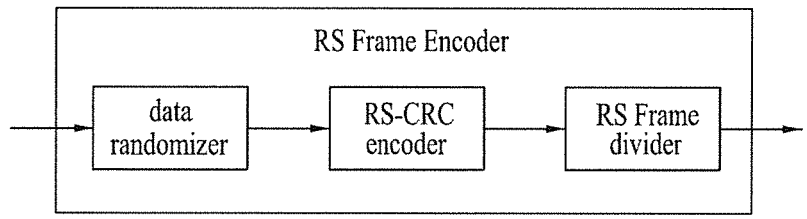
(b)

FIG. 53

| Syntax | No. of Bits | Format |
|---|---|---|
| TPC_data { | | |
|   sub_frame_number | 3 | uimsbf |
|   slot_number | 4 | uimsbf |
|   parade_id | 7 | uimsbf |
|   if(sub_frame_number ≤ 1) { | | |
|     current_starting_group_number | 4 | uimsbf |
|     current_number_of_groups_minus_1 | 3 | uimsbf |
|   } | | |
|   if(sub_frame_number ≥ 2) { | | |
|     next_starting_group_number | 4 | uimsbf |
|     next_number_of_groups_minus_1 | 3 | uimsbf |
|   } | | |
|   parade_repetition_cycle_minus_1 | 3 | uimsbf |
|   if(sub_frame_number ≤ 1) { | | |
|     current_rs_frame_mode | 2 | bslbf |
|     current_rs_frame_mode_primary | 2 | bslbf |
|     current_rs_frame_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d | 2 | bslbf |
|   } | | |
|   if(sub_frame_number ≥ 2) { | | |
|     next_rs_frame_mode | 2 | bslbf |
|     next_rs_frame_mode_primary | 2 | bslbf |
|     next_rs_frame_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d | 2 | bslbf |
|   } | | |
|   fic_version | 5 | uimsbf |
|   parade_continuity_counter | 4 | uimsbf |
|   if(sub_frame_number ≤ 1) { | | |
|     current_TNoG | 5 | uimsbf |
|     reserved | 5 | '11111' |
|   } | | |
|   if(sub_frame_number ≥ 2) { | | |
|     next_TNoG | 5 | uimsbf |
|     current_TNoG | 5 | uimsbf |
|   } | | |
|   if(sub_frame_number ≤ 1) { | | |
|     current_group_extension_mode | 3 | bslbf |
|     current_sccc_outer_code_mode_e | 2 | bslbf |
|     current_c2s_parade_nogd | 3 | uimsbf |
|     current_c2s_parade_num | 1 | bslbf |
|   } | | |
|   if(sub_frame_number ≥ 2) { | | |
|     next_group_extension_mode | 3 | bslbf |
|     next_sccc_outer_code_mode_e | 2 | bslbf |
|     next_c2s_parade_nogd | 3 | uimsbf |
|     next_c2s_parade_num | 1 | bslbf |
|   } | | |
|   training_concatenation_indicator { | | |
|     backward_concatenation_indicator | 3 | bslbf |
|     forward_concatenation_indicator | 1 | bslbf |
|   } | | |
|   reserved | 3 | '111' |
|   tpc_protocol_version | 5 | '11000' |

FIG. 55

| Syntax | No. of Bits | Format |
|---|---|---|
| TPC_data { | | |
|    sub-frame_number | 3 | uimsbf |
|    slot_number | 4 | uimsbf |
|    parade_id | 7 | uimsbf |
|    if(sub-frame_number≤1) { | | |
|       current_starting_group_number | 4 | uimsbf |
|       current_number_of_groups_minus_1 | 3 | uimsbf |
|    } | | |
|    if(sub-frame_number≥2) { | | |
|       next_starting_group_number | 4 | uimsbf |
|       next_number_of_groups_minus_1 | 3 | uimsbf |
|    } | | |
|    parade_repetition_cycle_minus_1 | 3 | uimsbf |
|    if(sub-frame_number≤1) { | | |
|       current_group_extension_mode | 3 | bslbf |
|       current_rs_code_mode | 2 | bslbf |
|       current_sccc_outer_code_mode | 2 | bslbf |
|    } | | |
|    if(sub-frame_number≥2) { | | |
|       next_group_extension_mode | 3 | bslbf |
|       next_rs_code_mode | 2 | bslbf |
|       next_sccc_outer_code_mode | 2 | bslbf |
|    } | | |
|    fic_version | 5 | uimsbf |
|    parade_continuity_counter | 4 | uimsbf |
|    training_concatenation_indicator | | |
|       backward_concatenation_indicator | 3 | bslbf |
|    } | | |
|    reserved | 32 | all '1's |
|    tpc_protocol_version | 5 | '00111' |

TRANSMITTING SYSTEM AND METHOD FOR TRANSMITTING DIGITAL BROADCAST SIGNAL

CROSS-REFERENCE TO RELATED APPLICATIONS

This application is a continuation of U.S. application Ser. No. 12/972,378, filed Dec. 17, 2010, currently pending, which claims the benefit of U.S. Provisional Application Ser. No. 61/288,842, filed on Dec. 21, 2009, the contents of all of which are hereby incorporated by reference herein in their entireties.

BACKGROUND OF THE INVENTION

1. The Field of the Invention

The present invention relates to a digital broadcasting system for transmitting and receiving a digital broadcast signal, and more particularly, to a transmitting system for processing and transmitting the digital broadcast signal, and a method of processing data in the transmitting system and the receiving system.

2. Description of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a method of processing a digital broadcast signal in a transmitting system that substantially obviate one or more problems due to limitations and disadvantages of the related art.

An object of the present invention is to provide a transmission system which is able to transmit additional mobile service data while simultaneously maintaining the compatibility with a conventional system for transmitting a digital broadcast signal, and a method for processing a broadcast signal.

Another object of the present invention is to provide a method of transmitting mobile services that can flexibly respond to changes in a mobile broadcasting system, by processing a partial region of a data group so as to be compatible with the conventional mobile broadcasting system, or by processing the entire region of a data group so as to be used for a new mobile broadcasting system.

Another object of the present invention is to provide a transmission system which additionally inserts mobile service data and known data recognized by an agreement between a transmission system and a reception system into a conventional mobile service data area, thereby enhancing the reception performance of the mobile service data at the reception system, and a method for processing a broadcast signal.

Another object of the present invention is to provide a transmission system which forms continuous known data sequences by interconnecting discontinuous known data belonging to each data group through a concatenated structure of adjacent data groups, thereby enhancing the reception performance of a broadcast signal at a reception system, and a method for processing a broadcast signal.

Another object of the present invention is to provide a transmission system which generates information of additional mobile service data by extending signaling information and transmits the generated information to a reception system, such that the transmission system and the reception end can smoothly communicate with each other, and a method for processing a broadcast signal.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of transmitting digital broadcast signal includes generating signaling data including a transmission parameter, wherein the transmission parameter includes a protocol version field identifying between a first transmission mode and a second transmission mode, forming a data group including mobile service data and the signaling data, forming mobile service data packets including the mobile service data and the signaling data in the data group, wherein the first transmission mode is a mode in which the mobile service data are transmitted while reserving greater than 118 packets out of 156 packets in the slot and a second transmission mode is in which the mobile service data are transmitted while reserving less than or equal to 118 packets out of 156 packets in the slot, transmitting the digital broadcast signal including the data group.

The protocol version field includes 5 bits in which 2 bits indicate that a non-backward compatible level of change to the signaling data and 3 bits indicate a backward compatible level of change to the signaling data.

The data transmission parameter includes an extension mode field indicating a number of mobile service data packets exceeding 118 in the data group.

The data transmission parameter includes a transmission parameter field indicating a number of mobile service data packets exceeding 118 in a data group of other data frame, wherein the data frame includes 5 consecutive sub-frames, and wherein the sub-frame includes 16 consecutive slots, a slot is a time period during which the data group is transmitted.

The protocol version field includes 5 bits, at least one of which is changed to indicate that a structure of the signaling data is changed.

Also, An apparatus of transmitting digital broadcast signal is described herein, the apparatus comprises means for fulfilling above mentioned method.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 8 illustrates an example of each group type being segmented based upon the size of region E according to an embodiment of the present invention.

FIG. 46 is a diagram illustrating examples of fields allocated to the header region within the mobile service data packet according to the present invention. Examples of the fields include type_indicator field, error_indicator field, stuff_indicator field, and pointer field.

FIG. 47(a)-47(b) illustrate a data frame encoder according to an embodiment of the present invention.

FIG. 53 illustrates a syntax structure of Transmission Parameter Channel (TPC) data according to an embodiment of the present invention.

FIG. 55 illustrates a syntax of the TPC data, when the major version is increased, according to the embodiment of the present invention.

DESCRIPTION OF THE PREFERRED EMBODIMENTS

Figure 1:
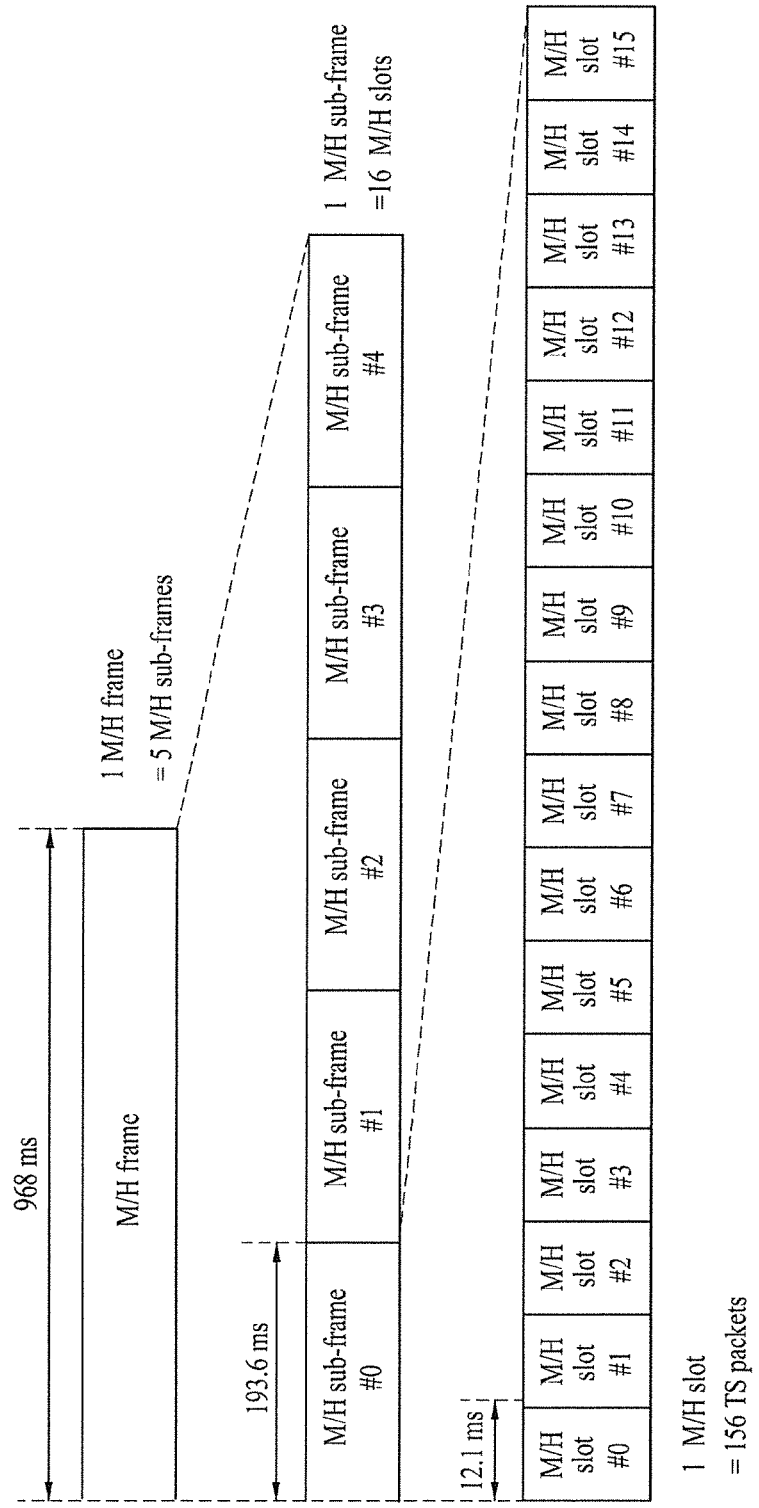
FIG. 1 illustrates a data frame (M/H frame) structure for transmitting/receiving mobile service data according to one embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

For convenience of description and better understanding of the present invention, abbreviations and terms to be use in the present invention are defined as follows.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Additionally, in the embodiment of the present invention, a group (also referred to as an M/H group or a data group) corresponds to a collection (or group) of data packets confined within a slot (also referred to as an M/H slot).

A group division refers to a set of group regions within a slot. Herein, a group division is categorized into a Primary Group Division or a Secondary Group Division. At this point, a collection of primary group divisions within an M/H frame configures (or forms) a primary parade, whereas a collection of secondary group divisions configures (or forms) a secondary parade or an overlay parade.

A group type is determined by the configuration of a group division within a single group.

A parade (also referred to as an M/H parade) refers to a collection of groups that have the same FEC parameters. More specifically, a parade refers to a collection of group divisions of groups having the same group type.

A primary parade (also referred to as a primary M/H parade) corresponds to a collection of primary group divisions, and a secondary parade (also referred to as a secondary M/H parade) corresponds to a collection of secondary group divisions. Each of the secondary group divisions is carried (or transported) through the same slot with its respectively paired primary group division. The secondary parade has the same parade identifier (ID) as its respective primary parade (i.e., the secondary parade shares the same parade ID with its respective primary parade).

An overlay parade (also referred to as an overlay M/H parade) corresponds to a collection of secondary group divisions. And, in this case, the secondary group divisions are not paired with any of the primary group divisions.

An RS frame corresponds to a two (2)-dimensional (2D) data frame, wherein an RS frame payload is RS-CRC encoded.

In a primary RS frame, a primary RS frame parade is RS-CRC encoded. The primary RS frame is transmitted (or carried) through a primary parade.

In a secondary RS frame, a secondary RS frame parade is RS-CRC encoded. The secondary RS frame is transmitted (or carried) through a secondary parade.

In an overlay RS frame, an overlay RS frame payload is RS-CRC encoded. The overlay RS frame is transmitted (or carried) through an overlay parade.

A super RS frame corresponds to an RS frame wherein a super RS frame payload is RS-CRC encoded. The super RS frame is transported (or carried) through two arbitrary parades.

An ensemble (also referred to as an M/H ensemble) refers to a collection of RS frame having the same FEC codes. Herein, each RS frame encapsulates a collection of a collection of IP streams.

A primary ensemble corresponds to a collection of consecutive primary RS frames.

A secondary ensemble corresponds to a collection of consecutive secondary RS frames.

An overlay ensemble corresponds to a collection of consecutive overlay RS frames.

A super ensemble (also referred to as a super M/H ensemble) corresponds to a collection of consecutive super RS frames.

In the embodiment of the present invention, data for mobile services may be transmitted by using a portion of the channel capacity that was used to transmit data for main services. Alternatively, data for mobile service may also be transmitted by using the entire channel capacity that was used to transmit data for main services. The data for mobile services correspond to data required for mobile services. Accordingly, the data for mobile services may include actual mobile service data as well as known data, signaling data, RS parity data for error-correcting mobile service data, and so on. In the description of the embodiment of the present invention, the data for mobile services will be referred to as mobile service data or mobile data for simplicity.

The mobile service data may be categorized as mobile service data of a first mobile mode or Core Mobile Mode (CMM) and mobile service data of a second mobile mode or Extended Mobile Mode (EMM) or Scalable Full Channel Mobile Mode (SFCMM).

Furthermore, when the second mobile mode is used along with the first mobile mode, the above-described two modes may be collectively defined as the Scalable Full Channel Mobile Mode (SFCMM).

The first mobile mode is a mode in which Mobile DTV services are transmitted while reserving at least 38 of the 156 packets in each M/H Slot for legacy A/53-compatible services. The second mobile mode is a mode in which Mobile DTV services are transmitted while reserving fewer than 38 of the 156 packets in some or all M/H Slots for legacy A/53-compatible services.

According to the definition of CMM, SFCMM, Ensemble and Parade, the CMM ensemble is a Primary or Secondary Ensemble that is compatible with the CMM system. A CMM Ensemble carries a collection of CMM Services and the SFCMM ensemble is a Primary or Secondary Ensemble that carries a collection of SFCMM Services and is backwards compatible with, but not recognizable by, a CMM receiver/decoder.

And also, the CMM Parade is an M/H Parade that is compatible with the CMM system. A CMM Parade consists of DATA Groups, where each DATA Group does not include the Group Region E and carries an entire RS Frame belonging to the corresponding CMM Ensemble.

The SFCMM Parade is an M/H Parade that is backwards compatible with, but not recognizable by, a CMM system receiver/decoder. An SFCMM Parade consists of DATA Groups, where each DATA Group contains the Group Region E and carries an entire RS Frame belonging to the corresponding SFCMM Ensemble.

The CMM Service is an M/H Service that is compatible with the CMM system. A CMM Service is delivered through a CMM Ensemble. And the CMM Service is an M/H Service that is compatible with the CMM system. A CMM Service is delivered through a CMM Ensemble.

Also, according to an embodiment of the present invention, a group (also referred to as an M/H group or a data group) corresponds to a collection of M/H Encapsulated (MHE) data packets confined within a slot (also referred to as an M/H slot).

A group division corresponds to a collection (or set) of group regions (also referred to as M/H group regions) within a slot. Herein, a group division is categorized into a Primary Group Division or a Secondary Group Division.

A group region corresponds to a collection (or set) of DATA blocks or extended DATA blocks.

A group type is determined by the configuration of a group division within a single group.

Known data—Known data is pre-recognized by an agreement between a transmission system and a reception system, and may be used for channel equalization, etc.

FEC—FEC is an abbreviation of a Forward Error Correction, and is a generic name of technologies wherein a reception end can spontaneously correct an error of a digital signal transmitted from the transmission end to the reception end without retransmission of a corresponding signal by the transmission end.

TPC—TPC is an abbreviation of a Transmission Parameter Channel. TPC is contained in each data group, and then transmitted. The TPC provides information about a data frame and a data group to the reception end, and performs signaling of the provided information.

TS—TS is an abbreviation of a Transport Stream.

RS—RS is an abbreviation of Reed-Solomon.

CRC—CRC is an abbreviation of a Cyclic Redundancy Check.

SCCC—SCCC is an abbreviation of a Serial Concatenated Convolutional Code.

PCCC—PCCC is an abbreviation of a Parallel Concatenated Convolutional Code.

FIC—FIC is an abbreviation of a Fast information channel. FIC carries cross-layer information. This information primarily includes channel binding information between ensembles and services.

Embodiments of the present invention will hereinafter be described with reference to the annexed drawings.

FIG. 1 illustrates a data frame (M/H frame) structure for transmitting/receiving mobile service data according to one embodiment of the present invention.

In the embodiment of the present invention, the mobile service data are first multiplexed with main service data in data frame units and, then, modulated in a VSB mode and transmitted to the receiving system.

The term "data frame" mentioned in the embodiment of the present invention may be defined as the concept of a time during which main service data and mobile service data are transmitted. For example, one data frame may be defined as a time consumed for transmitting 20 VSB data frames.

At this point, one data frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 1, one data frame consists of 5 sub-frames, wherein each sub-frame includes 16 slots. In this case, the data frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One data group is transmitted during a single slot. In this case, the transmitted data group may include 118 mobile service data packets or (118+M) mobile service data packets.

That is, a data group may be defined as a set of data units including mobile service data present in one slot. In this case, the mobile service data may be defined as pure mobile service data, or may be defined as the concept that includes data for transmitting mobile service data, such as signaling data, known data, etc.

Figure 2:
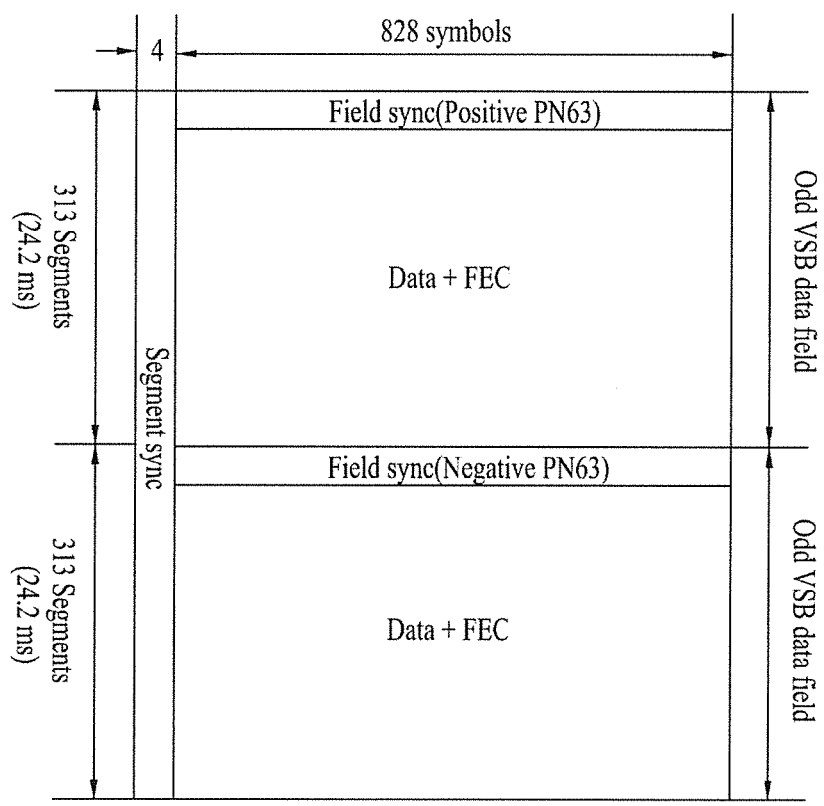
FIG. 2 illustrates an exemplary structure of a VSB frame, wherein one VSB frame consists of 2 VSB fields (i.e., an odd field and an even field). Herein, each VSB field includes a field synchronization segment and 312 data segments.

FIG. 2 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 3:
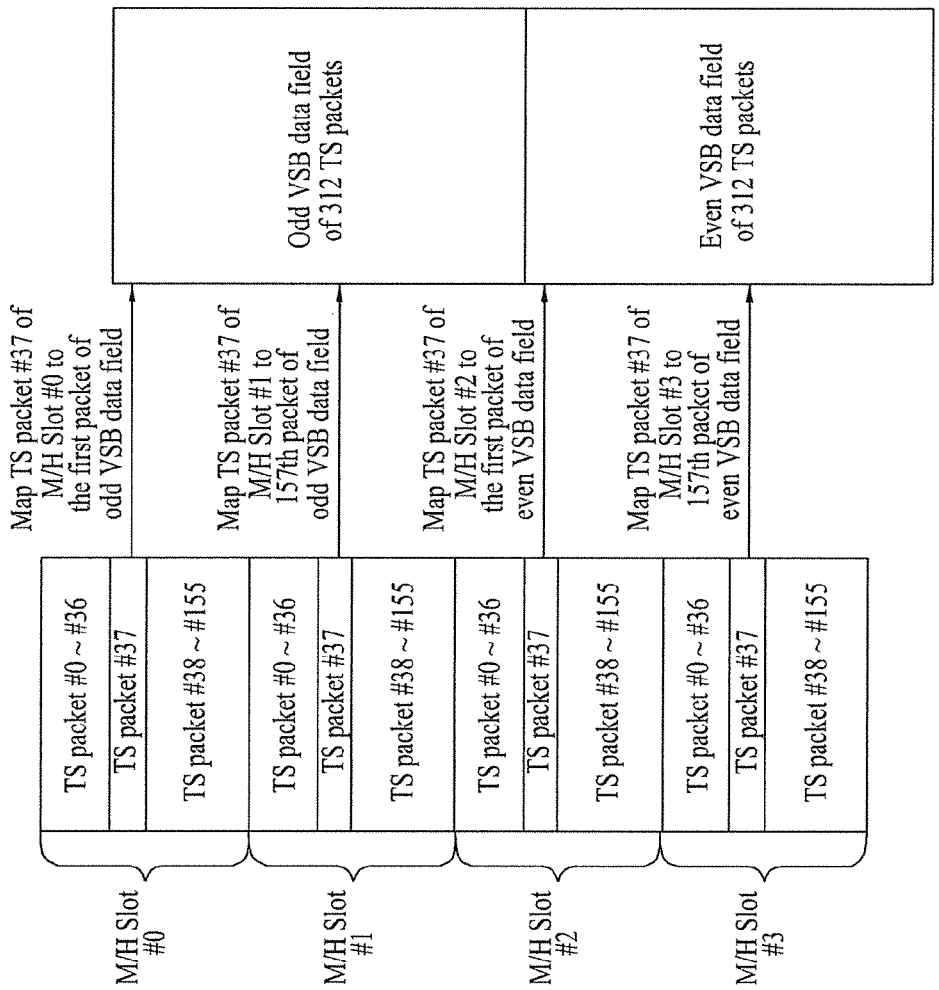
FIG. 3 illustrates a mapping example of the positions to which the first 4 slots of a sub-frame are assigned with respect to a VSB frame in a space region.

FIG. 3 illustrates a mapping example of the positions to which the first 4 slots of a sub-frame are assigned with respect to a VSB frame in a space region.

Referring to FIG. 3, a 38th data packet (TS packet #37) of a 1st slot (Slot #0) is mapped to the 1st data packet of an odd VSB field. A 38th data packet (TS packet #37) of a 2nd slot (Slot #1) is mapped to the 157th data packet of an odd VSB field. Also, a 38th data packet (TS packet #37) of a 3rd slot (Slot #2) is mapped to the 1st data packet of an even VSB field. And, a 38th data packet (TS packet #37) of a 4th slot (Slot #3) is mapped to the 157th data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

According to the embodiment of the present invention, a data group prior to being processed with data interleaving is divided into regions A, B, C, and D. At this point, the data group may further include region E. Herein, the size of region E is variable, and each group may include a number of data packets equal to or less than 38. More specifically, according to the embodiment of the present invention, region E may include a maximum of 38 data packets within a single group.

Figure 4:
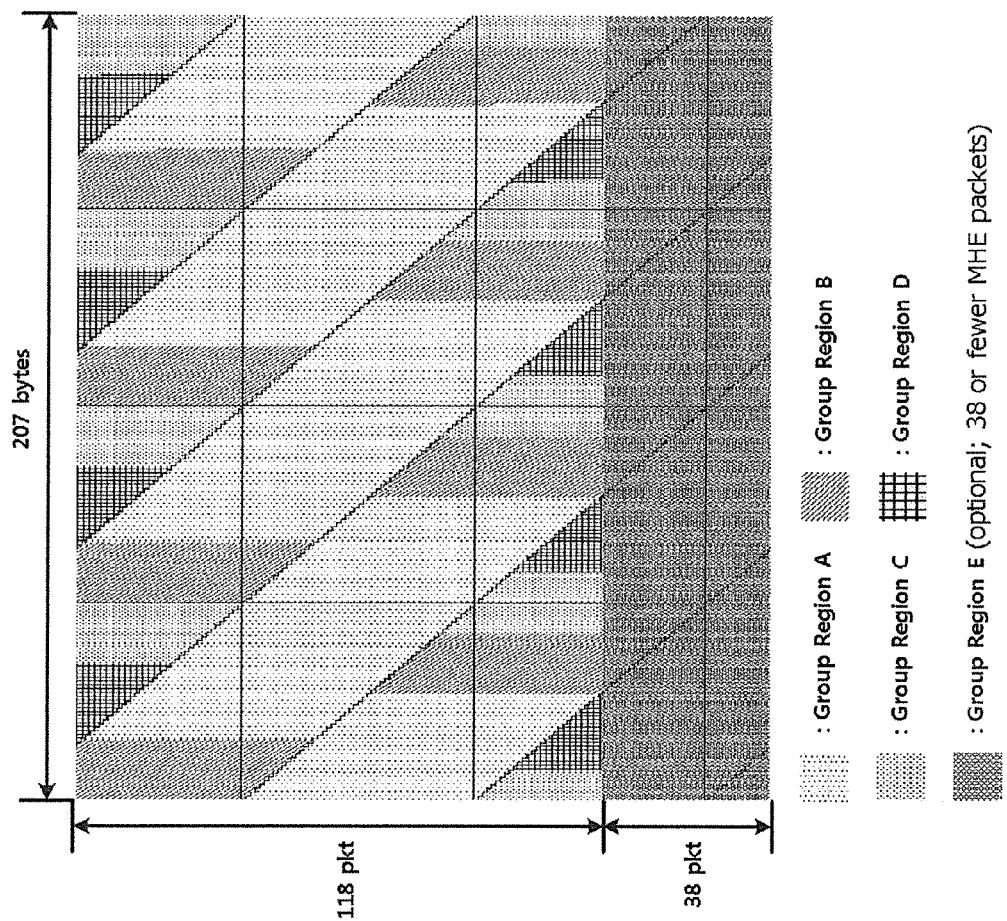
FIG. 4 illustrates a data group including (118+M) mobile service data packets according to an embodiment of the present invention.

FIG. 4 illustrates a data group including (118+M) mobile service data packets according to an embodiment of the present invention.

Referring to FIG. 4, the data group includes regions A, B, C, D and E. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions.

Meanwhile, a variable number (M) of mobile service data packets capable of being contained in the data group are contained in an additional region E. In the case where the data group in one slot is composed of 118 mobile service data packets, the region E can be defined as a specific region acquired when mobile service data packets are added to the region composed of only main service data packets. In other words, the region E may include a scalable number of mobile service data packets in one slot.

The mapping format of the mobile service data packets in the region E may be changed according to the intention of a designer. In other words, according to one embodiment of the present invention, when the number of mobile service data packets is 38 or less (i.e., M<38) as shown in FIG. 4, a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the region E are spaced apart from one another at intervals of a predetermined distance.

Also, the mobile service data being allocated to one group may be broadly divided into two types of mobile modes.

Herein, one of the mobile modes is referred to as a first mobile mode or a Core Mobile Mode (CMM), and the other mobile mode is referred to as a second mobile mode or an Extended Mobile Mode (EMM) or a Scalable Full Channel Mobile Mode (SFCMM). Furthermore, the first mobile mode and the second mobile mode may be collectively referred to as the Scalable Full Channel Mobile Mode (SFCMM). At this point, the mobile service data of the first mobile mode and the mobile service data of the second mobile mode may be encoded at a coding rate of ½, ⅓, or ¼.

The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Figure 5A:
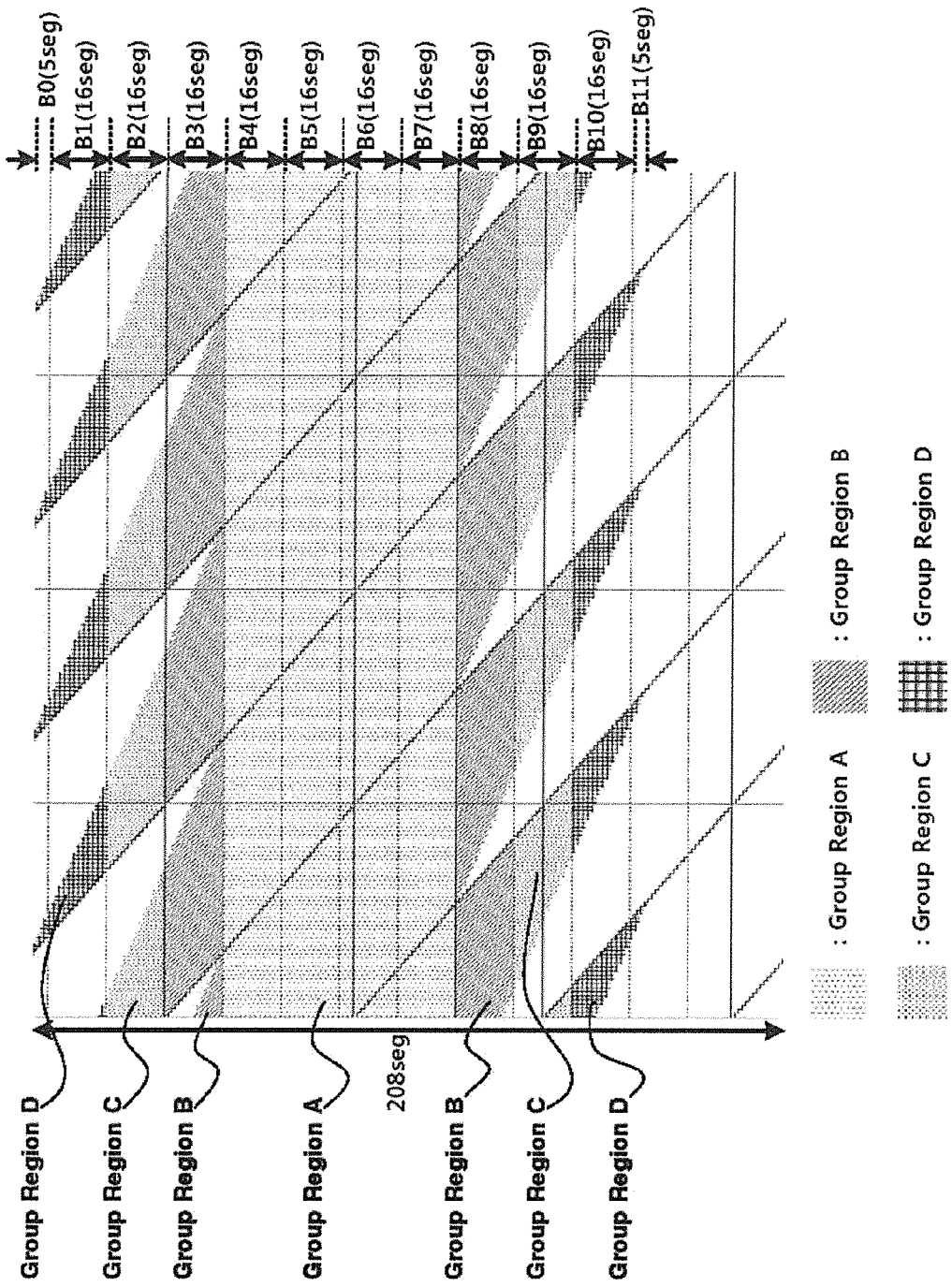
FIG. 5a-5c illustrates a structure of a data group after being processed with interleaving according to the embodiment of the present invention, wherein the data group includes (118+M) number of mobile service data packets.
Figure 5B:
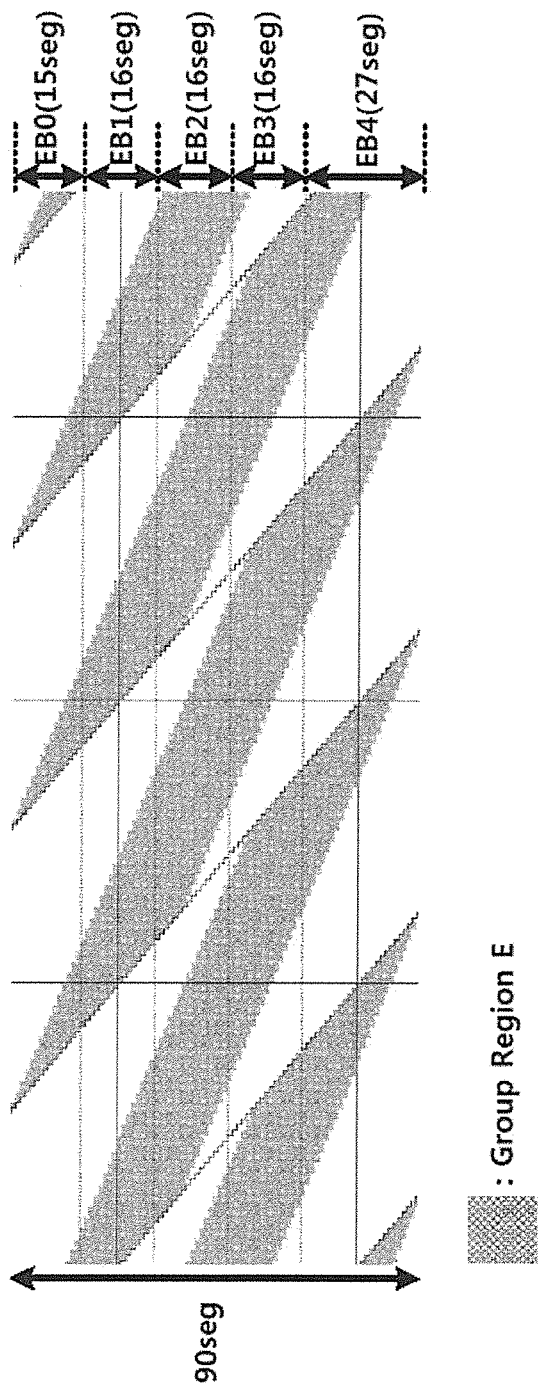
Figure 5C:
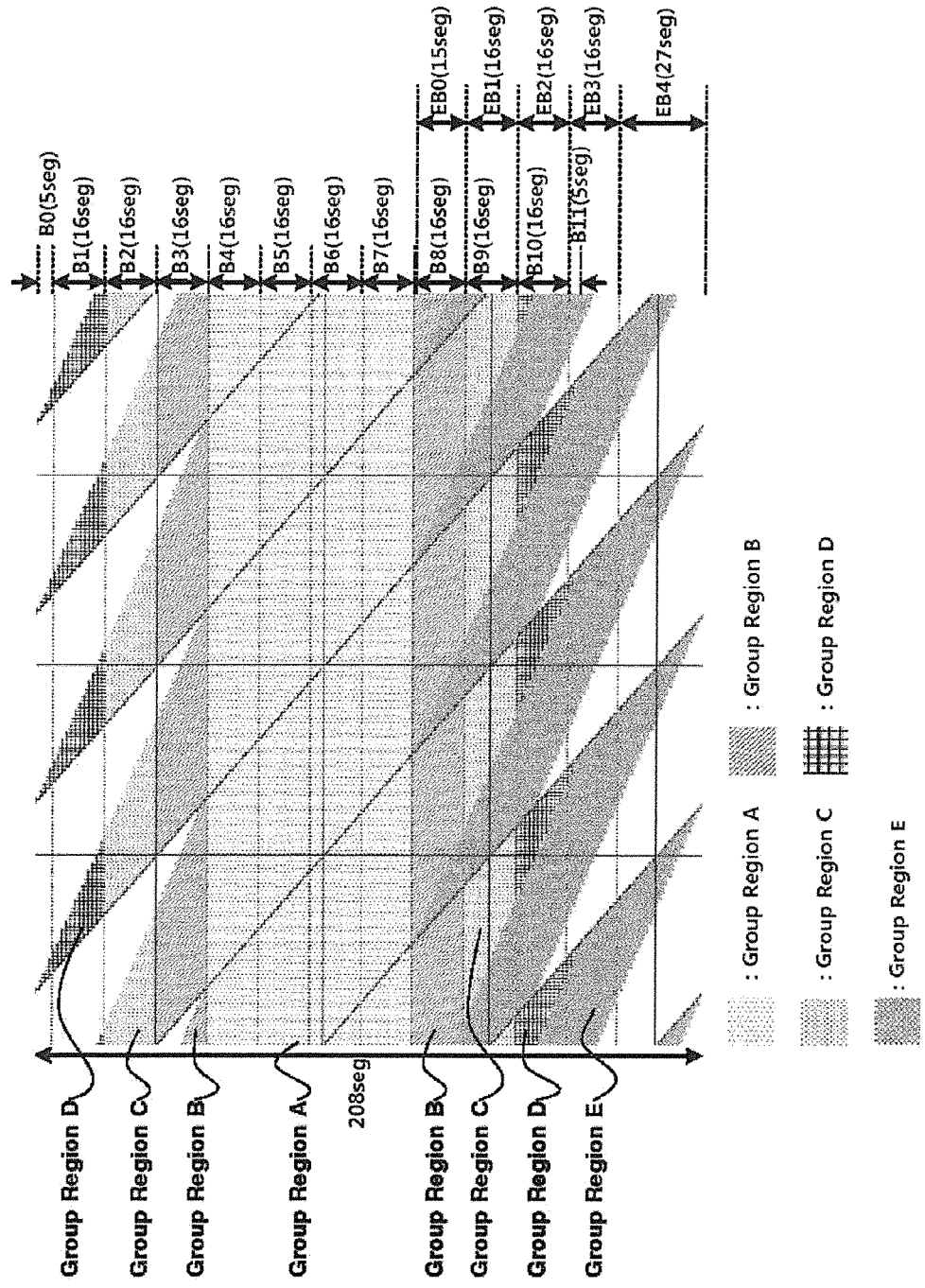

FIG. 5a-5c illustrate a structure of a data group after being processed with interleaving according to the embodiment of the present invention, wherein the data group includes (118+M) number of mobile service data packets.

A data group structure shown in FIG. 5 is transmitted to the receiving system. More specifically, one data packet is data-interleaved and dispersed (or distributed) to a plurality of segments, thereby being transmitted to the receiving system. FIG. 5 shows an example of a single group distributed to 208 data segments. At this point, since one data packet of 207 bytes has the same data size of one data segment, a packet prior to being data-interleaved may be used as the concept of a packet.

FIGS. 5a to 5c broadly illustrate the structure of a group in a segment domain according to an embodiment of the present invention. More specifically, FIG. 5 illustrates the structure of a group after being processed with data interleaving. In other words, one data packet is data interleaved, and the data-interleaved packet is distributed to a plurality of data segments, thereby being transmitted to the receiving system. FIG. 5a shows an example of regions A, B, C, and D being distributed to 170 data segments after being processed with data interleaving. FIG. 5b shows an example of region E being distributed to 90 data segments, when a region E exists within the group, after being processed with data interleaving. And, FIG. 5c shows an example of one group including regions A, B, C, D, and E being distributed to 208 data segments after being processed with data interleaving. At this point, since a data packet of 207 bytes has the same data size as one data segment, a packet prior to being data-interleaved may be used as the concept of a packet.

FIG. 5a illustrates an example of dividing a region corresponding to the first 118 data packets among a total of 156 data packets within a data group after being processed with data-interleaving into 12 DATA blocks (MH blocks B0 to B11). Also, according to the embodiment of the present invention, each of the DATA blocks B1 to B10 has the length of 16 segments, and DATA block B0 and DATA block B11 each has the length of 5 segments.

Herein, when it is assumed that one group includes at least regions A, B, C, and D, depending upon the characteristics of each DATA block within the group, each DATA block may be included in any one of region A to region D. At this point, according to the embodiment of the present invention, and depending upon the level (or degree) of interference of the main service data, each DATA block is included in any one region among region A to region D.

Herein, the group is divided into multiple regions so that each region can be used for a different purpose. More specifically, this is because a region having no interference from the main service data may yield a more robust data receiving performance (or capability) that a region having interference from the main service data. Also, when a system transmitting data by inserting known data, which are pre-known in accordance with an agreement between the receiving system and the transmitting system, in a group is applied, known data having a predetermined length may be periodically inserted in a region where there is no interference from the main service data (i.e., in a region that is not mixed with the main service data). However, in a region having interference from the main service data, due to the interference of the main service data, it is difficult to periodically insert known data, and it is also difficult to insert consecutively long known data.

DATA block B4 to DATA block B7 within the group shown in FIG. 5a collectively correspond to a region having no interference from the main service data. According to the embodiment of the present invention, the region including DATA block B4 to DATA block B7 will be referred to as region A (=B4+B5+B6+B7).

DATA block B3 and DATA block B8 within the group shown in FIG. 5a collectively correspond to a region having little interference from the main service data. According to the embodiment of the present invention, the region including DATA block B3 and DATA block B8 will be referred to as region B (=B3+B8).

DATA block B2 and DATA block B9 within the group shown in FIG. 5a collectively correspond to a region having a level of interference from the main service data greater than that of region B. According to the embodiment of the present invention, the region including DATA block B2 and DATA block B9 will be referred to as region C (=B2+B9).

DATA block B0 to DATA block B1 and DATA block B10 to DATA block B11 within the group shown in FIG. 5a collectively correspond to a region having a level of interference from the main service data greater than that of region C. According to the embodiment of the present invention, the region including DATA block B0 to DATA block B1 and DATA block B10 to DATA block B11 will be referred to as region D (=B0+B1+B10+B11).

FIG. 5b shows an example of dividing a region, which corresponds to the last 38 data packets among the total of 156 data packets within a group of a data structure after being processed with data interleaving, into 5 extended DATA blocks (extended MH blocks EB0 to EB4). Also, according to the embodiment of the present invention, each of the extended DATA blocks EB1 to EB3 has the length of 16 segments. Additionally, according to the embodiment of the present invention, the extended DATA block EB0 has the length of 15 segments, and the extended DATA block EB4 has the length of 27 segments.

Furthermore, according to the embodiment of the present invention, the region including all of the extended DATA blocks EB0 to EB4 shown in FIG. 5b will be referred to as region E (=EB0+EB1+EB2+EB3+EB4).

FIG. 5c is identical to an example of overlapping FIG. 5a and FIG. 5b. Herein, the position of the first segment of the extended DATA block EB0 corresponds to the same segment as the second segment of DATA block B8. And, with the exception for the first segment of DATA block B8, all of the remaining segments respectively overlap with all of the segments of the extended DATA block EB0. Also, all segments of DATA block B9 respectively overlap with all segments of the extended DATA block EB1, and all segments of DATA block B10 respectively overlap with all segments of the extended DATA block EB2. Finally, all segments of DATA block B11 overlap with the first 5 segments of the extended DATA block EB3.

In the above-described example, even if the positions overlap in the same segment, all DATA blocks include only the data corresponding to the first 118 data packets of the data group prior to being processed with data-interleaving, and all extended DATA blocks include only the data corresponding to the last 38 data packets of the data group prior to being processed with data-interleaving.

The mobile service data being allocated to one data group include mobile service data of both the first mobile mode and the second mobile mode.

The above-described alignment and positioning of the data blocks and the extended data blocks are merely exemplary. And, accordingly, the position and number of segments being included in the data blocks and the extended data blocks may vary within a range that does not influence or deviate from the technical aspects and characteristics of the present invention.

Figure 6:
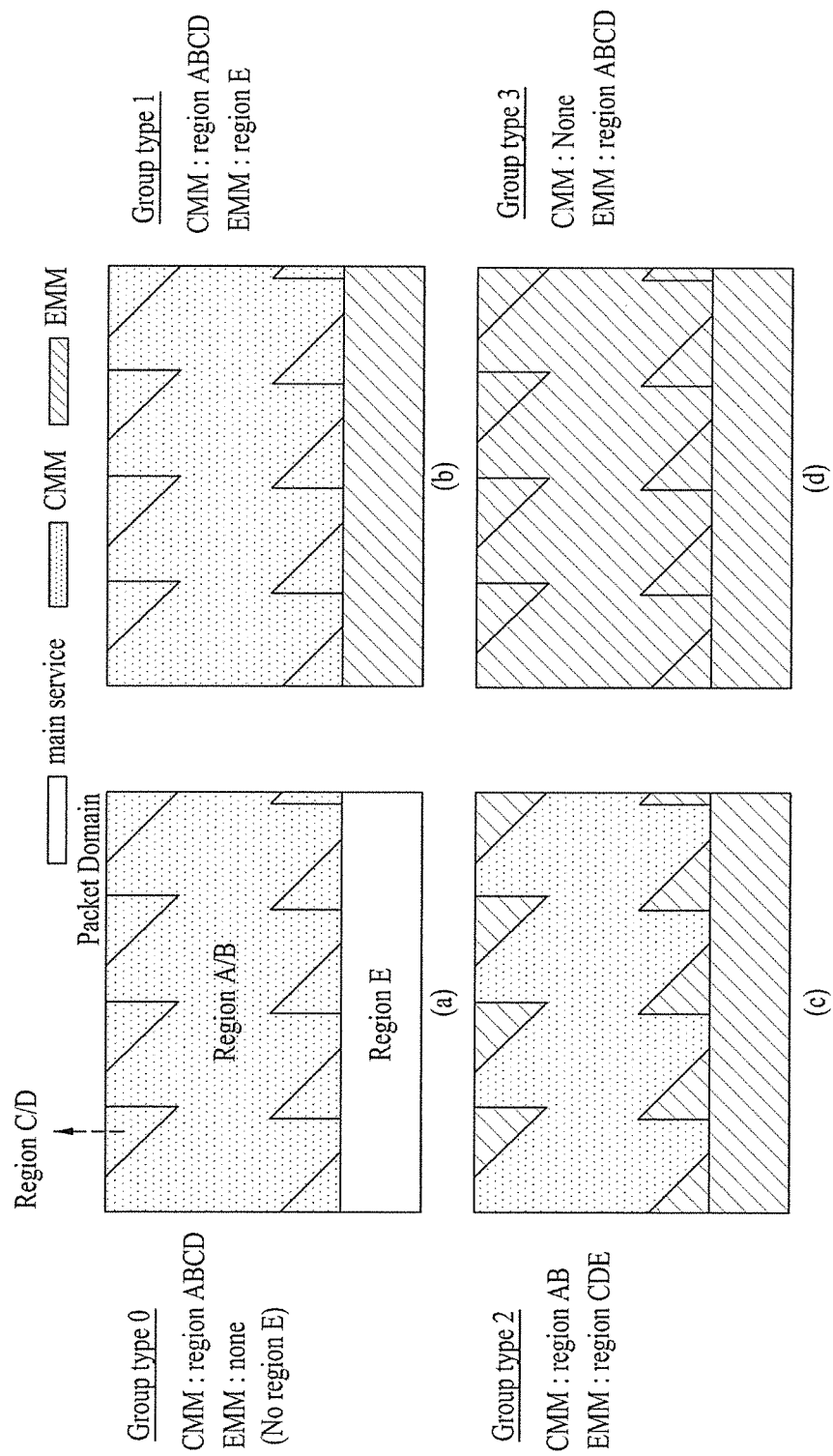
FIG. 6(a)-6(d) illustrate various examples of mobile service data of the first mobile mode and mobile service data of the second mobile mode being allocated to a group.

FIG. 6 illustrates various examples of mobile service data of the first mobile mode and mobile service data of the second mobile mode being allocated to a group.

According to the embodiment of the present invention, as shown in FIG. 6, the mobile service data of the first mobile mode and the mobile service data of the second mobile mode are allocated as shown in (a) to (d) of FIG. 6.

(a) of FIG. 6 shows an example wherein the mobile service data of the first mobile mode are allocated to regions A, B, C, and D within the data group, and wherein the mobile service data of the second mobile mode are not allocated. In this case, region E does not exist in the group, and main service data are allocated (or assigned) to the respective region. According to the embodiment of the present invention, this exemplary case will be referred to as group type 0. More specifically, when it is assumed that the number of mobile service data packets forming one data group corresponds to (118+M), then in case (a) of FIG. 6, the value of M is equal to 0.

(b) of FIG. 6 shows an example wherein the mobile service data of the first mobile mode are allocated (or assigned) to regions A, B, C, and D within the data group, and wherein the mobile service data of the second mobile mode are allocated to region E. According to the embodiment of the present invention, this exemplary case will be referred to as group type 1. More specifically, the mobile service data being transmitted through regions A, B, C, and D within the data group may be validly used in the conventional mobile broadcasting system.

(c) of FIG. 6 shows an example wherein the mobile service data of the first mobile mode are allocated (or assigned) to regions A and B, within the data group, and wherein the mobile service data of the second mobile mode are allocated to regions C, D, and E. According to the embodiment of the present invention, this exemplary case will be referred to as group type 2. More specifically, the mobile service data being transmitted through regions A and B within the data group may be received and validly decoded by the conventional mobile broadcasting system. However, the mobile service data being transmitted through regions C, D, and E within the data group are not processed as valid information by the conventional mobile broadcasting system.

(d) of FIG. 6 shows an example wherein the mobile service data of the second mobile mode are allocated to regions A, B, C, D, and E within the data group, and wherein the mobile service data of the first mobile mode are not allocated. According to the embodiment of the present invention, this exemplary case will be referred to as group type 3. Herein, the mobile service data being transmitted through regions A, B, C, D, and E within the data group are not processed as valid information by the conventional mobile broadcasting system.

As described above, the group type is decided depending upon how the 156 data packets being included in one data group are used. In other words, the group type is decided depending upon which one of regions A, B, C, and D will be used for the mobile service data of the second mobile mode.

Meanwhile, one data group may include a maximum of 156 data packets. Herein, among the 156 data packets, 118 data packets are assigned to regions A, B, C, and D, and a portion of the remaining 38 data packets or all of the remaining 38 data packets are assigned to region E. At this point, none of the data packets may be assigned to region E. In this case, as shown in (a) of FIG. 6, region E does not exist in the corresponding data group. In the data group that does not include a region E, mobile service data of the first mobile mode are assigned (or allocated) to the 118 data packets included in region A, B, C, and D, and main service data are assigned to the remaining 38 data packets. More specifically, in the data group that does not include region E, mobile service data of the second mobile mode are not assigned.

This indicates that only the mobile service data of the second mobile mode are assigned to region E within the data group, as shown in (b) to (d) of FIG. 6. More specifically, the mobile service data of the first mobile mode Furthermore, in a data group including region E, the mobile service data of the second mobile mode may be further assigned to at least one of regions A, B, C, and D.

If the mobile service data of the second mobile mode are assigned to all of the regions A, B, C, D, and E, as shown in (d) of FIG. 6, mobile service data of the first mobile mode cannot be assigned to the corresponding data group. With the exception for the case wherein the mobile service data of the second mobile mode are assigned to all of the regions A, B, C, D, and E, as shown in (d) of FIG. 6, the mobile service data of the first mobile mode are assigned to at least one of regions A, B, C, and D.

Also, even when region E does not exist is a specific data group, the number of data packets included in region E may vary. More specifically, region E may include a number of data packets ranging from a minimum of 0 data packet to a maximum of 38 data packets.

Figure 7:
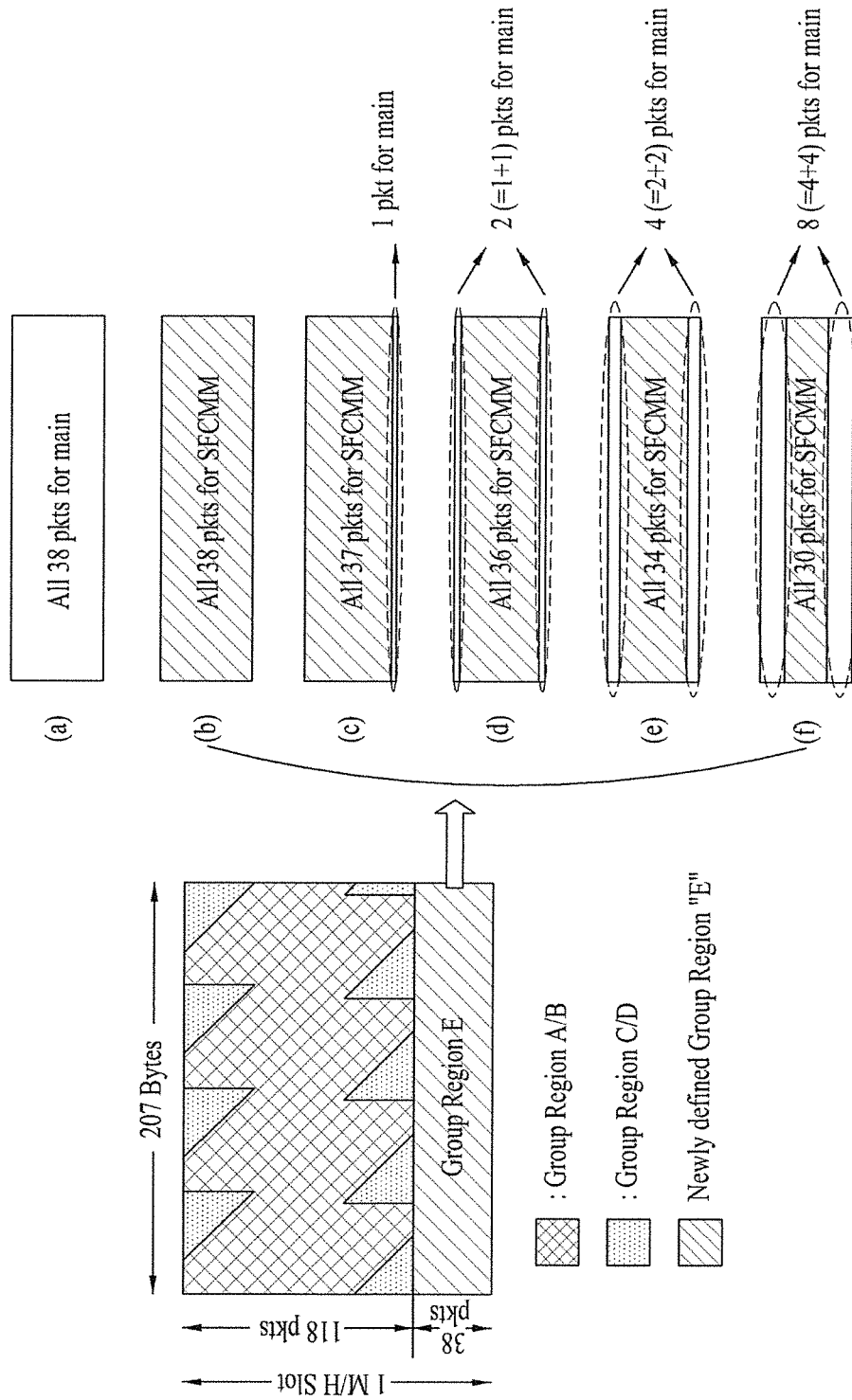
FIG. 7(a)-7(f) illustrate an example of a mobile service data packet being allocated to region E within the data group according to an embodiment to the present invention.

FIG. 7 illustrates an example of a mobile service data packet being allocated to region E within the data group according to an embodiment to the present invention.

(a) of FIG. 7 shows an example of region E not being assigned (or allocated). Herein, main service data are assigned to the 38 data packets within the corresponding data group. More specifically, data packets that are used for mobile services of the second mobile mode do not exist. In this case, according to the embodiment of the present invention, regions, A, B, C, and D of the corresponding group are also not used for the mobile services of the second mobile mode.

(b) of FIG. 7 shows an example of 38 data packets being assigned to region E. In this case, main service data are not assigned to the corresponding group. More specifically, the 38 data packets that are included in region E may be used for mobile services of the second mobile mode.

(c) of FIG. 7 shows an example of 37 data packets being assigned to region E. In this case, main service data are assigned to one data packet within the corresponding data group. According to the embodiment of the present invention, among the 38 data packets, the slowest data packet (i.e., the data packet chronologically placed in the last position) is excluded from region E, and the one data packet that is excluded from region E is used for the main service. More specifically, the 37 data packets included in region E may be used for the mobile services of the second mobile mode.

(d) of FIG. 7 shows an example of 36 data packets being assigned to region E. In this case, main service data are assigned to two data packets within the corresponding data group. According to the embodiment of the present invention, among the 38 data packets, the fastest data packet (i.e., the data packet chronologically placed in the first position) and the slowest data packet (i.e., the data packet chronologically placed in the last position) are excluded from region E, and the two data packets that are excluded from region E are used for the main services. More specifically, the 36 data packets included in region E may be used for the mobile services of the second mobile mode.

(e) of FIG. 7 shows an example of 34 data packets being assigned to region E. In this case, main service data are assigned to four (4) data packets within the corresponding data group. According to the embodiment of the present invention, among the 38 data packets, the two fastest data packets (i.e., the two data packets chronologically placed in the first two positions) and the two slowest data packets (i.e., the two data packets chronologically placed in the last two positions) are excluded from region E, and the four data packets that are excluded from region E are used for the main services. More specifically, the 34 data packets included in region E may be used for the mobile services of the second mobile mode.

(f) of FIG. 7 shows an example of 30 data packets being assigned to region E. In this case, main service data are assigned to eight (8) data packets within the corresponding data group. According to the embodiment of the present invention, among the 38 data packets, the four fastest data packets (i.e., the four data packets chronologically placed in the first four positions) and the four slowest data packets (i.e., the four data packets chronologically placed in the last four positions) are excluded from region E, and the eight data packets that are excluded from region E are used for the main services. More specifically, the 30 data packets included in region E may be used for the mobile services of the second mobile mode.

More specifically, among the remaining 38 data packets excluding the 118 data packets within the data group, region E includes the data packets that are used for the mobile service of the second mobile mode.

According to the embodiment of the present invention, each group type is further segmented based upon the size of region E.

Meanwhile, a variable number (M) of mobile service data packets capable of being contained in the data group are contained in an additional region E. In the case where the data group in one slot is composed of 118 mobile service data packets, the region E can be defined as a specific region acquired when mobile service data packets are added to the region composed of only main service data packets. In other words, the region E may include a scalable number of mobile service data packets in one slot.

The mapping format of the mobile service data packets in the region E may be changed according to the intention of a designer. In other words, according to one embodiment of the present invention, when the number of mobile service data packets is 38 or less (i.e., M<38), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the region E are spaced apart from one another at intervals of a predetermined distance.

FIG. 8 illustrates an example of each group type being segmented based upon the size of region E according to an embodiment of the present invention.

At this point, group type 0 corresponds to when region E does not exist, and, in this case, further segmentation is not performed. In the data group of group type 0, a primary group division includes regions A, B, C, and D or includes regions A and B. Also, either a secondary group division does not exist, or a secondary group division includes regions C and D.

Depending upon the size of region E, group type 1 may be further segmented to 5 group types (i.e., group types 1-0, 1-1, 1-2, 1-4, and 1-8). In the data group of group type 1, a primary group division includes regions A, B, C, and D, and a secondary group division includes region E.

At this point, group type 1-0 (G1-0) corresponds to a group type configured by combining (b) of FIG. 6 and (b) of FIG. 7. Herein, the mobile service data of the second mobile mode are assigned (or allocated) only to region E, and region E includes 38 data packets. Group type 1-1 (G1-1) corresponds to a group type configured by combining (b) of FIG. 6 and (c) of FIG. 7. Herein, the mobile service data of the second mobile mode are assigned (or allocated) only to region E, and region E includes 37 data packets. Group type 1-2 G1-2) corresponds to a group type configured by combining (b) of FIG. 6 and (d) of FIG. 7. Herein, the mobile service data of the second mobile mode are assigned (or allocated) only to region E, and region E includes 36 data packets. Group type 1-4 (G1-4) corresponds to a group type configured by combining (b) of FIG. 6 and (e) of FIG. 7. Herein, the mobile service data of the second mobile mode are assigned (or allocated) only to region E, and region E includes 34 data packets. And, group type 1-8 (G1-8) corresponds to a group type configured by combining (b) of FIG. 6 and (f) of FIG. 7. Herein, the mobile service data of the second mobile mode are assigned (or allocated) only to region E, and region E includes 30 data packets.

Depending upon the size of region E, group type 2 may be further segmented to 5 group types (i.e., group types 2-0, 2-1, 2-2, 2-4, and 2-8). In the data group of group type 2, a primary group division includes regions A and B, and a secondary group division includes regions C, D, and E.

At this point, group type 2-0 (G2-0) corresponds to a group type configured by combining (c) of FIG. 6 and (b) of FIG. 7. Herein, the mobile service data of the second mobile mode are assigned (or allocated) only to regions C, D, and E. Herein, region E includes 38 data packets. Group type 2-1 (G2-1) corresponds to a group type configured by combining (c) of FIG. 6 and (c) of FIG. 7. Herein, the mobile service data of the second mobile mode are assigned (or allocated) only to regions C, D, and E. Herein, region E includes 37 data packets. Group type 2-2 (G2-2) corresponds to a group type configured by combining (c) of FIG. 6 and (d) of FIG. 7. Herein, the mobile service data of the second mobile mode are assigned (or allocated) only to regions C, D, and E. Herein, region E includes 36 data packets. Group type 2-4 (G2-4) corresponds to a group type configured by combining (c) of FIG. 6 and (e) of FIG. 7. Herein, the mobile service data of the second mobile mode are assigned (or allocated) only to regions C, D, and E. Herein, region E includes 34 data packets. And, group type 2-8 (G2-8) corresponds to a group type configured by combining (c) of FIG. 6 and (f) of FIG. 7. Herein, the mobile service data of the second mobile mode are assigned (or allocated) only to regions C, D, and E. Herein, region E includes 30 data packets.

Depending upon the size of region E, group type 3 may be further segmented to 5 group types (i.e., group types 3-0, 3-1, 3-2, 3-4, and 3-8). In the data group of group type 3, a primary group division includes regions A, B, C, D, and E, and a secondary group division does not exist.

At this point, group type 3-0 (G3-0) corresponds to a group type configured by combining (d) of FIG. 6 and (b) of FIG. 7. Herein, the mobile service data of the second mobile mode are assigned (or allocated) only to regions A, B, C, D, and E. Herein, region E includes 38 data packets. Group type 3-1 (G3-1) corresponds to a group type configured by combining (d) of FIG. 6 and (c) of FIG. 7. Herein, the mobile service data of the second mobile mode are assigned (or allocated) only to regions A, B, C, D, and E. Herein, region E is configured of 37 data packets. Group type 3-2 (G3-2) corresponds to a group type configured by combining (d) of FIG. 6 and (d) of FIG. 7. Herein, the mobile service data of the second mobile mode are assigned (or allocated) only to regions A, B, C, D, and E. Herein, region E includes 36 data packets. Group type 3-4 (G3-4) corresponds to a group type configured by combining (d) of FIG. 6 and (e) of FIG. 7. Herein, the mobile service data of the second mobile mode are assigned (or allocated) only to regions A, B, C, D, and E. Herein, region E includes 34 data packets. And, group type 3-8 (G3-8) corresponds to a group type configured by combining (d) of FIG. 6 and (f) of FIG. 7. Herein, the mobile service data of the second mobile mode are assigned (or allocated) only to regions A, B, C, D, and E. Herein, region E includes 30 data packets.

More specifically, the group format of group type 2 and the group format group type 3 are identical to one another. In other words, the same group map may be used for group type 2 and group type 3.

In FIG. 8, group type 4 (G3) is not further segmented to a lower-level group type. And, in this case, the 156 data packets are all used for the mobile service data. At this point, mobile service data are also assigned to an MPEG header and RS parity data positions within the 156 data packets.

In other words, in the case where the data group does not include main service data, the RS parity and the MPEG header for backward compatibility need not be used, such that an area reserved for the RS parity and the MPEG header is allocated to an area for mobile service data and forms a block contained in the region E.

At this point, a parade includes group divisions of groups having the same group type. For example, an arbitrary primary parade is configured of primary group divisions of groups corresponding to group type 1-1. In other words, the data of one parade are assigned and transmitted to group divisions of groups having the same group type. For example, the data of an arbitrary primary parade are assigned and transmitted to a primary group division of groups having the same group type.

Meanwhile, the primary parade and the second parade according to the embodiment of the present invention share the same parade identifier and the same Number Of Group (NOG). Herein, the NOG refers to a number of groups within one sub-frame. For example, when the NOG of the primary parade is equal to 4, the NOG of the secondary parade should also be equal to 4. More specifically, the secondary parade always forms a pair with the primary parade and is dependent to the primary parade. Therefore, each of the secondary parades is transmitted through the same slot as that of its paired primary parade.

Conversely, the overlay parade is not paired with the primary parade. More specifically, although the secondary parade and the overlay parade are both transmitted through a secondary group division within a group, the overlay parade is not dependent to the corresponding primary parade. Therefore, each of the primary parade and the overlay parade has a different parade identifier, and the NOG of each of the primary parade and the overlay parade may either be identical to one another or be different from one another. More specifically, the NOG boundary of the primary parade may be different from the NOG boundary of the overlay parade. Nevertheless, the overlay parade includes secondary group divisions of groups having the same group type. In other words, the data of the overlay parade are transmitted through the secondary group divisions of groups having the same group type. Accordingly, in order to have the receiving system receive and process the overlay parade, signaling information of the overlay parade is required. The signaling information may correspond to a number of overlay parades being assigned to one sub-frame, an identifier of each overlay parade, and so on. According to the embodiment of the present invention, the signaling information of the overlay parade is inserted in at least one of a field synchronization region and a signaling information region within a group, so as to be transmitted. The signaling method of the overlay parade will be described in detail later on.

At this point, a method of assigning (or allocating) groups to each slot may be identically applied to all sub-frames within a single M/H frame. Alternatively, the method of assigning (or allocating) groups to each slot may be differently applied for each sub-frame. At this point, when it is assumed that group assignment (or allocation) is identically applied to all sub-frames within the M/H frame, the number of groups being assigned to one M/H frame becomes a multiple of 5.

Also, according to the embodiment of the present invention, a plurality of groups included in one parade is assigned to be spaced apart as far away from one another as possible within the sub-frame. Thus, the data may be able to respond with robustness against burst errors that may occur within a sub-frame.

For example, when it is assumed that 3 groups are assigned (or allocated) to one sub-frame, each group is assigned to a first slot (Slot #0), a fifth slot (Slot #4), and a ninth slot (Slot #8) within the corresponding sub-frame. Accordingly, when it is assumed that 16 groups are assigned to one sub-frame by using the above-described assignment (or allocation) rule, the 16 groups are assigned by the order of Slot #0, Slot #4, Slot #8, Slot #12, Slot #2, Slot #6, Slot #10, Slot #14, Slot #1, Slot #5, Slot #9, Slot #13, Slot #3, Slot #7, Slot #11, and Slot #15.

Equation 1 below shows the above-described rule for assigning a plurality of groups to one sub-frame in the form of a mathematical equation.

$$j = (4i + O) \bmod 16 \quad \text{[Equation 1]}$$

Herein, O=0 if i<4,
O=2 else if i<8,
O=1 else if i<12,
O=3 else.

Also, j indicates the slot number within one sub-frame. Herein, j may have a value ranging from 0 to 15. Furthermore, i represents a group number. Herein, i may have a value also ranging from 0 to 15.

At this point, groups respective to one parade may be assigned to one sub-frame. Alternatively, groups respective to a plurality of parades may also be assigned to one sub-frame. The assignment of groups respective to a plurality of parades is no different from (or identical to) the assignment of group respective to a single parade. More specifically, groups within another parade being assigned to one M/H frame are respectively assigned at a cycle period of 4 slots. At this point, the group of the other parade may be assigned in a type of circular method starting from a slot that is not assigned with a group of a previous parade.

Furthermore, according to the embodiment of the present invention, when a plurality of parades is assigned to one sub-frame, the overlay parade is first assigned.

At this point, the corresponding group may include only primary group divisions, or may include both primary group divisions and secondary group divisions. Also, data of a primary parade may be assigned to the primary group divisions, and data of a secondary parade or an overlay parade may be assigned to the secondary group divisions. More specifically, data of one parade or data of two parades may be assigned to one group.

Figure 9:
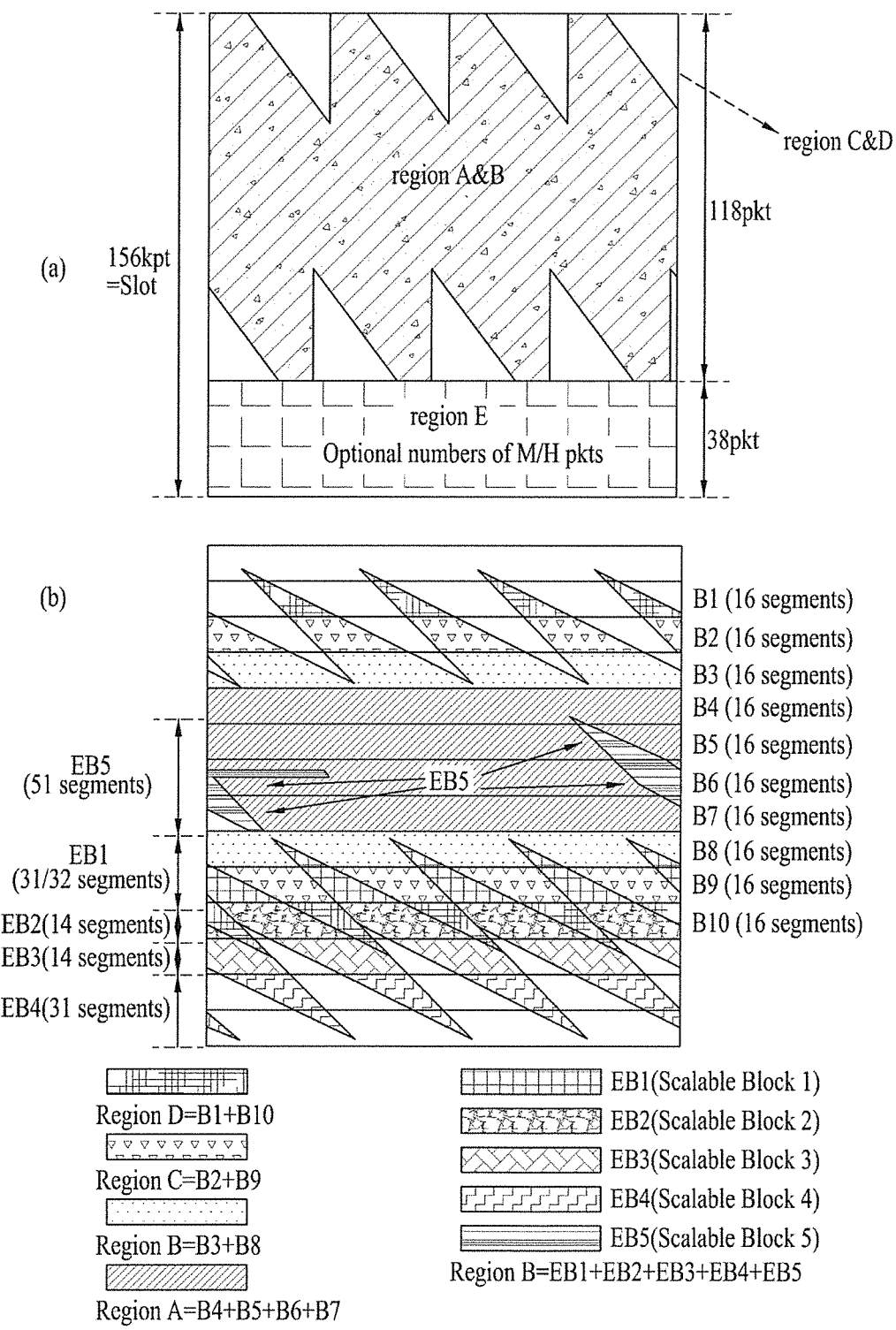
FIG. 9(a)-9(b) illustrates a data group including (118+M) mobile service data packets according to an embodiment of the present invention.

FIG. 9 illustrates a data group including (118+M) mobile service data packets according to an embodiment of the present invention.

Referring to (a) of FIG. 9, the data group includes regions A, B, C, D, and E. The data group is contained in a slot including 156 packets. That is, a predetermined number of packets contained in one slot form the data group, and such packets include mobile service data.

After 118 mobile service data packets fixed in the data group are interleaved, the data group is divided into regions A, B, C, and D as shown in FIG. 4.

Meanwhile, a variable number (M) of mobile service data packets capable of being contained in the data group are contained in an additional region E. In the case where the data group in one slot is composed of 118 mobile service data packets, the region E can be defined as a specific region acquired when mobile service data packets are added to the region composed of only main service data packets. In other words, the region E may include a scalable number of mobile service data packets in one slot.

The mapping format of the mobile service data packets in the region E may be changed according to the intention of a designer. In other words, according to one embodiment of the present invention, when the number of mobile service data packets is 38 or less (i.e., M<38) as shown in (a) of FIG. 9, a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the region E are spaced apart from one another at intervals of a predetermined distance.

(b) of FIG. 9 illustrates a structure acquired after the data group including the region E as shown in (a) of FIG. 9 is interleaved.

As can be seen from FIG. (b) of 11, the data group including 118 mobile service data packets can be divided into four regions A, B, C and D. The region A is located at the center of the data group, and the region B is located at the exterior of the region A using the region A as a reference line. The region C is located at the exterior of the region B on the basis of the regions A and B. The region D is located at the exterior of the region C on the basis of the regions A, B, and C. The data group further includes the region E in which a plurality of blocks includes the scalable number of mobile data packets.

Referring to (b) of FIG. 9, 10 blocks (B1~B10) contained in the data group form regions A, B, C, and D using the same pattern as in the data group shown in FIG. 5. However, the region E including M scalable mobile service data packets is formed as an additional block.

As can be seen from (b) of FIG. 9, the region E belonging to the data group may be contained in a plurality of blocks, and respective blocks may correspond to a scalable number of VSB segments. Mobile service data additionally transmitted through the region E is distributed to 4 or 5 blocks.

Meanwhile, in the case where the data group does not include main service data, the region E includes a block which includes an area of a place-holder that includes not only an RS parity but also an MPEG header for backward compatibility with a conventional digital broadcast system. In other words, in the case where the data group does not include main service data, the RS parity and the MPEG header for backward compatibility need not be used, such that an area reserved for the RS parity and the MPEG header is allocated to an area for mobile service data and forms a block contained in the region E.

Although 5 blocks are contained in the region E as shown in (b) of FIG. 9, the scope or spirit of the present invention is not limited only thereto. That is, the number of segments contained in each block of the region E may be scalable, such that the number of blocks contained in the region E may also be scalable.

In the meantime, according to the present invention, the region E contained in the data group is determined by M scalable mobile service data packets, such that an appropriate number of mobile service data packets can be transmitted according to an amount of mobile service data to be transmitted, resulting in an increased transmission efficiency.

In addition, additional mobile service data packets are transmitted through the region E of the data group, such that the demand of a user who desires to use a high-quality mobile service that requires a large amount of data can be satisfied.

Figure 10:
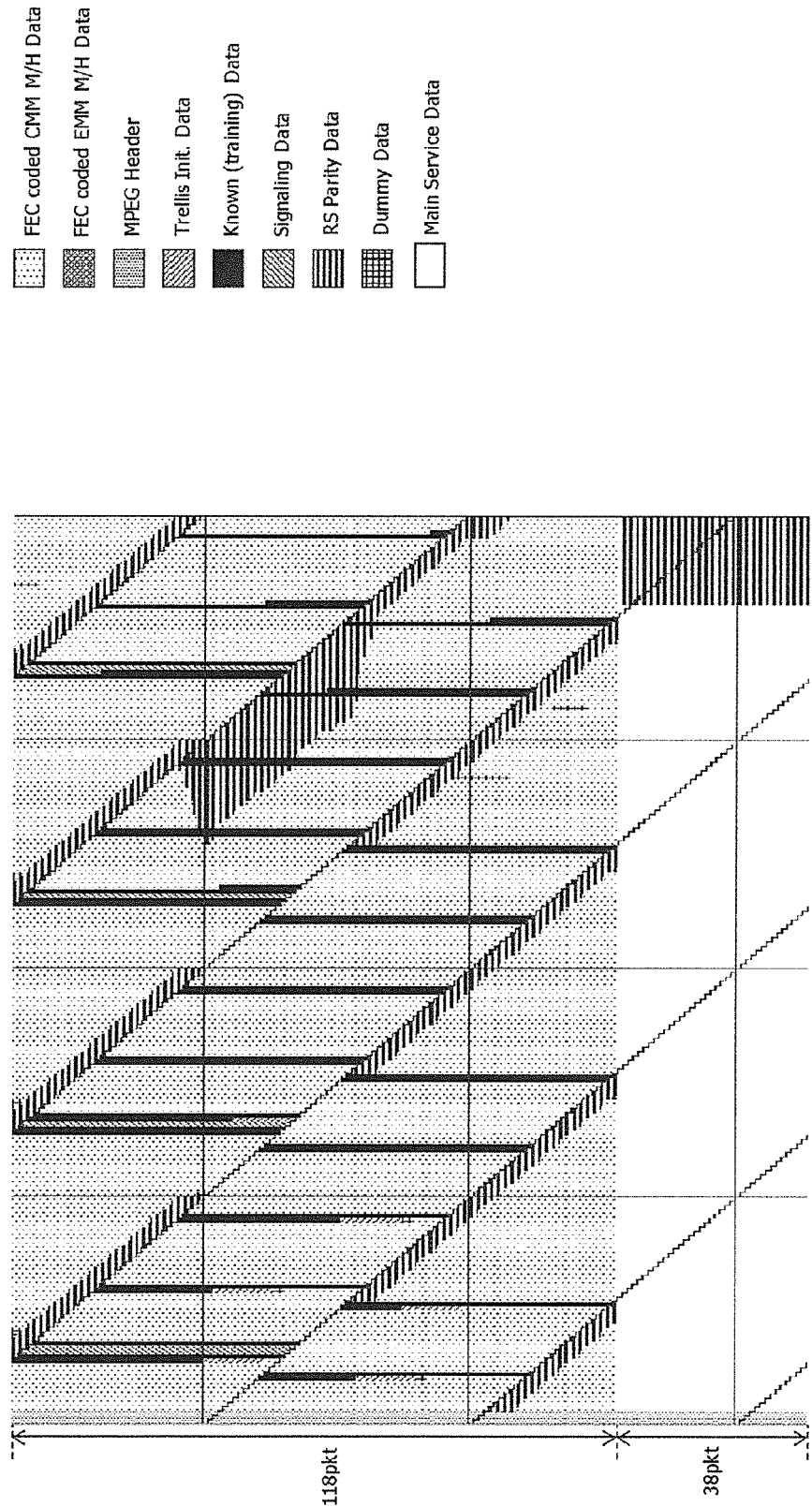
FIG. 10 illustrates group type 0 of data group, according to an embodiment of the present invention.

FIG. 10 illustrates group type 0 of data group, according to an embodiment of the present invention.

According to FIG. 10, a structure acquired before a data group is interleaved, when the data group includes 118 mobile service data packets.

Referring to FIG. 10, the data group includes 118 TS packets that include at least one of FEC-encoded mobile service data, MPEG header, trellis initialization data, known data, signaling data, RS parity data and dummy data. For convenience of description and better understanding of the present invention, a TS packet contained in the data group is defined as a mobile service data packet according to the present invention.

The data group shown in FIG. 10 includes 118 mobile service data packets, such that it can be recognized that the slot via which the above-mentioned data group is transmitted is used for transmitting 38 main service data packets.

Figure 11:
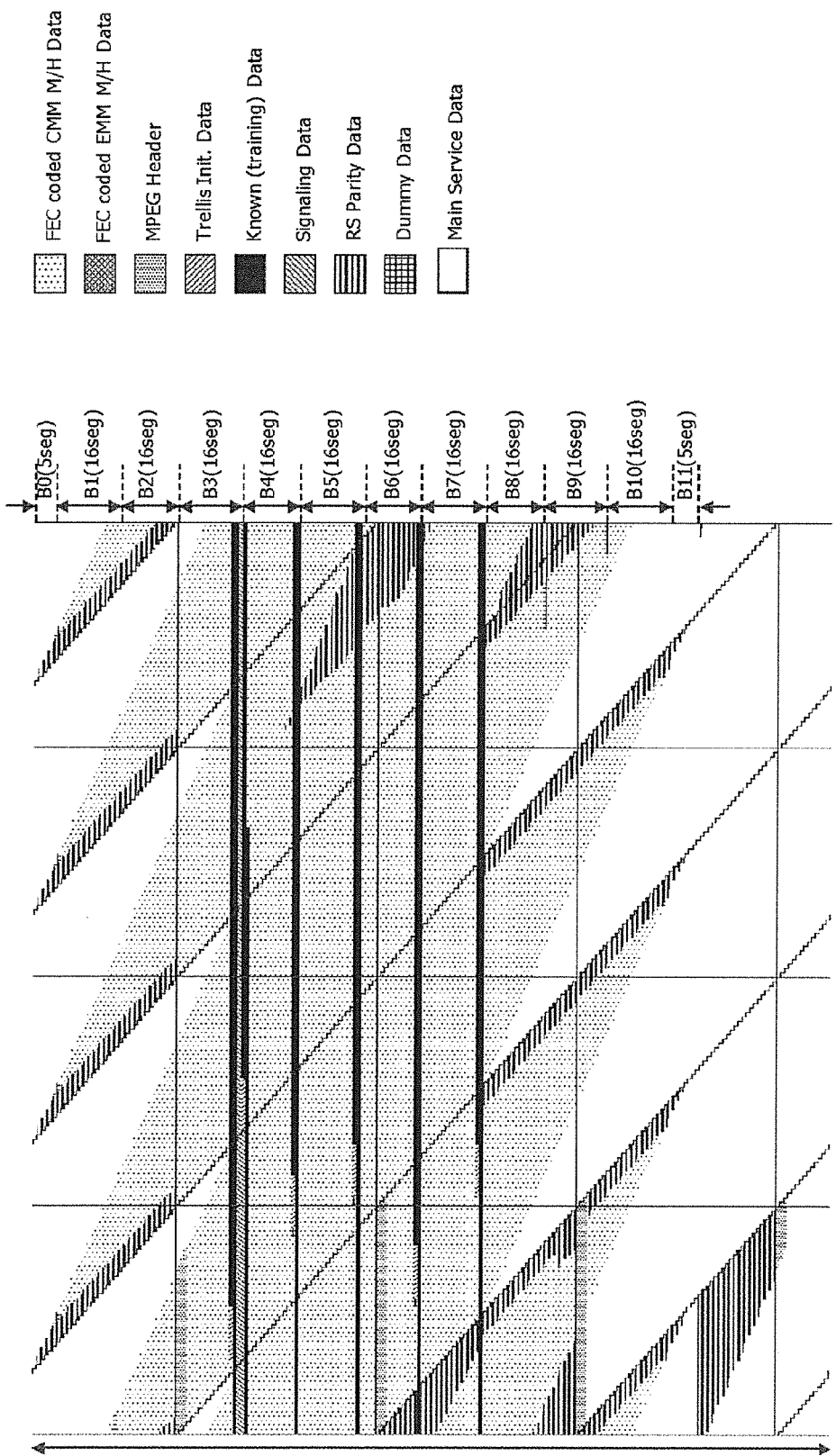
FIG. 11 illustrates a structure acquired after a group type 0 of data group data group is interleaved, when the data group includes 118 mobile service data packets, according to an embodiment of the present invention.

FIG. 11 illustrates a structure acquired after a group type 0 of data group data group is interleaved, when the data group includes 118 mobile service data packets, according to an embodiment of the present invention.

Referring to FIG. 11, the data group including 118 mobile service data packets is interleaved such that a data group including 170 segments is formed.

In this case, the above-mentioned example in which 118 mobile service data packets are distributed to 170 segments has been disclosed only for illustrative purposes and better understanding of the present invention. The number of data segments formed after the data group is interleaved may be changed to another according to the degree of interleaving.

FIG. 11 shows an example of dividing a data group prior to being data-interleaved into 10 data blocks (i.e., data block 1 (B1) to data block 10 (B10)). In other word, data block can be defined as a transmission block containing mobile service data or main and mobile service data in segment level. In this example, each data block has the length of 16 segments. Referring to FIG. 11, only the RS parity data are allocated to a portion of 5 segments before the data block 1 (B1) and 5 segments behind the data block 10 (B10). The RS parity data are excluded in regions A to D of the data group.

More specifically, when it is assumed that one data group is divided into regions A, B, C, and D, each data block may be included in any one of region A to region D depending upon the characteristic of each data block within the data group. At this point, according to an embodiment of the present invention, each DATA block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be inserted in the mobile service data, the known data having a predetermined length may be inserted in the region having no interference from the main service data (i.e., a region wherein the main service data are not mixed). However, due to interference from the main service data, it is difficult to insert known data and also to insert consecutively long known data to a region having interference from the main service data.

As shown in FIG. 11, the data group of group 0 type according to the embodiment of the present invention includes 6 known data sequences. Symbol outputs that are created from the 6 known data sequences may configure a long training sequence.

According to the embodiment of the present invention, a first long training sequence within the data group of group 0 type is positioned in the last two segments of data block B3. A second long training sequence may be positioned in second and third segments of data block B4. And, third to sixth long training sequences may each be positioned in the last two segments of data block B4 to data block B7, respectively.

According to the embodiment of the present invention, among the above-described 6 long training sequences, an interval of 16 segments exists between the first long training sequence and the third long training sequence. Also, an interval of 16 segments may also respectively exist between the third long training sequence and the fourth long training sequence, between the fourth long training sequence and the fifth long training sequence, and between the fifth long training sequence and the sixth long training sequence. Meanwhile, the interval between the first long training sequence and the second long training sequence and the interval between the second long training sequence and the third long training sequence may each be smaller than 16 segments.

Referring to the shortest training sequence, the first long training sequence and the third to sixth long training sequences may each share the same value. Meanwhile, according to the embodiment of the present invention, the value of the first half of the second long training sequence is identical to the value of the second half of the second long training sequence.

The receiver may enhance channel equalization performance by using the above-described long training sequence and may also enhance the performance in demodulation, such as timing recovery or carrier recovery. More specifically, since the long training sequence being transmitted from the transmitter has a value that is already known by the receiver, the receiver may determine any distortion, degree of error, and so on, of a long training sequence included in the received signal, so as to set-up a level of compensation respective to such error or distortion, thereby being capable of applying such level of compensation to other data.

In order to transmit a long training sequence having a value agreed upon in advance by the transmitter and the receiver, the pre-decided value of the long training sequence should not be varied during the signal processing procedure performed by the transmitting end. Accordingly, a procedure for preventing such change (or variation) in the value of the long training sequence is performed by the transmitting end. For example, since the trellis encoder of the transmitting end includes a memory within the encoder, data on a signal that was processed prior to processing the long training sequence may be stored in the memory. Therefore, if the corresponding memory is not initialized prior to processing the long training sequence, the data stored in the memory are processed along with the data on the long training sequence, a change may occur in the data of the long training sequence pre-agreed upon with the receiver. In order to prevent such change (or variation) from occurring, initialization bytes for initializing the trellis encoder may be included in the very front portion of each training sequence. According to the embodiment of the present invention, the above-described initialization bytes may have the size of 12 bytes. When a training sequence begins to be inputted to the trellis encoder, the above-described initialization bytes may be inputted to the trellis encoder firsthand, so as to initialize the memory included in the trellis encoder. The initialization value of the memory may, for example, be set to '0' or '1' in accordance to the intentions of the system designer. Thereafter, the memory may be processed with a procedure of adjusting the initialization bytes or a procedure of processing a signal, so that the memory can have the predetermined initialization value.

Referring to FIG. 11, data block 4 (B4) to data block 7 (B7) correspond to regions without interference of the main service data. Data block 4 (B4) to data block 7 (B7) within the data group shown in FIG. 11 correspond to a region where no interference from the main service data occurs. In this example, a long known data sequence is inserted at both the beginning and end of each data block. In the description of the present invention, the region including data block 4 (B4) to data block 7 (B7) will be referred to as "region A (=B4+B5+ B6+B7)". As described above, when the data group includes region A having a long known data sequence inserted at both the beginning and end of each data block, the receiving system is capable of performing equalization by using the channel information that can be obtained from the known data. Therefore, the strongest equalizing performance may be yielded (or obtained) from one of region A to region D.

In the example of the data group shown in FIG. 11, data block 3 (B3) and data block 8 (B8) correspond to a region having little interference from the main service data. Herein, a long known data sequence is inserted in only one side of each data block B3 and B8. More specifically, due to the interference from the main service data, a long known data sequence is inserted at the end of data block 3 (B3), and another long known data sequence is inserted at the beginning of data block 8 (B8). In the present invention, the region including data block 3 (B3) and data block 8 (B8) will be referred to as "region B(=B3+B8)". As described above, when the data group includes region B having a long known data sequence inserted at only one side (beginning or end) of each data block, the receiving system is capable of performing equalization by using the channel information that can be obtained from the known data. Therefore, a stronger equalizing performance as compared to region C/D may be yielded (or obtained).

Referring to FIG. 11, data block 2 (B2) and data block 9 (B9) correspond to a region having more interference from the main service data as compared to region B. A long known data sequence cannot be inserted in any side of data block 2 (B2) and data block 9 (B9). Herein, the region including data block 2 (B2) and data block 9 (B9) will be referred to as "region C(=B2+B9)".

Finally, in the example shown in FIG. 11, data block 1 (B1) and data block 10 (B10) correspond to a region having more interference from the main service data as compared to region C. Similarly, a long known data sequence cannot be inserted in any side of data block 1 l(B1) and data block 10 (B10) .

Referring to FIG. 11, it can be readily recognized that the regions A and B of the data group includes signaling data used for signaling at a reception end.

Figure 12:
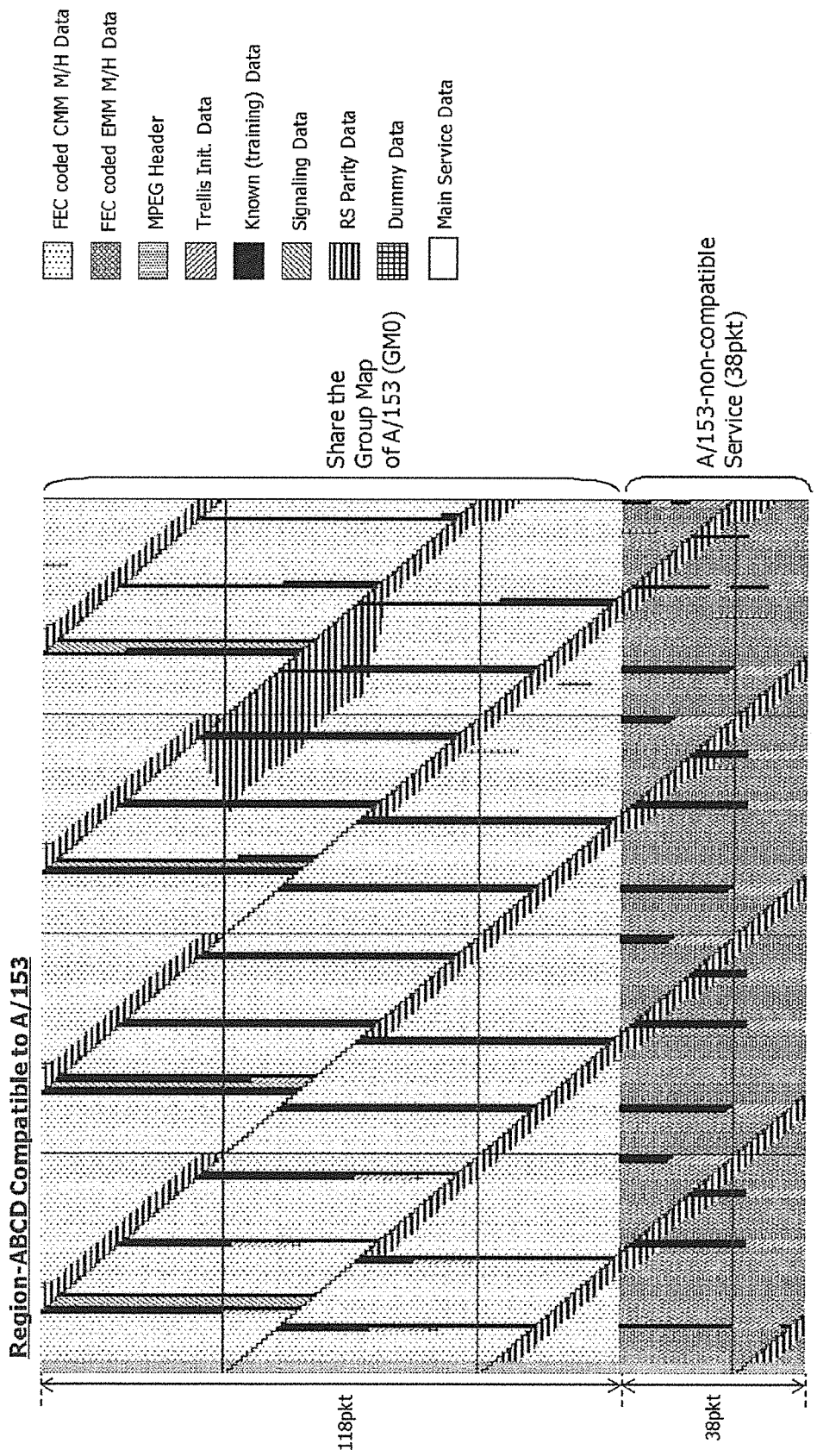
FIG. 12 illustrates group type 1-0 of data group, according to an embodiment of the present invention.

FIG. 12 illustrates group type 1-0 of data group, according to an embodiment of the present invention.

According to FIG. 12, a structure provided before a data group is interleaved, when the data group includes (118+38) mobile service data packets Referring to FIG. 12, the data group includes mobile service data of the regions A and B, mobile service data of the regions C and D, mobile service data of the region E, an MPEG header, trellis initialization data, known data, signaling data, RS parity data, and dummy data.

As shown in FIG. 12, the region E has no main service data packets, such that the region for the RS parity and the MPEG header is not present in the region E. Therefore, the abovementioned regions may be adapted to transmit mobile service data, such that much more mobile service data can be transmitted.

Figure 13:
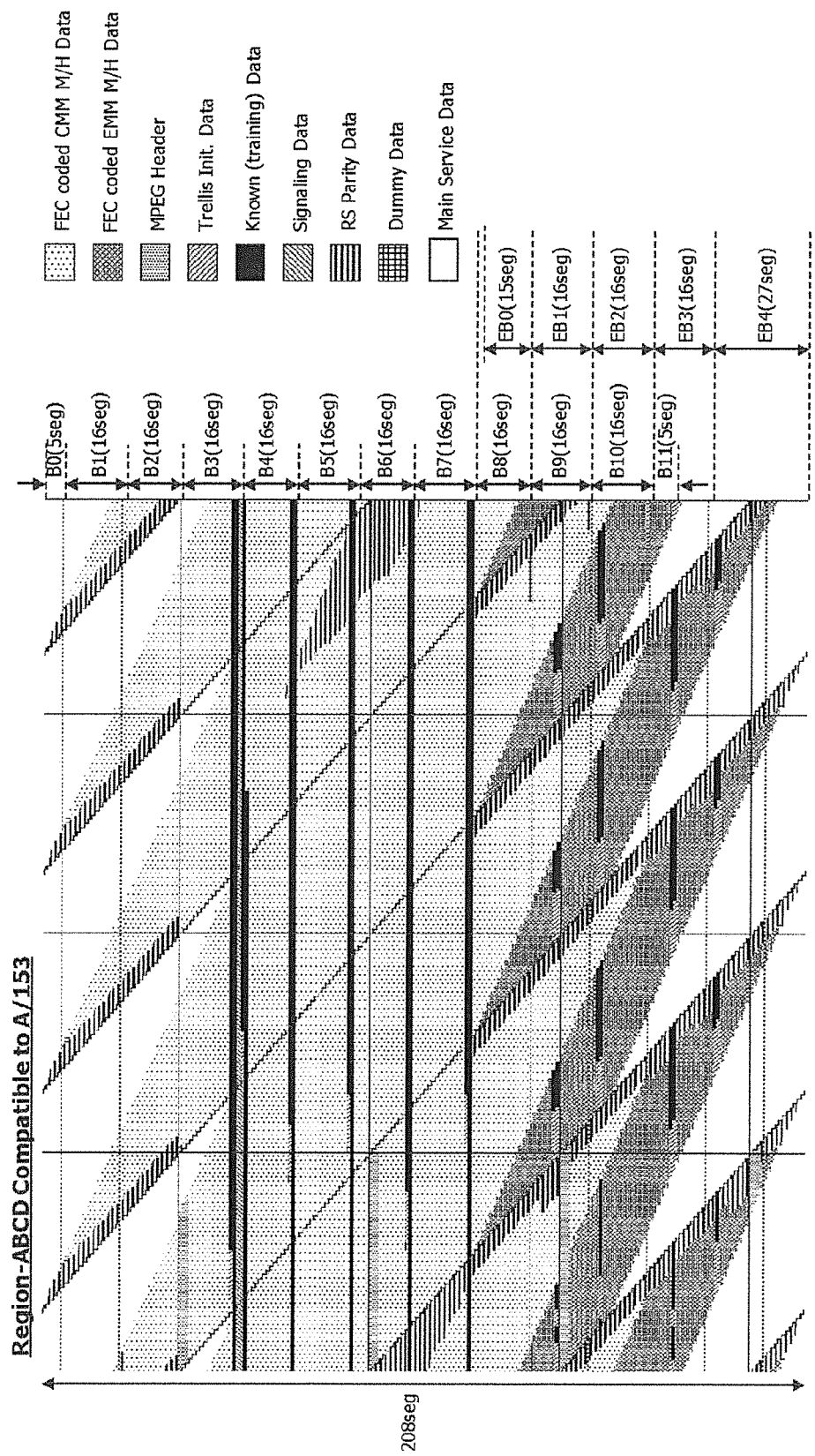
FIG. 13 illustrates a structure provided after a group type 1-0 of data group is interleaved when the data group includes (118+38) mobile service data packets according to an embodiment of the present invention.

FIG. 13 illustrates a structure provided after a group type 1-0 of data group is interleaved when the data group includes (118+38) mobile service data packets according to an embodiment of the present invention.

The structure shown in FIG. 13 is identical to a structure formed after the data group of FIG. 12 is interleaved.

As can be seen from the data group shown in FIG. 13, the primary ensemble is transmitted through the regions A, B, C, and D of the data group, and the secondary ensemble is transmitted through the region E of the data group. Since the regions A, B, C, and D are identical to those of a conventional data group, they can maintain the compatibility with a conventional digital mobile broadcast system. In addition, additional mobile service data can be transmitted through the region E.

Although the data group of FIG. 13 is divided into 10 blocks belonging to the regions A, B, C, and D and five additional blocks belonging to the region E, the number of blocks belonging to the region E is not limited only to '5' and may be changed to another number other than '5' according to the intention of a designer.

Referring to FIG. 13, known data is inserted into the region E. Therefore, the reception performance of the reception end is increased in the region E. As described above, mobile service data is inserted into the reserved area for both the RS parity and the MPEG header present in the region E, such that much more mobile service data can be transmitted.

Figure 14:
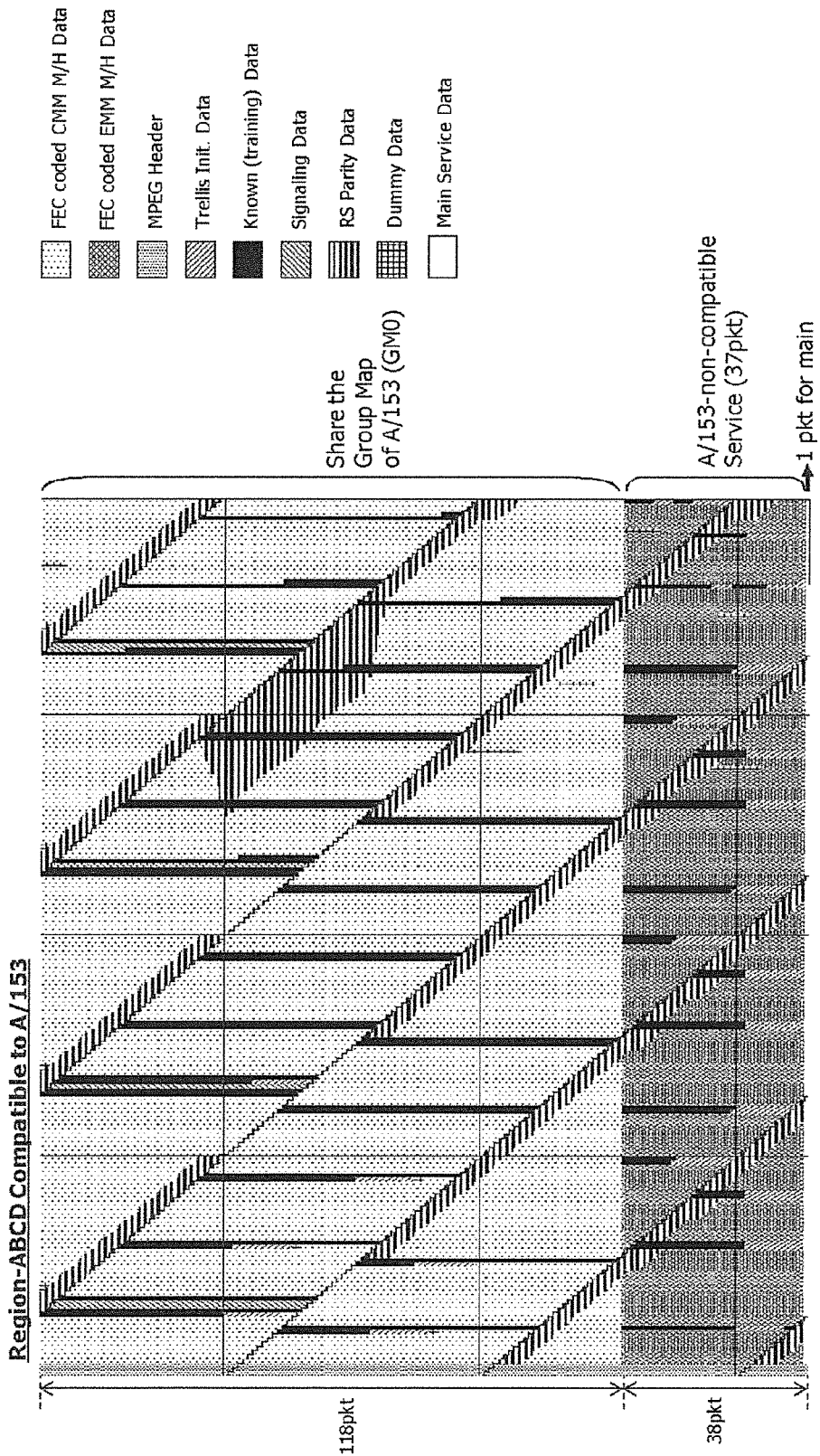
FIG. 14 illustrates group type 1-1 of data group, according to an embodiment of the present invention.

FIG. 14 illustrates group type 1-1 of data group, according to an embodiment of the present invention.

According to FIG. 14, a structure provided before a data group is interleaved, when the data group includes (118+37) mobile service data packets Referring to FIG. 14, the data group includes mobile service data of the regions A and B, mobile service data of the regions C and D, mobile service data of the region E, an MPEG header, trellis initialization data, known data, signaling data, RS parity data, and dummy data.

As shown in FIG. 14, one main service data packet may be inserted in region E. In the conventional broadcasting system, an error may occur when main data are not received for a long period of time. However, by inserting the main service data packet, as described above, such error may be prevented.

Figure 15:
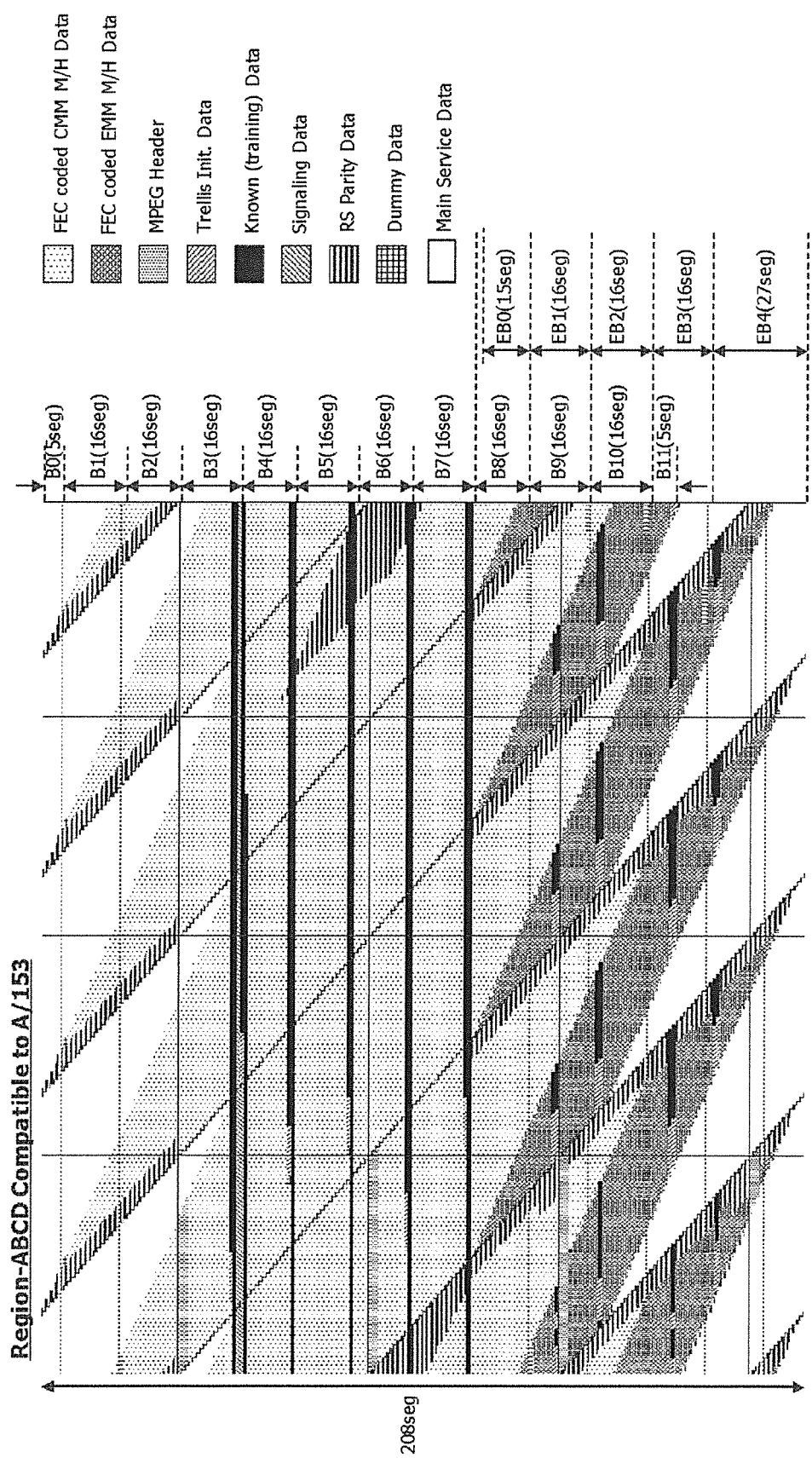
FIG. 15 illustrates a structure provided after a group type 1-1 of data group is interleaved when the data group includes (118+37) mobile service data packets according to an embodiment of the present invention.

FIG. 15 illustrates a structure provided after a group type 1-1 of data group is interleaved when the data group includes (118+37) mobile service data packets according to an embodiment of the present invention.

The structure shown in FIG. 15 is identical to a structure formed after the data group of FIG. 14 is interleaved.

As can be seen from the data group shown in FIG. 15, the primary ensemble is transmitted through the regions A, B, C, and D of the data group, and the secondary ensemble is transmitted through the region E of the data group. Since the regions A, B, C, and D are identical to those of a conventional data group, they can maintain the compatibility with a conventional digital mobile broadcast system. In addition, additional mobile service data can be transmitted through the region E.

Furthermore, the data that are transmitted through regions A, B, C, and D may be validly decoded by the conventional mobile broadcasting system. However, although the data that are transmitted through region E can be received by the conventional mobile broadcasting system, the corresponding data cannot be processed as valid information.

Although the data group of FIG. 15 is divided into 10 blocks belonging to the regions A, B, C and D and five additional blocks belonging to the region E, the number of blocks belonging to the region E is not limited only to '5' and may be changed to another number other than '5' according to the intention of a designer.

Referring to FIG. 15, known data is inserted into the region E. Therefore, the reception performance of the reception end is increased in the region E. As described above, mobile service data is inserted into the reserved area for both the RS parity and the MPEG header present in the region E, such that much more mobile service data can be transmitted.

Figure 16:
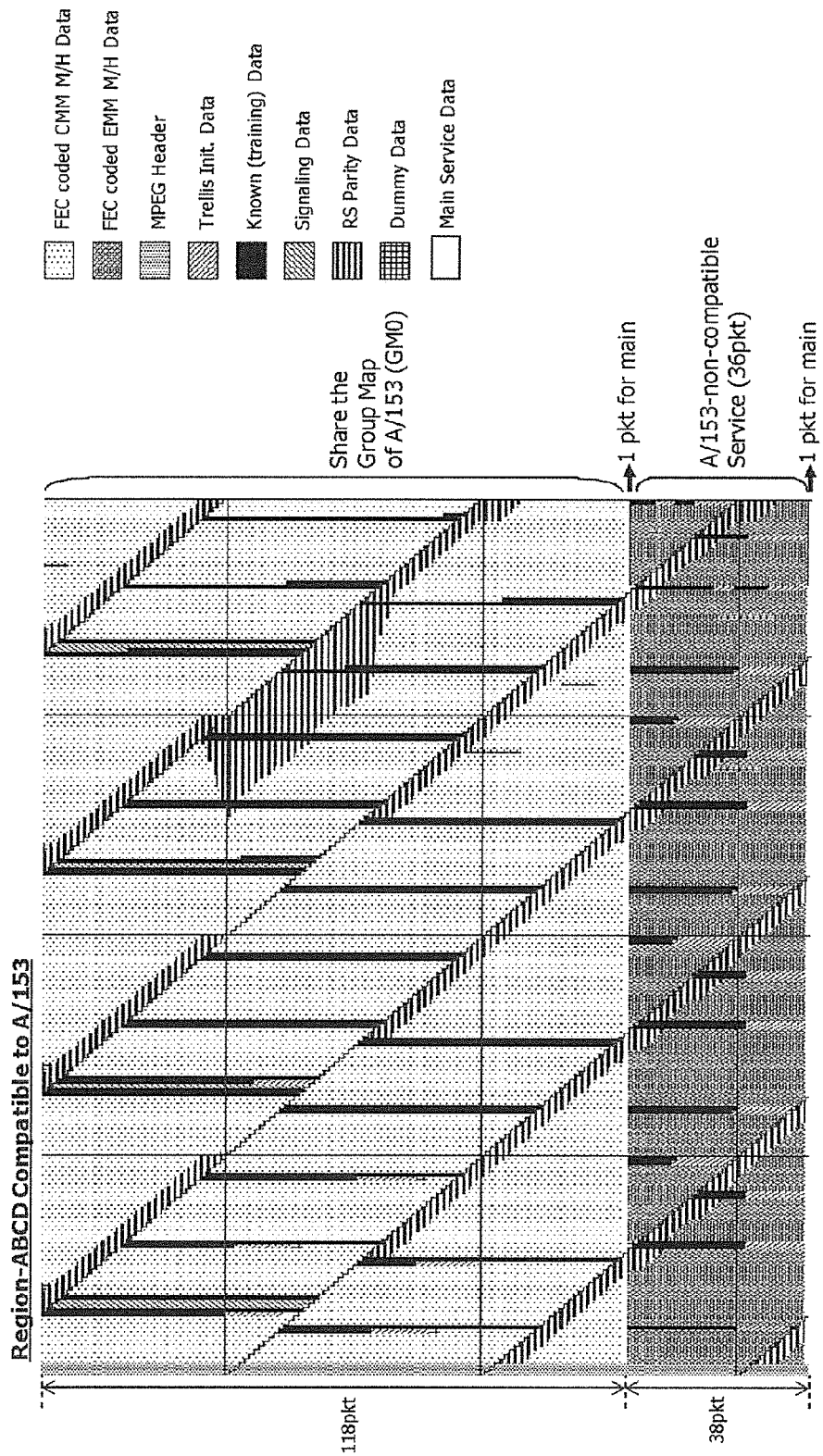
FIG. 16 illustrates group type 1-2 of data group, according to an embodiment of the present invention.

FIG. 16 illustrates group type 1-2 of data group, according to an embodiment of the present invention.

According to FIG. 16, a structure provided before a data group is interleaved, when the data group includes (118+36) mobile service data packets.

Figure 17:
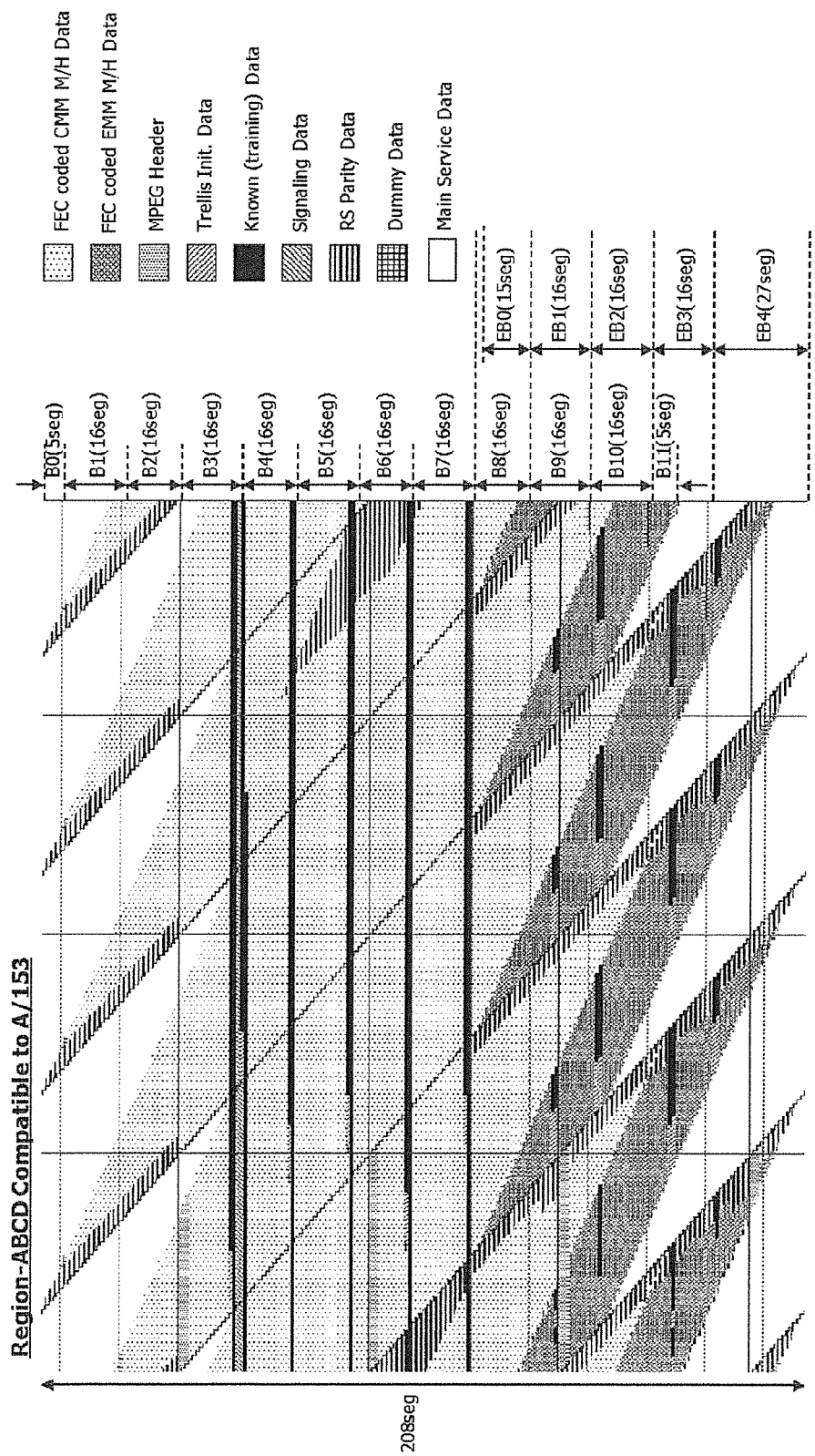
FIG. 17 illustrates a structure provided after a group type 1-2 of data group is interleaved when the data group includes (118+36) mobile service data packets according to an embodiment of the present invention.

FIG. 17 illustrates a structure provided after a group type 1-2 of data group is interleaved when the data group includes (118+36) mobile service data packets according to an embodiment of the present invention.

The structure shown in FIG. 17 is identical to a structure formed after the data group of FIG. 16 is interleaved.

Figure 18:
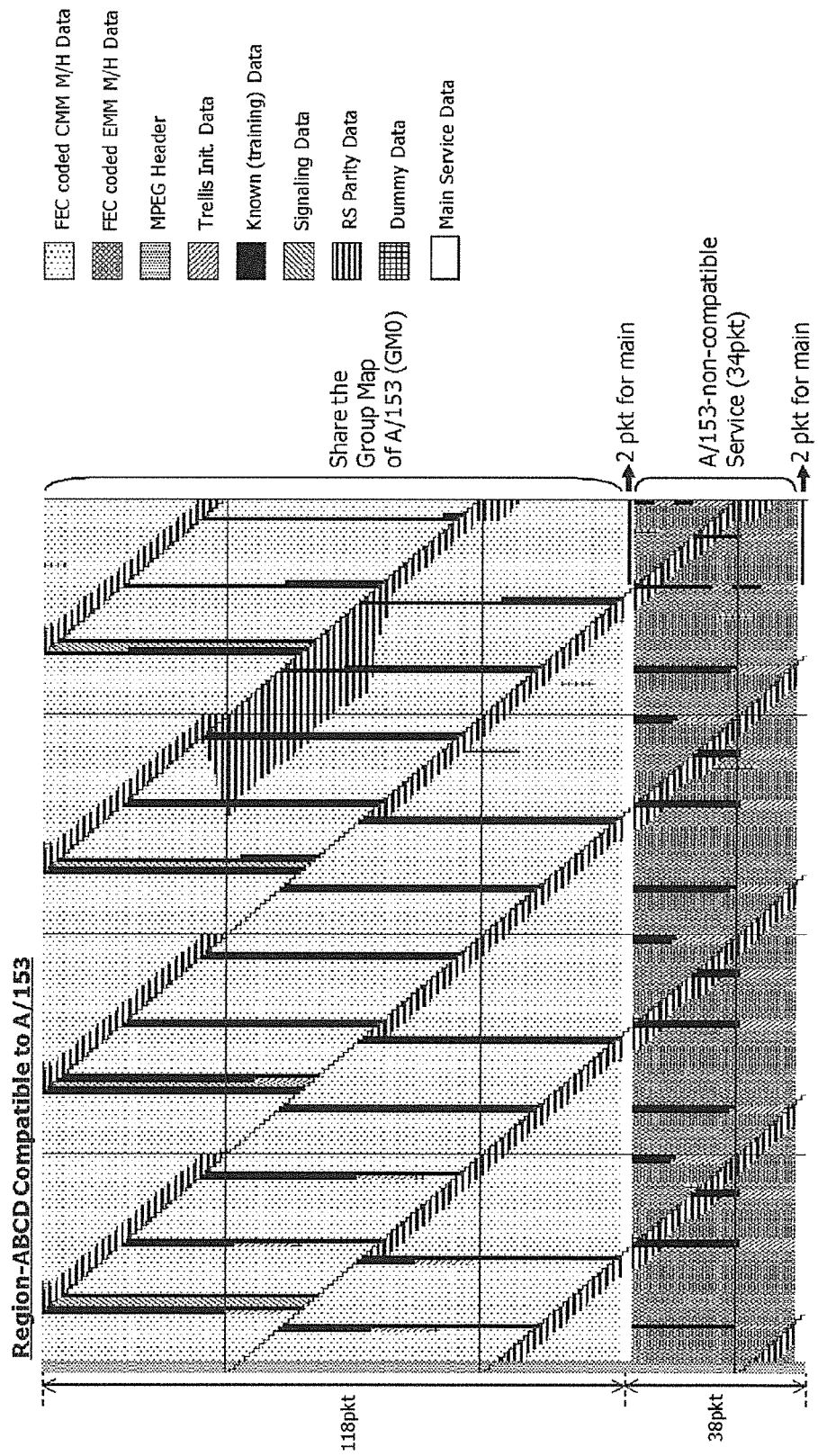
FIG. 18 illustrates group type 1-4 of data group, according to an embodiment of the present invention.

FIG. 18 illustrates group type 1-4 of data group, according to an embodiment of the present invention.

According to FIG. 18, a structure provided before a data group is interleaved, when the data group includes (118+34) mobile service data packets.

Figure 19:
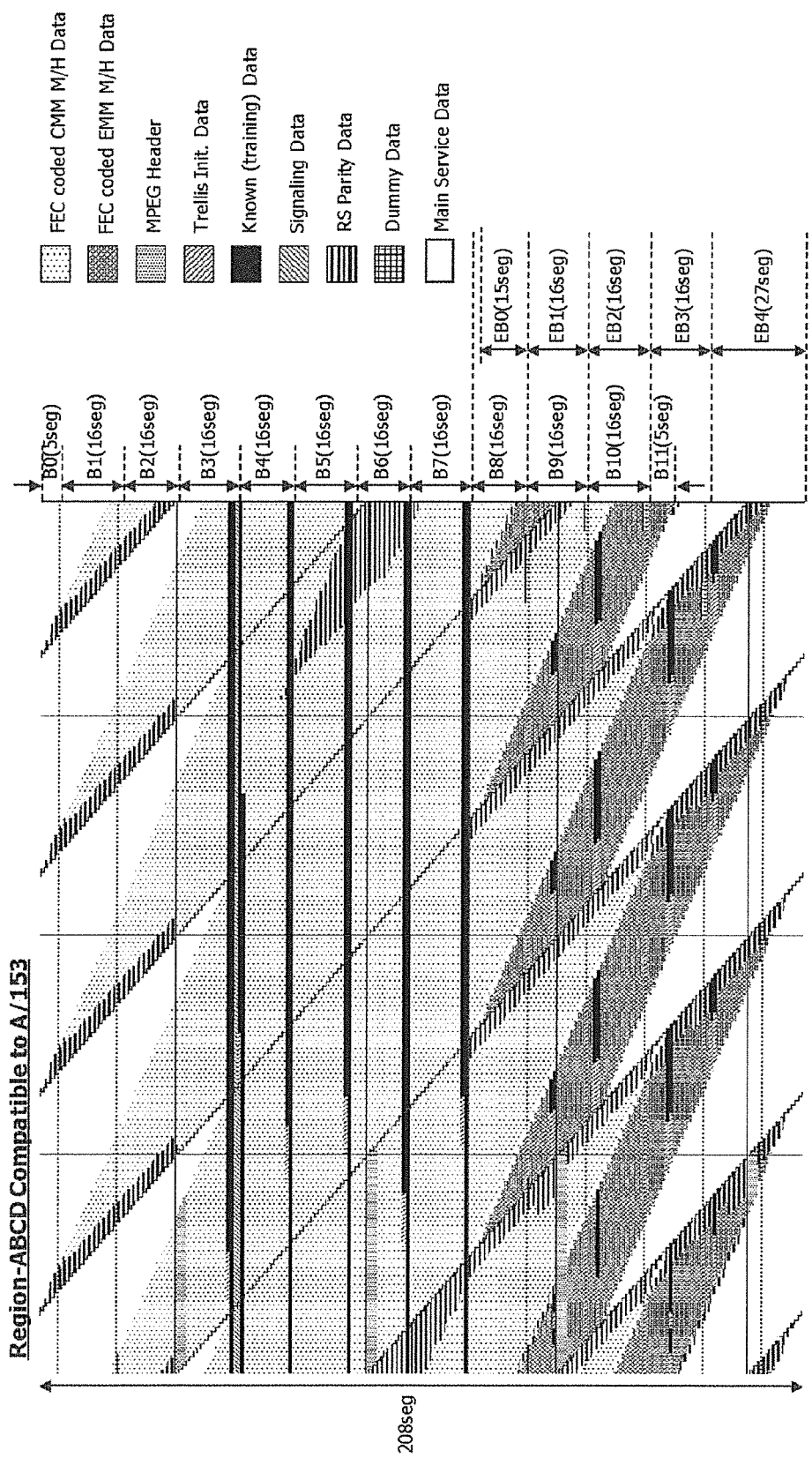
FIG. 19 illustrates a structure provided after a group type 1-4 of data group is interleaved when the data group includes (118+34) mobile service data packets according to an embodiment of the present invention.

FIG. 19 illustrates a structure provided after a group type 1-4 of data group is interleaved when the data group includes (118+34) mobile service data packets according to an embodiment of the present invention.

The structure shown in FIG. 19 is identical to a structure formed after the data group of FIG. 18 is interleaved.

Figure 20:
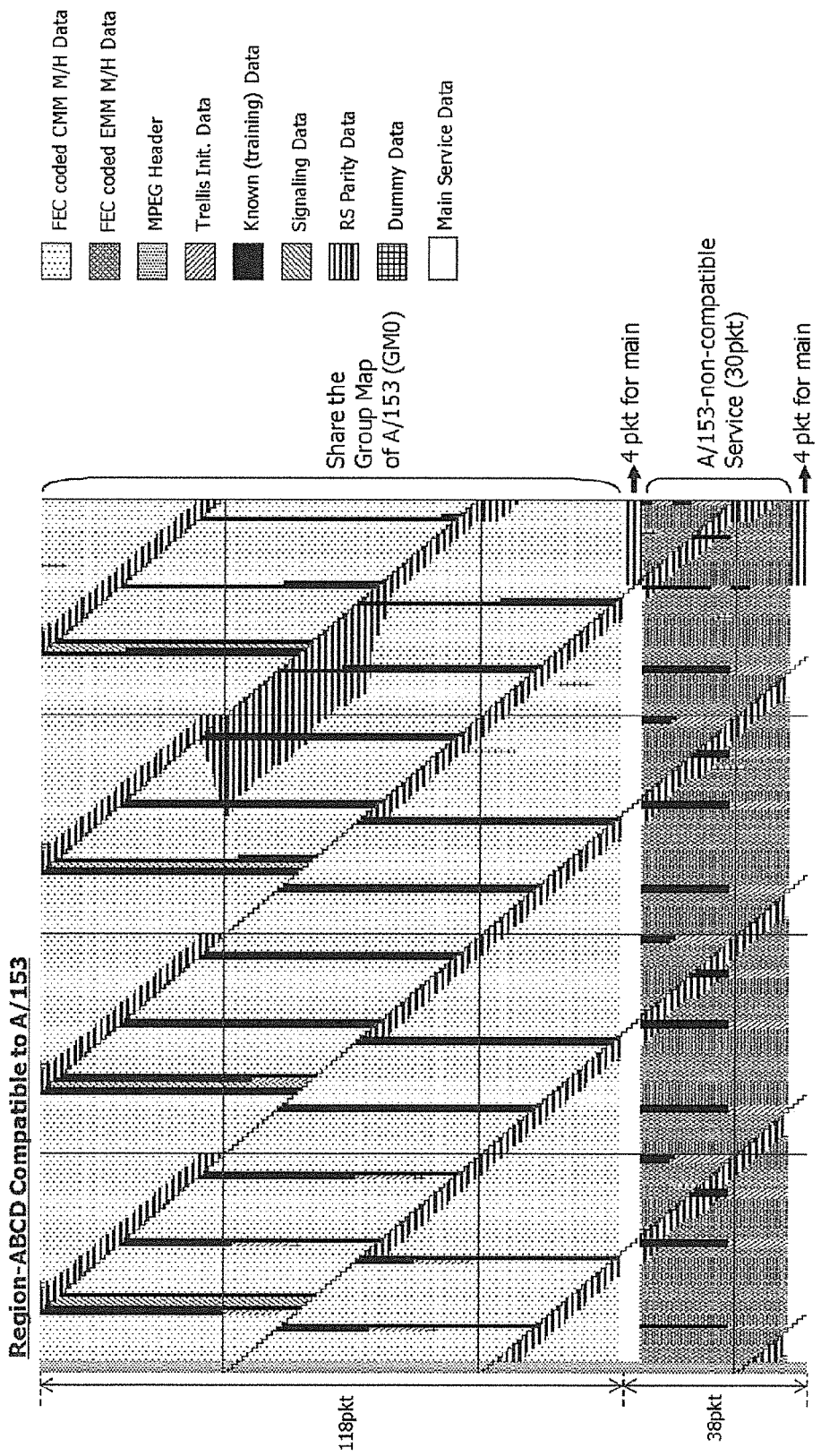
FIG. 20 illustrates group type 1-8 of data group, according to an embodiment of the present invention.

FIG. 20 illustrates group type 1-8 of data group, according to an embodiment of the present invention.

According to FIG. 20, a structure provided before a data group is interleaved, when the data group includes (118+30) mobile service data packets.

Figure 21:
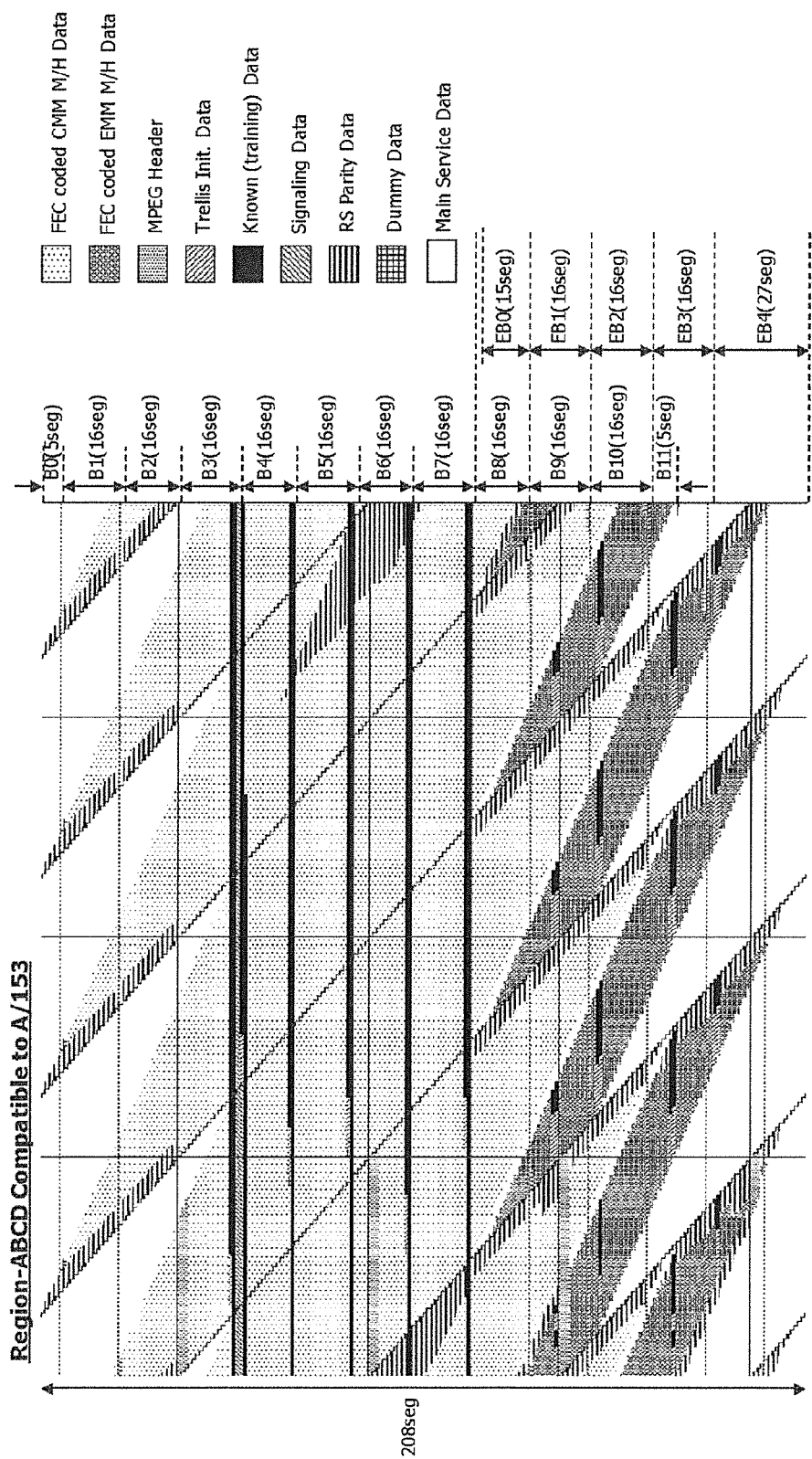
FIG. 21 illustrates a structure provided after a group type 1-8 of data group is interleaved when the data group includes (118+30) mobile service data packets according to an embodiment of the present invention.

FIG. 21 illustrates a structure provided after a group type 1-8 of data group is interleaved when the data group includes (118+30) mobile service data packets according to an embodiment of the present invention.

The structure shown in FIG. 21 is identical to a structure formed after the data group of FIG. 20 is interleaved.

The descriptions of FIG. 14 and FIG. 15 may be similarly applied to the data groups shown in FIG. 16 to FIG. 21.

In the description of FIG. 14 to FIG. 21, although number of main service data packets included in a data group is limited to a specific number, the number is merely exemplary. Therefore, the present invention will not be limited only to the limited number of data packets proposed in the description of the present invention.

The data groups of FIG. 13, FIG. 15, FIG. 17, FIG. 19, and FIG. 21 may include additional training sequences in addition to the 6 long training sequences included in the data group of FIG. 11. The additional training sequences may be inserted in a region allocated (or assigned) for SFCMM within the data group. More specifically, according to the embodiment of the present invention, the additional training sequences are inserted in region E of the data group. Herein, the number of additional training sequences will not be limited to the number of additional training sequences shown in the drawing. Accordingly, the number of additional training sequences may be varied in order to satisfy the requirements respective to the transmission environment (or condition) of the broadcast signals.

In each additional training sequence, short segmented training sequences may appear several times. Referring to the drawing, in case of the first and second additional training sequences, mobile service data being allocated to data group regions C and D and/or main service data being allocated to the respective slot may be transmitted between the segmented training sequences. In case of the third and fourth short training sequences, main service data being allocated to the respective slot may be transmitted between the segmented training sequences, or mobile service data or main service data may be transmitted to a slot immediately next (or subsequent) to the respective slot. Herein, the above-described segmented training sequences may be referred to as symbol sequences.

According to the embodiment of the present invention, the first additional training sequence may be positioned in the $7^{th}$ and $8^{th}$ segments of the extended data block EB1. And, also according to the embodiment of the present invention, the interval between the first additional training sequence and the last long training sequence included in the data group of group type 0 may be equal to 24 segments. Additionally, the second additional training sequence may be positioned in the third and fourth segments of the extended data block EB2, and the interval between the second additional training sequence and the first additional training sequence may be equal to 12 segments. The third short training sequence may be positioned in the $7^{th}$ and $8^{th}$ extended data block EB3, and the interval between the third short training sequence and the second short training sequence may be equal to 20 segments. The fourth short training sequence may be positioned in the third and fourth segments of the extended data block EB4, and the interval between the fourth short training sequence and the third short training sequence may be equal to 12 segments.

Figure 22:
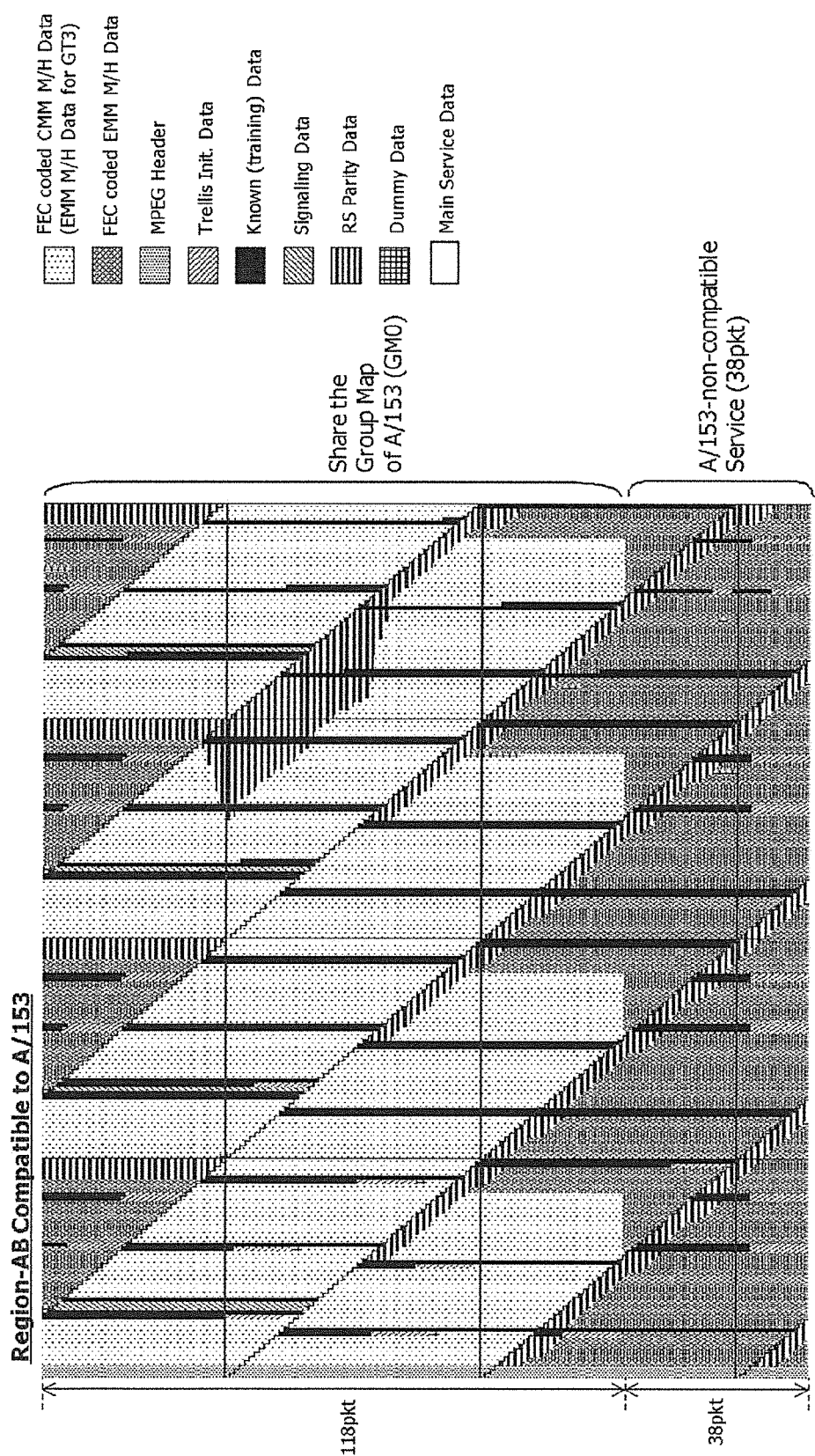
FIG. 22 illustrates group type 2-0 of data group, according to an embodiment of the present invention.

FIG. 22 illustrates group type 2-0 of data group, according to an embodiment of the present invention.

According to FIG. 22, a structure provided before a data group is interleaved, when the data group includes (118+38) mobile service data packets.

Referring to FIG. 22, the data group includes mobile service data of the regions A and B, mobile service data of the regions C and D, mobile service data of the region E, an MPEG header, trellis initialization data, known data, signaling data, RS parity data, and dummy data.

Figure 23:
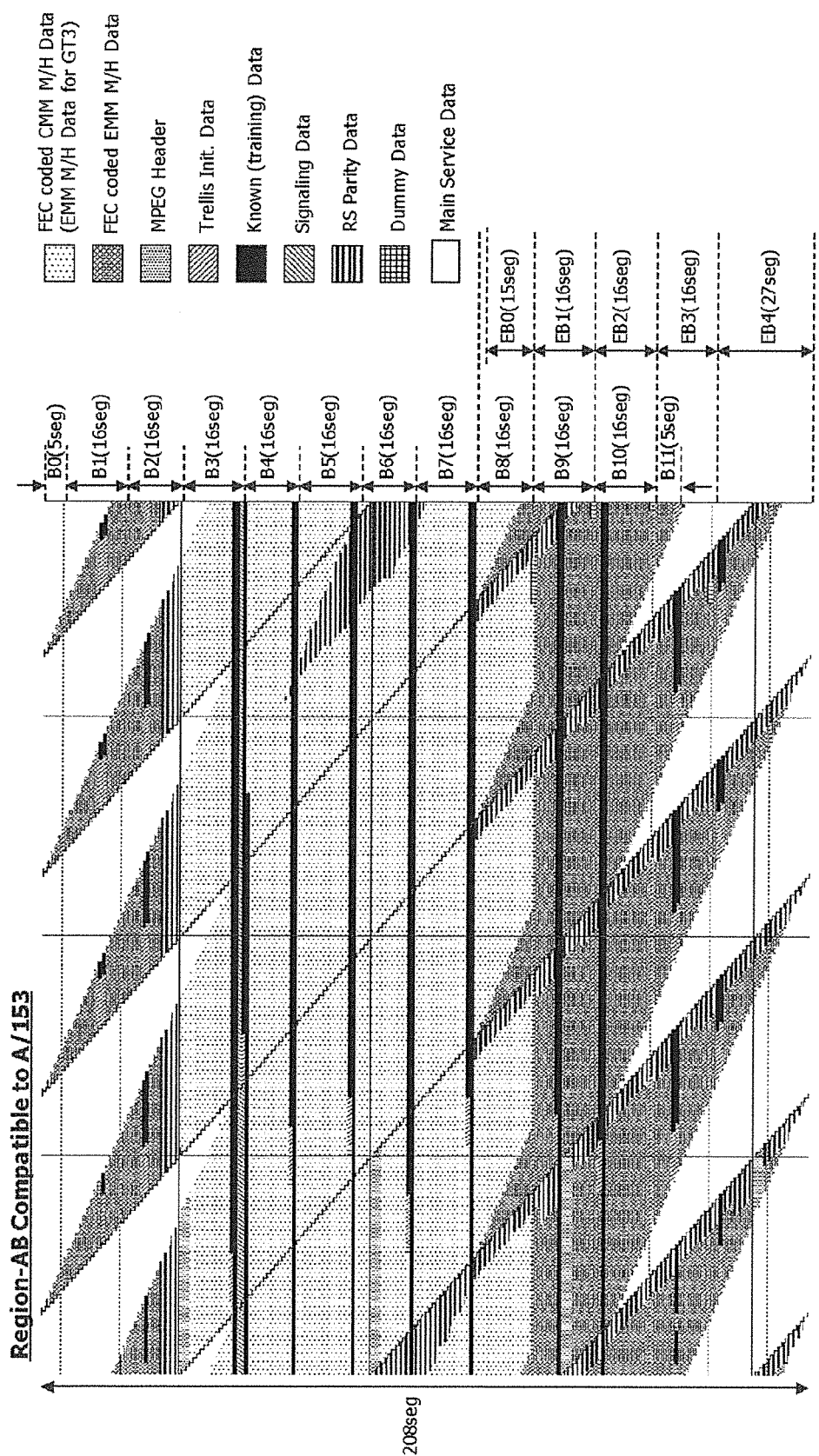
FIG. 23 illustrates a structure provided after a group type 2-0 of data group is interleaved, when the data group includes (118+38) mobile service data packets, according to an embodiment of the present invention.

FIG. 23 illustrates a structure provided after a group type 2-0 of data group is interleaved, when the data group includes (118+38) mobile service data packets, according to an embodiment of the present invention.

The structure shown in FIG. 23 is identical to a structure formed after the data group of FIG. 22 is interleaved.

As can be seen from the data group shown in FIG. 23, the primary ensemble is transmitted through the regions A and B of the data group, and the secondary ensemble is transmitted through the regions C, D, and E of the data group. Since the regions A and B include the RS parity and the MPEG header, they can maintain the compatibility with a conventional digital mobile broadcast system.

Furthermore, the data that are transmitted through regions A and B may be validly decoded by the conventional mobile broadcasting system. However, although the data that are transmitted through regions C, D, and E can be received by the conventional mobile broadcasting system, the corresponding data cannot be processed as valid information.

Although the data group of FIG. 23 is divided into 10 blocks belonging to the regions A, B, C and D and five additional blocks belonging to the region E, the number of blocks belonging to the region E is not limited only to '5' and may be changed to another number other than '5' according to the intention of a designer.

Referring to FIG. 23, additional known data is inserted into the regions C and D in addition to the regions A and B. The data group shown in FIG. 23 is not affected by main service data, such that successive known data sequences can be contained in the regions C and D differently from the data group shown in FIG. 13. Therefore, the reception performance of mobile service data transmitted through the regions C and D at the reception end can be greatly increased.

In accordance with the present invention, the number of known data sequences inserted into the regions C and D is not limited only to a specific number. Therefore, according to the intention of a designer, a proper number of known data sequences required for enhancing the reception performance of the reception end can be inserted. In accordance with one embodiment of the present invention, 3 known data sequences are inserted into the region C, and 2 known data sequences are inserted into the region D.

Figure 24:
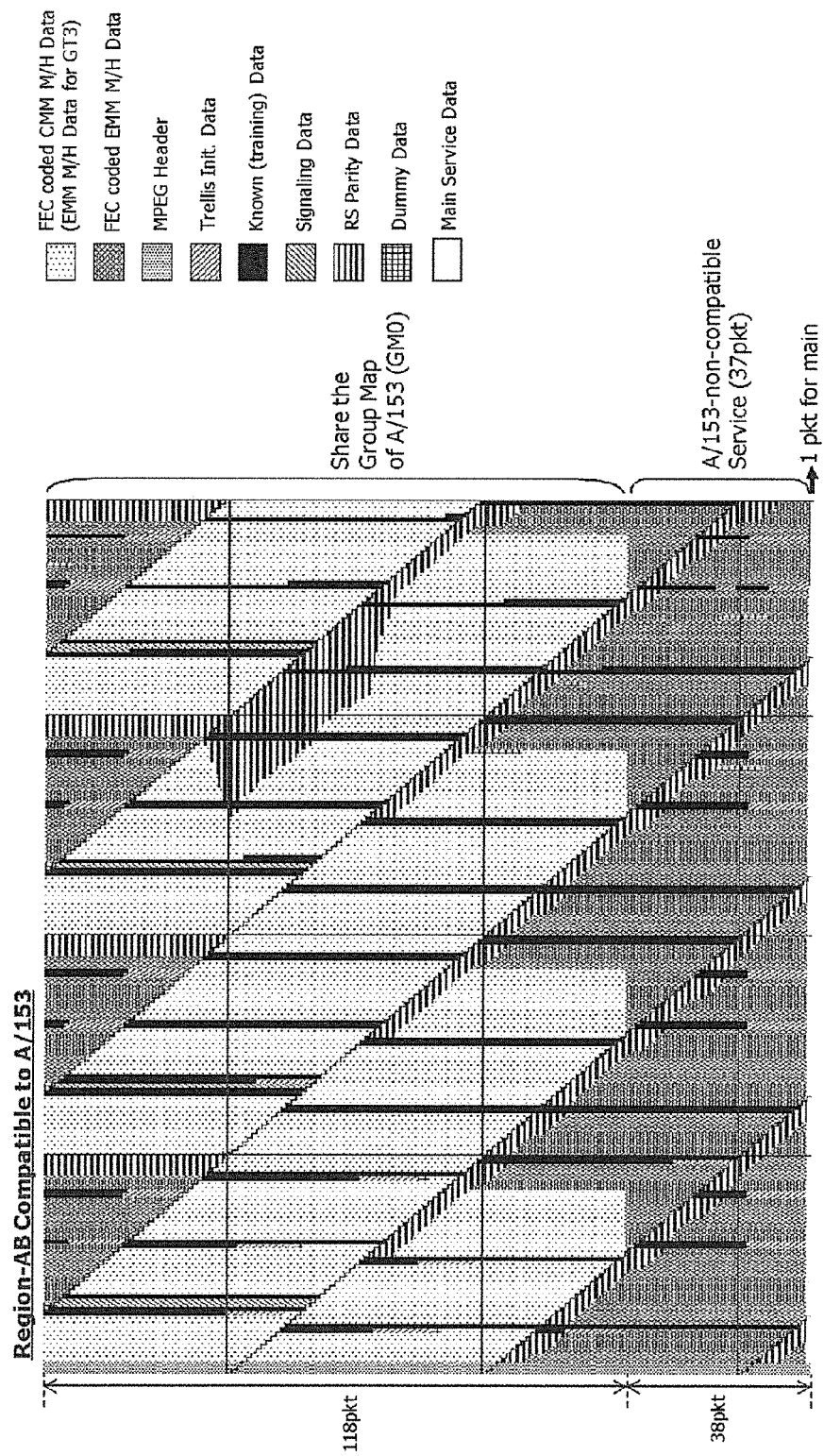
FIG. 24 illustrates group type 2-1 of data group, according to an embodiment of the present invention.

FIG. 24 illustrates group type 2-1 of data group, according to an embodiment of the present invention.

According to FIG. 24, a structure provided before a data group is interleaved, when the data group includes (118+37) mobile service data packets.

Referring to FIG. 24, the data group includes mobile service data of the regions A and B, mobile service data of the regions C and D, mobile service data of the region E, an MPEG header, trellis initialization data, known data, signaling data, RS parity data, and dummy data.

As shown in FIG. 24, one main service data packet may be inserted in region E. In the conventional broadcasting system, an error may occur when main data are not received for a long period of time. However, by inserting the main service data packet, as described above, such error may be prevented.

Figure 25:
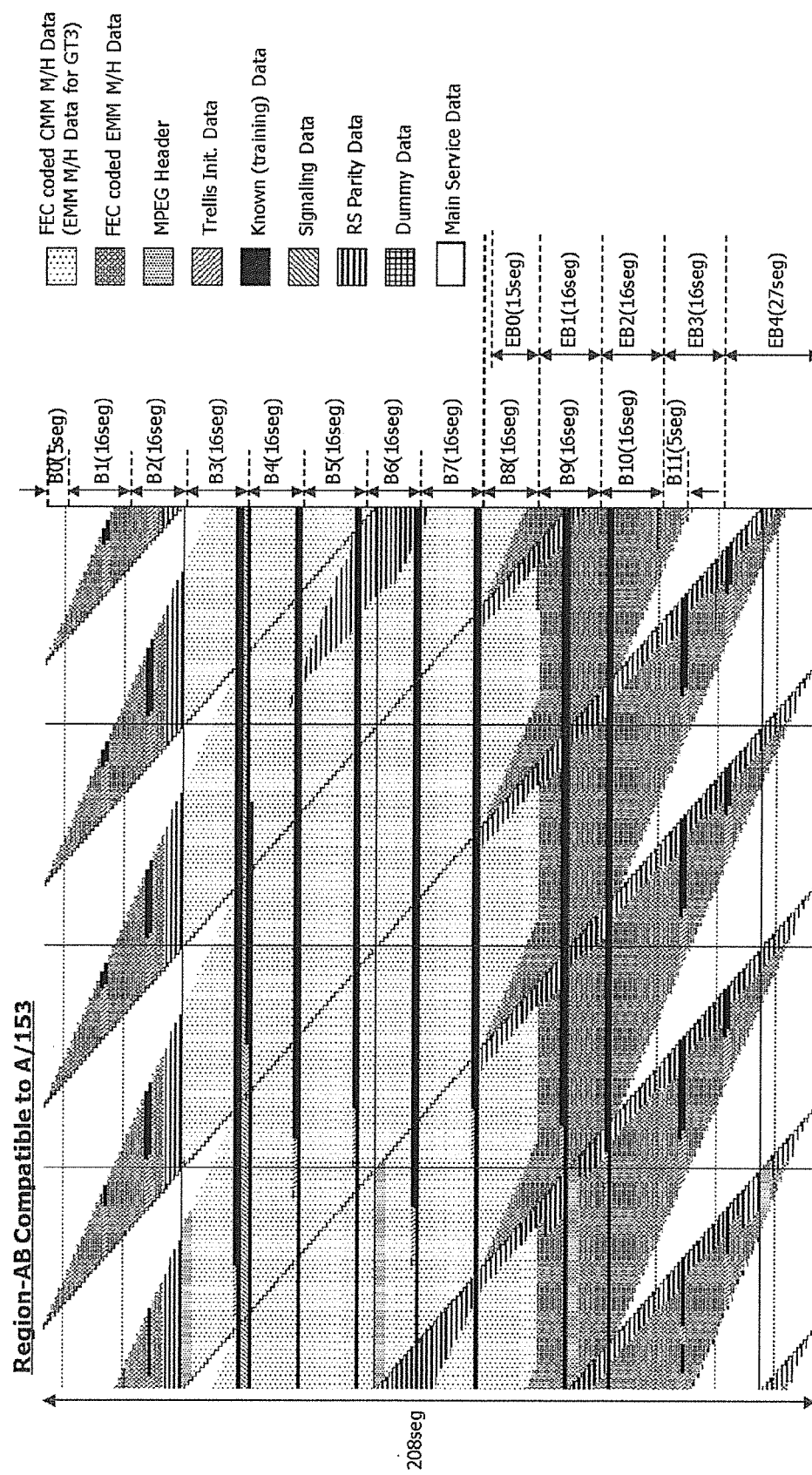
FIG. 25 illustrates a structure provided after a group type 2-1 of data group is interleaved when the data group includes (118+37) mobile service data packets according to an embodiment of the present invention.

FIG. 25 illustrates a structure provided after a group type 2-1 of data group is interleaved when the data group includes (118+37) mobile service data packets according to an embodiment of the present invention.

The structure shown in FIG. 25 is identical to a structure formed after the data group of FIG. 24 is interleaved.

Figure 26:
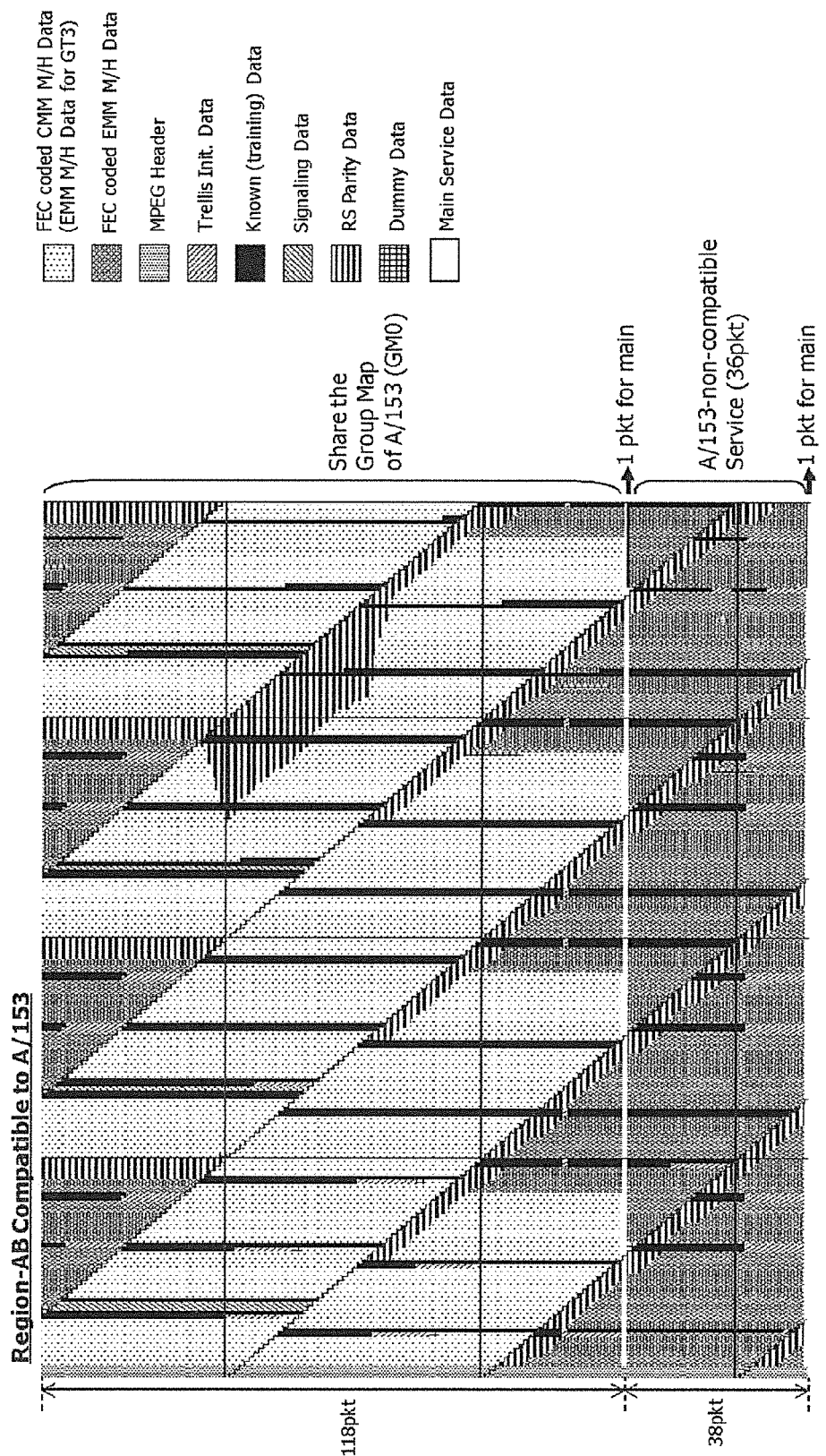
FIG. 26 illustrates group type 2-2 of data group, according to an embodiment of the present invention.

FIG. 26 illustrates group type 2-2 of data group, according to an embodiment of the present invention.

According to FIG. 26, a structure provided before a data group is interleaved, when the data group includes (118+36) mobile service data packets.

Figure 27:
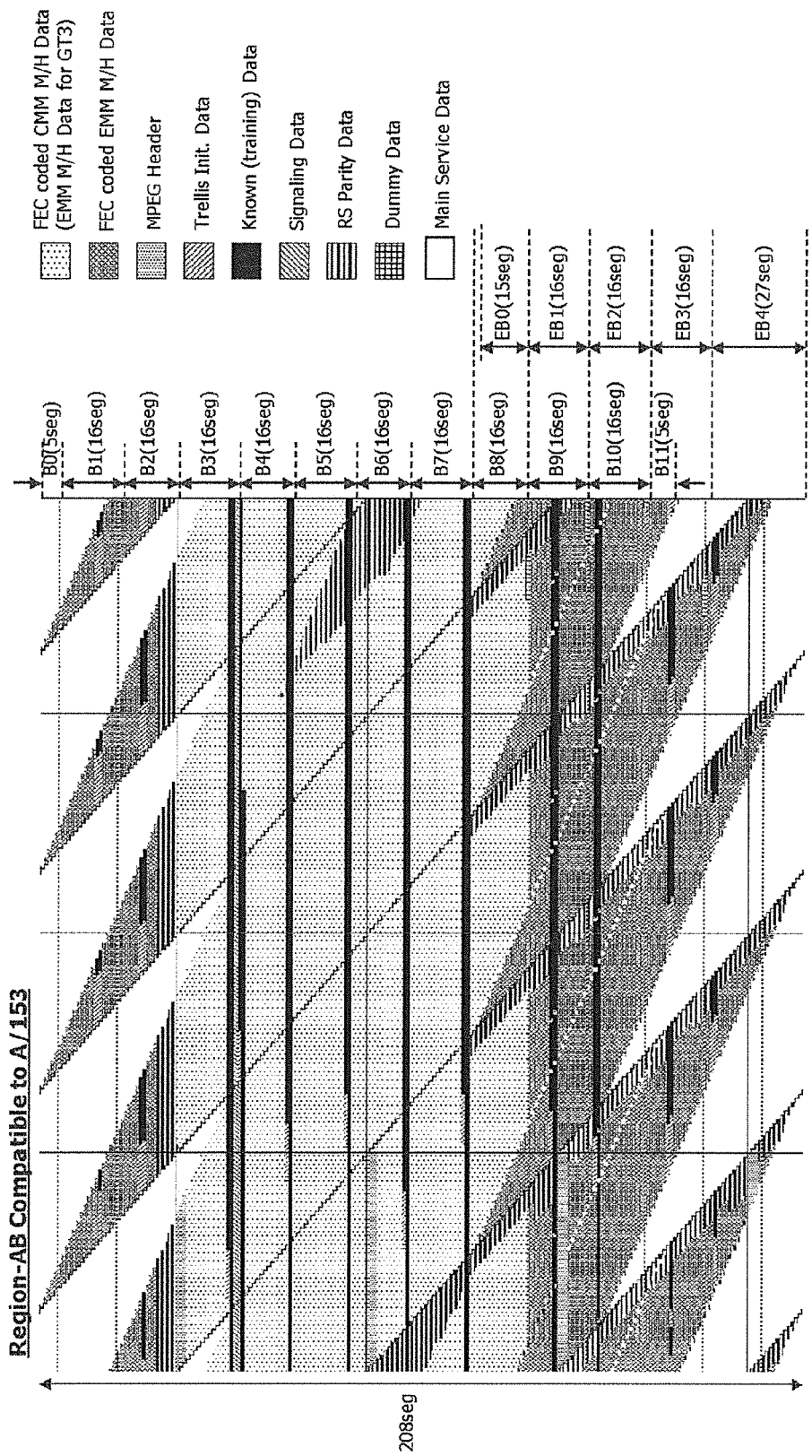
FIG. 27 illustrates a structure provided after a group type 2-2 of data group is interleaved when the data group includes (118+36) mobile service data packets according to an embodiment of the present invention.

FIG. 27 illustrates a structure provided after a group type 2-2 of data group is interleaved when the data group includes (118+36) mobile service data packets according to an embodiment of the present invention.

The structure shown in FIG. 27 is identical to a structure formed after the data group of FIG. 26 is interleaved.

Figure 28:
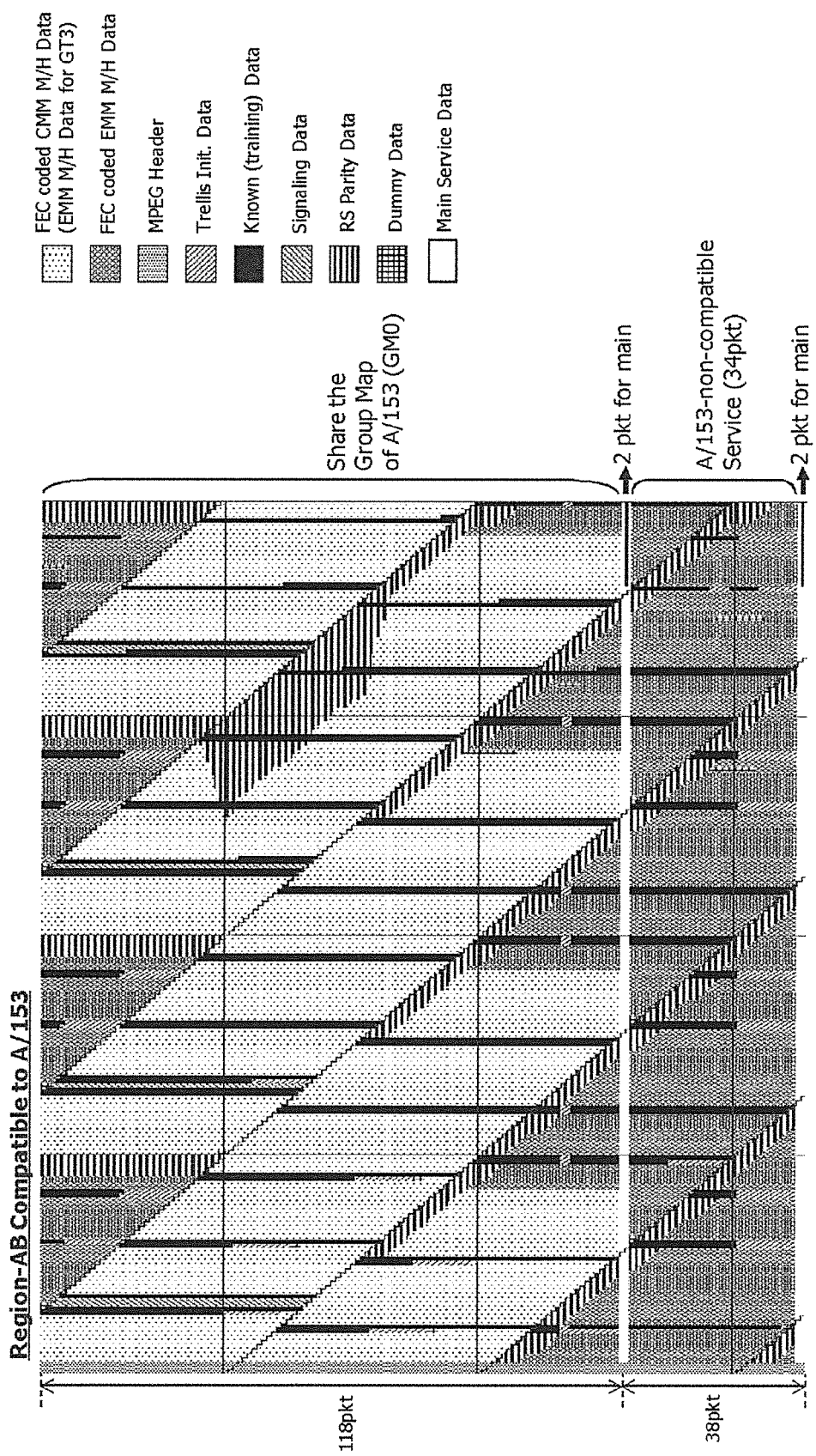
FIG. 28 illustrates group type 2-4 of data group, according to an embodiment of the present invention.

FIG. 28 illustrates group type 2-4 of data group, according to an embodiment of the present invention.

According to FIG. 28, a structure provided before a data group is interleaved, when the data group includes (118+34) mobile service data packets.

Figure 29:
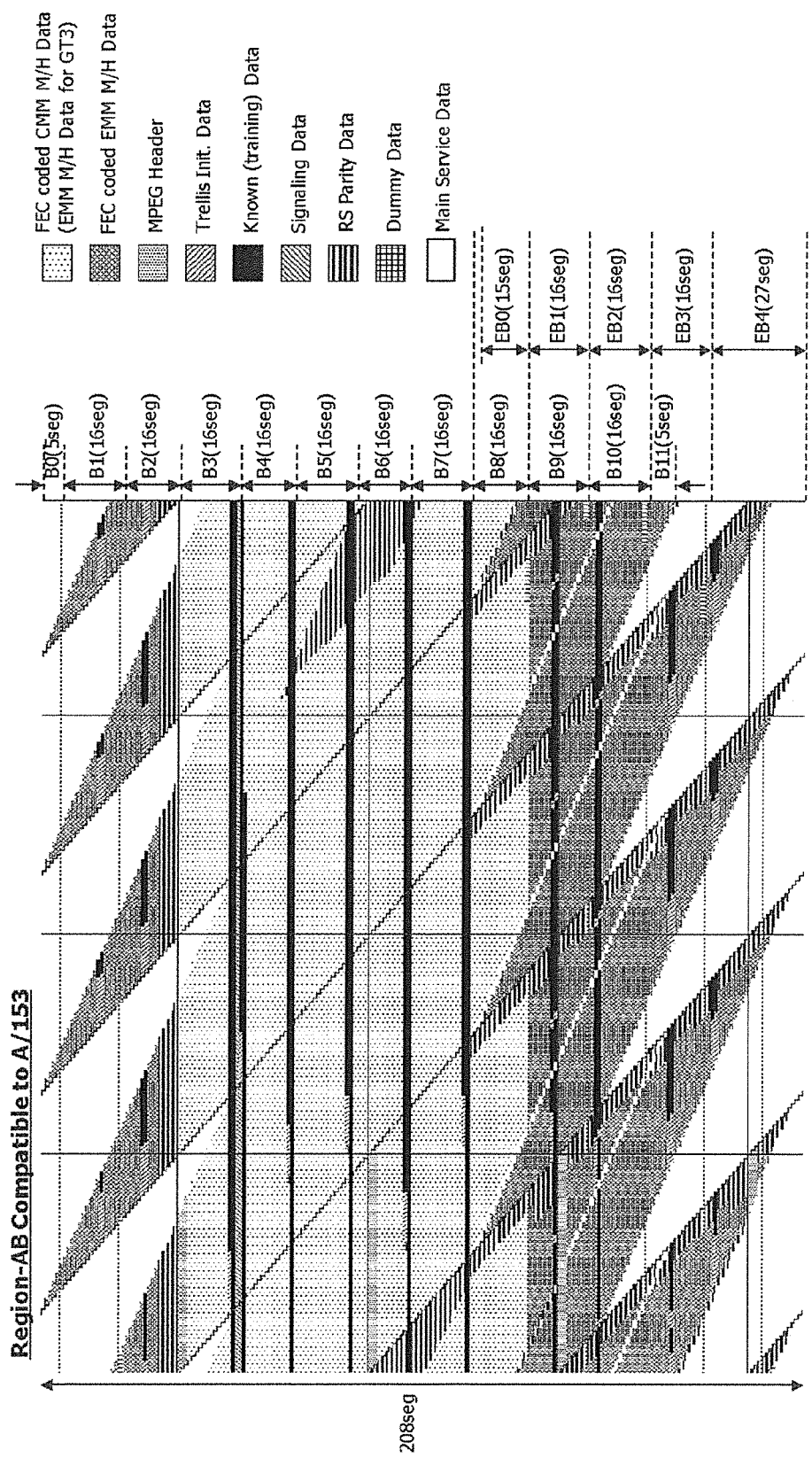
FIG. 29 illustrates a structure provided after a group type 2-4 of data group is interleaved when the data group includes (118+34) mobile service data packets according to an embodiment of the present invention.

FIG. 29 illustrates a structure provided after a group type 2-4 of data group is interleaved when the data group includes (118+34) mobile service data packets according to an embodiment of the present invention.

The structure shown in FIG. 29 is identical to a structure formed after the data group of FIG. 28 is interleaved.

Figure 30:
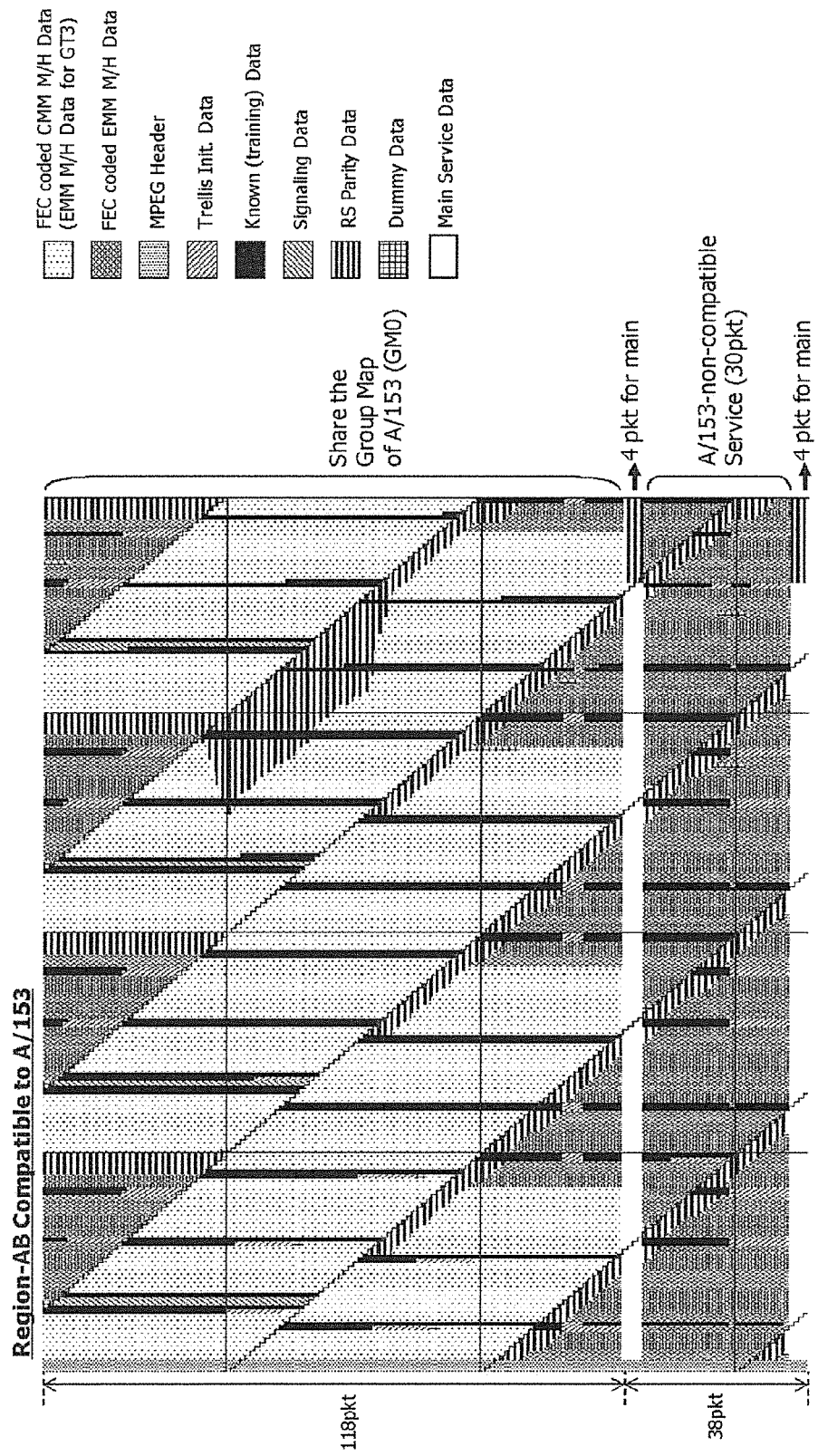
FIG. 30 illustrates group type 2-8 of data group, according to an embodiment of the present invention.

FIG. 30 illustrates group type 2-8 of data group, according to an embodiment of the present invention.

According to FIG. 30, a structure provided before a data group is interleaved, when the data group includes (118+30) mobile service data packets.

Figure 31:
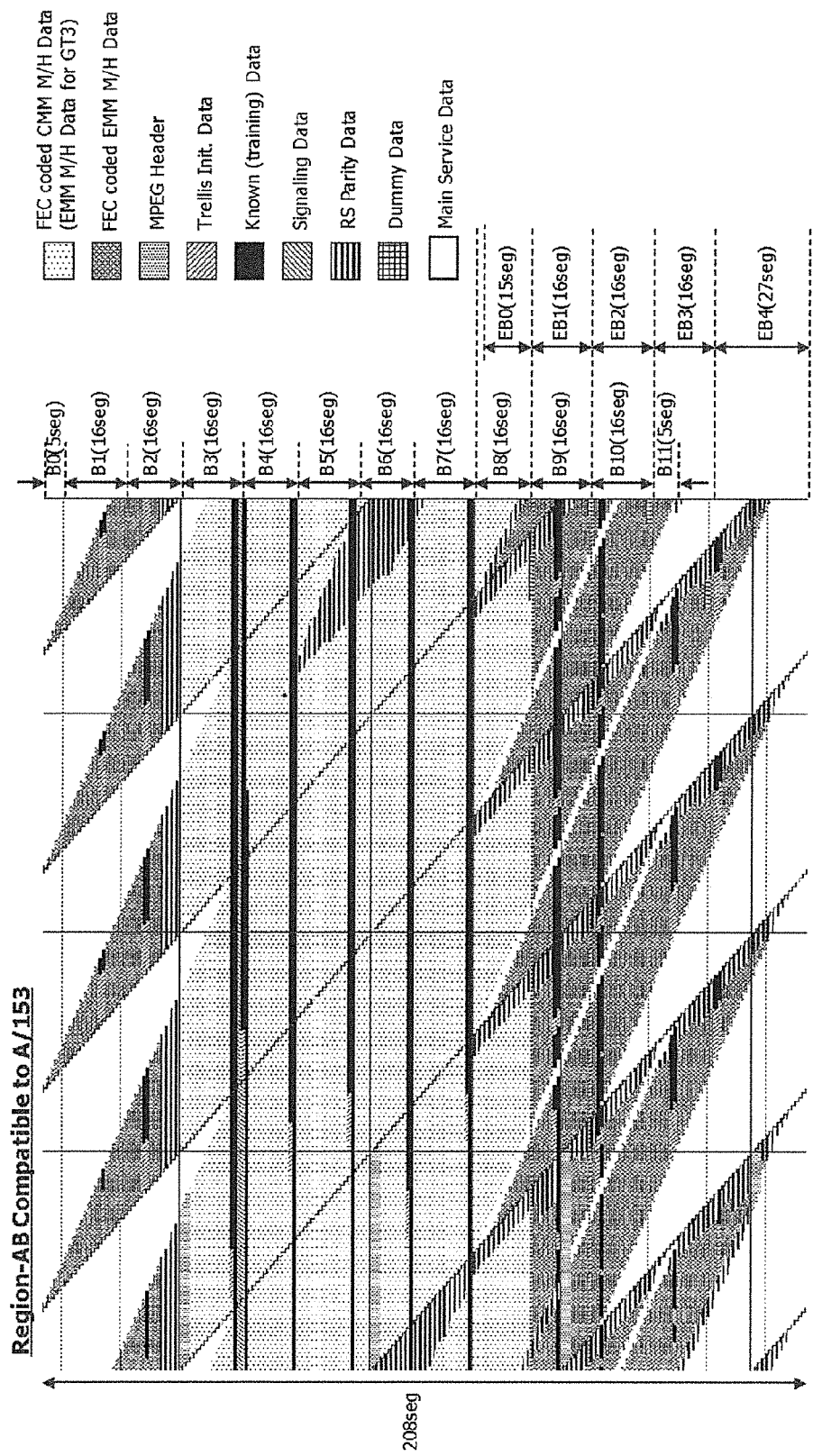
FIG. 31 illustrates a structure provided after a group type 2-9 of data group is interleaved when the data group includes (118+30) mobile service data packets according to an embodiment of the present invention.

FIG. 31 illustrates a structure provided after a group type 2-9 of data group is interleaved when the data group includes (118+30) mobile service data packets according to an embodiment of the present invention.

The structure shown in FIG. 31 is identical to a structure formed after the data group of FIG. 30 is interleaved.

Referring to the data group structure of FIG. 22 to FIG. 31, a group is divided into 12 DATA blocks (MH blocks B0 to B11) for the first mobile mode. Additionally, the group is also divided into 5 extended DATA blocks (MH blocks EB0 to EB4) for the second mobile mode.

At this point, the receiving system for the first mobile mode may receive and process only the data of 6 DATA blocks (MH blocks B3 to B8). And, the receiving system for the second mobile mode may receive all data of the 12 DATA blocks (MH blocks B0 to B11) and all data of the 5 extended DATA blocks (MH blocks EB0 to EB4), so as to process both the mobile data of the first mobile mode and the mobile data of the second mobile mode.

Meanwhile, group type 3 is segmented to 5 group types (group type 3-0, 3-1, 3-2, 3-4, and 3-8), depending upon the number of mobile service data packets of the region E. In the group of group type 3, the primary group division includes regions A, B, C, D, and E, and the secondary group division does not exist. More specifically, according to the embodiment of the present invention, in the primary group division, mobile service data for the second mobile mode are assigned to regions A, B, C, D, and E, and mobile service data of the first mobile mode are not assigned to the primary group division. At this point, the group format of group type 3 is identical to the group format of group type 2. Therefore, reference may be made to the descriptions of FIG. 27 to FIG. 39 for the description of the data groups of each sub group type 3-0, 3-1, 3-2, 3-4, and 3-8 of group type 3 . However, the receiving system for the first mobile mode does not process group type 3. And, the receiving system for the second mobile mode may receive and process all data of the 12 DATA blocks (MH blocks B0 to B11) and the 5 extended DATA blocks (MH blocks EB0 to EB4).

The data groups of FIG. 23, FIG. 25, FIG. 27, FIG. 29, and FIG. 31 may include additional training sequences in addition to the 6 long training sequences included in the data group of FIG. 11. The additional training sequences may be inserted in a region allocated (or assigned) for CMM and/or SFCMM within the data group. More specifically, according to the embodiment of the present invention, the additional training sequences are inserted in regions C, D, and E of the data group. Herein, the number of additional training sequences will not be limited to the number of additional training sequences shown in the drawing. Accordingly, the number of additional training sequences may be varied in order to satisfy the requirements respective to the transmission environment (or condition) of the broadcast signals.

Referring to FIG. 23, FIG. 25, FIG. 27, FIG. 29, and FIG. 31, a symbol output having six additional known data sequences and being created with the six additional known data sequences configures two long training sequences and four segmented short training sequences. The added long training sequence will be referred to as a long additional training sequence in order to be differentiated from the long training sequence that is commonly included in group type 0.

Symbol sequences pre-known by the transmitted end and the receiving end briefly appear several times in a short training sequence. In case of the first and second short training sequences, mobile service data or main service data being allocated to a slot, which is transmitted immediately before the respective slot, may be transmitted between the pre-known symbol sequences. In case of the third and fourth short training sequences, main service data being allocated to the respective slot may be transmitted between the pre-known symbol sequences, or mobile service data or main service data may be transmitted to a slot that is to be transmitted immediately after to the respective slot.

Depending upon the group type, among the two long additional training sequences, one or two of the long additional training sequences may correspond to a segmented long training sequence. In the segmented long training sequence, an unknown data symbol may be inserted in the middle of a long additional symbol sequence pre-known by the transmitting end and the receiving end. Also, main service data being allocated to the respective slot are transmitted in the middle of the segmented long additional symbol sequence.

According to the embodiment of the present invention, the first short training sequence may be positioned in the $11^{th}$ and $12^{th}$ segments of the data block B1. And, the second short training sequence may be positioned in the $7^{th}$ and $8^{th}$ segments of the data block B2, and the interval between the first short training sequence and the second short training sequence may be equal to 12 segments. Additionally, the interval between the second short training sequence and the first long training sequence, which is commonly included in group type 0, may be equal to 24 segments. The second long additional training sequence may be positioned in the third and fourth segments of the extended data block EB2 or data block B10, and the interval between the second long additional training sequence and the first long additional training sequence may be equal to 12 segments. The third short training sequence may be positioned in the $7^{th}$ and $8^{th}$ extended data block EB3, and the interval between the third short training sequence and the second long additional training sequence may be equal to 20 segments. The fourth short training sequence may be positioned in the third and fourth segments of the extended data block EB4, and the interval between the fourth short training sequence and the third short training sequence may be equal to 12 segments.

In group type 2-0 of FIG. 23 and in group type 2-1 of FIG. 25, two long additional training sequences do not correspond to the segmented long additional training sequences. In group type 2-2 of FIG. 27, in group type 2-4 of FIG. 29, and in group type 2-8 of FIG. 31, two long additional training sequences correspond to the segmented long additional training sequences.

Figure 32:
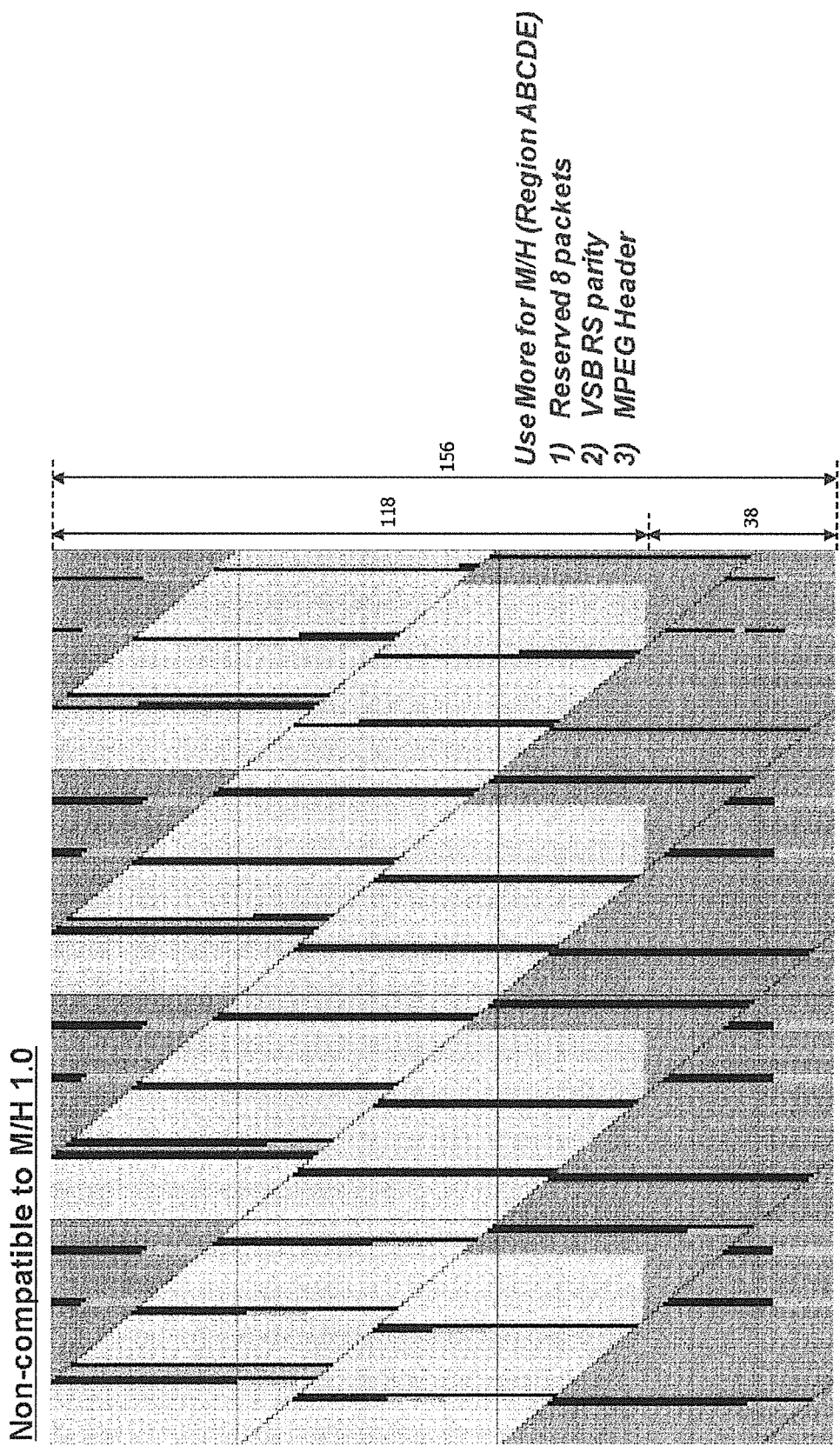
FIG. 32 illustrates group type 4 of data group, according to an embodiment of the present invention.

FIG. 32 illustrates group type 4 of data group, according to an embodiment of the present invention.

According to FIG. 32, a structure provided before a data group is interleaved, when the data group includes (118+38) mobile service data packets.

As for the data group shown in FIG. 32, on the condition that 16 slots contained in one sub-frame transmit a data group including 156 mobile service data packets, the data group of FIG. 32 may represent any one of data group types.

The data group shown in FIG. 32 includes mobile service data of the regions A and B, mobile service data of the regions C and D, mobile service data of the region E, trellis initialization data, known data, signaling data, and dummy data. That is, the data group of FIG. 32 does not include the RS parity and the MPEG header for backward compatibility.

As shown in FIG. 32, the regions A, B, C, D and E do not include the region for the RS parity and the MPEG header. Therefore, the above-mentioned regions can be used to transmit mobile service data, such that much more mobile service data can be transmitted.

Figure 33:
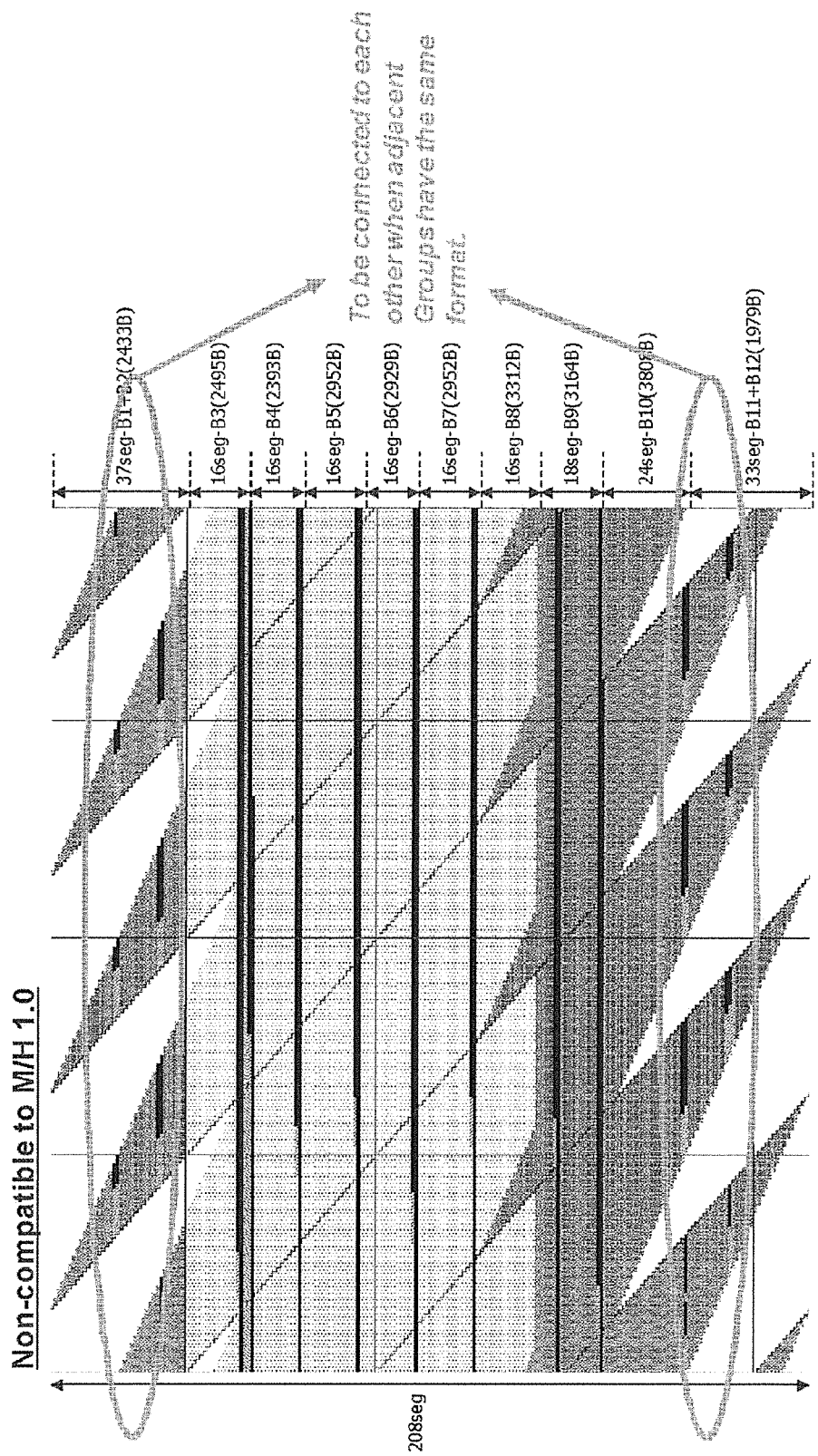
FIG. 33 illustrates a structure provided after a group type 4 of data group is interleaved, when the data group includes (118+38) mobile service data packets, according to an embodiment of the present invention.

FIG. 33 illustrates a structure provided after a group type 4 of data group is interleaved, when the data group includes (118+38) mobile service data packets, according to an embodiment of the present invention.

The structure shown in FIG. 33 is identical to a structure formed after the data group of FIG. 32 is interleaved.

Referring to FIG. 33, additional known data is inserted into the regions C and D in addition to the regions A and B. The data group shown in FIG. 33 is not affected by main service data, such that successive known data sequences can be contained in the regions C and D. Therefore, the reception performance of mobile service data transmitted through the regions C and D at the reception end can be greatly increased.

In addition, first known data present in the region E of the first data group may be connected to second known data present in the upper C and D regions of the second data group that is adjacent to the first data group. In this case, a known data sequence may be assigned to an overall area of the data group. As a result, the reception performance of mobile service data in the case of using the overall area of the group is higher than the reception performance of mobile service data in another case of using a conventional data group.

In accordance with another embodiment of the present invention, when known data of the first data group is connected to known data of the second group that is adjacent to the first data group, known data instead of trellis initialization data inserted in the front end of each known data may be additionally inserted. In this case, the trellis initialization data to be located at the front end of the connected known data sequence should be contained in the data group.

In addition, as shown in FIG. 33, in the regions A, B, C, D and E, mobile service data is inserted into the reserved area for the RS parity and the MPEG header, such that much more mobile service data can be transmitted within one data group.

Figure 34:
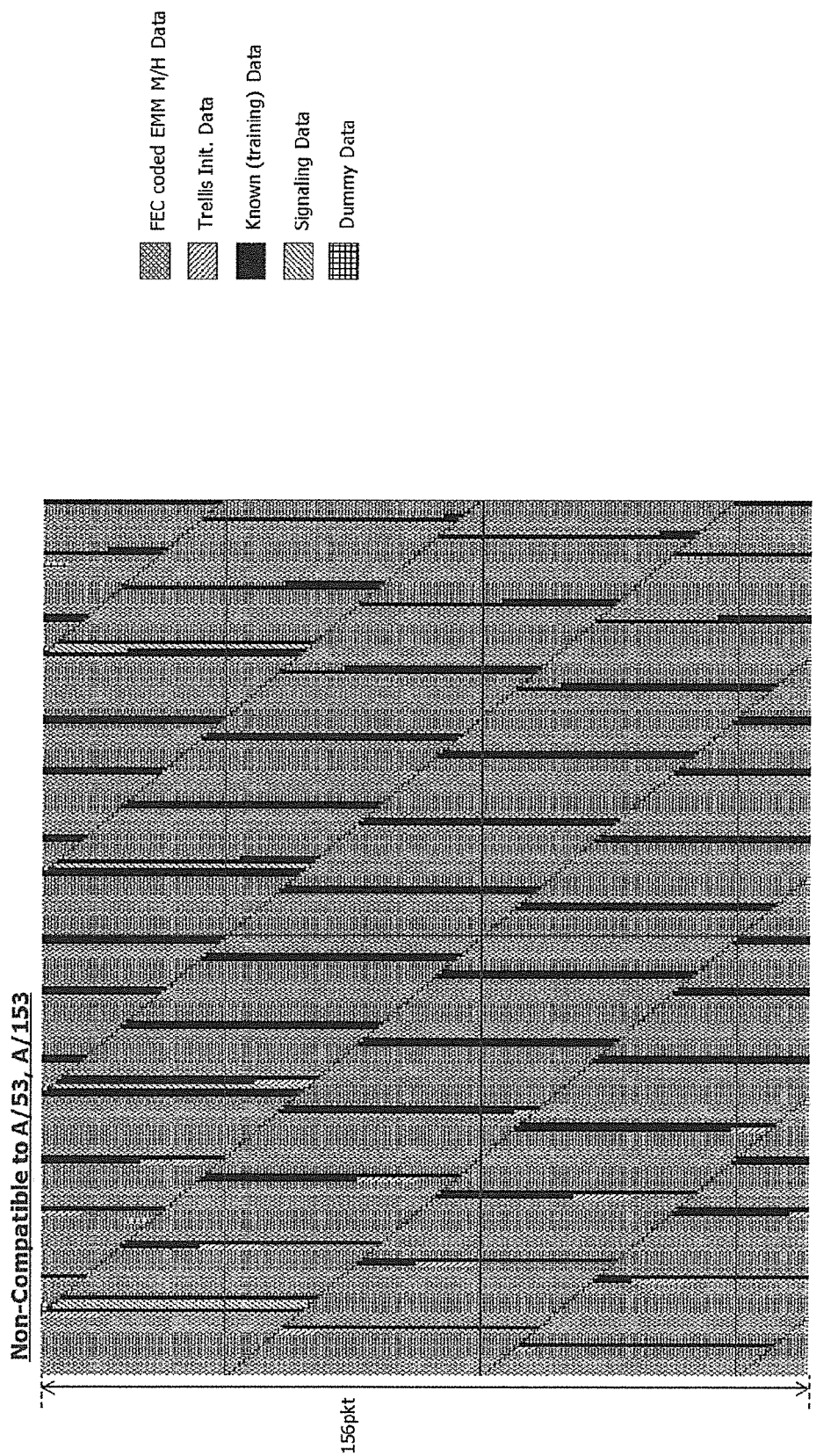
FIG. 34 illustrates a data group according to the present invention, wherein 156 mobile service data packets are allocated to a single data group.

FIG. 34 illustrates a data group according to the present invention, wherein 156 mobile service data packets are allocated to a single data group.

According to the embodiment of the present invention, when the data groups, which are transmitted by all slots within a single sub-frame, are configured of 156 mobile service data packets, the corresponding data groups may be defined as group type 4.

One data frame may transmit main service data, mobile service data for CMM, and/or mobile service data for SFCMM.

When mobile service data of SFCMM are transmitted along with main services and CMM services, data groups may be divided into group type 0 to group type 3, depending upon the method of allocating the CMM or SFCMM to each region.

Among the above-described data groups, the data groups of group type 0 transmit mobile service data of CMM to group regions A, B, C, and D and do not transmit mobile service data of SFCMM. Therefore, in group type 0, the group region E does not exist.

Among the above-described data groups, the data groups of group type 1 transmit mobile service data of CMM to group regions A, B, C, and D and may transmit mobile service data of SFCMM to the group region E.

Among the above-described data groups, the data groups of group type 2 transmit mobile service data of CMM to group regions A and B and transmit mobile service data of SFCMM to the group regions C, D, and E.

Among the above-described data groups, the data groups of group type 3 transmit mobile service data of SFCMM to group regions A, B, C, D, and E.

The data groups of group type 0 transmit mobile service data of CMM along with main service data, and the data groups of group type 1 to group type 3 may or may not transmit main service data. Accordingly, in the data groups of group type 1 to group type 3, lower-level group types may be determined depending upon the number of main service data packets that are allocated to the corresponding slot.

A data frame may transmit only the mobile service data for SFCMM. Additionally, the entire channel capacity may be allocated for the transmission of the mobile service data for SFCMM only.

For example, data groups are allocated to all slots within a data frame or a sub-frame. And, when the allocated data groups all correspond to the group type 3-0, the entire channel capacity is allocated for the transmission of the mobile service data for SFCMM only. In this case, the mobile service is not required to have backward compatibility with the main service. However, since the group type 3-0 may also configure a data frame or a sub-frame along with another group type, the group type 3-0 should always be compatible with the main service and CMM service.

Therefore, in case the entire data channel capacity within at least one sub-frame is allocated for the transmission of mobile service data for SFCMM, the embodiment of the present invention proposes a method of using used data for the compatibility with the main service and the CMM service.

The above-described method will hereinafter be referred to as an Increased Capacity Mode (ICM).

When data groups are allocated to all slots within at least one sub-frame, and when main service data or mobile service data of CMM are not transmitted to any of the slots within the at least one sub-frame, the ICM may be applied. More specifically, the data groups that are allocated to all slots within the at least one sub-frame transmit only the mobile services for the SFCMM.

Data groups of a new group type are used in the ICM, and the new group type used herein will be referred to as group type 4 (GT4). More specifically, data groups of group type 4 are transmitted to all slots within the at least one sub-frame.

Just as group type 3, group type 4 transmits mobile service data of SFCMM to all group regions A, B, C, D, and E. Also, since the data groups of group type 4 do not include main service data packets, a lower-level group type does not exist.

In the data groups of group type 0 to group type 3, for the compatibility with the main services, each of the data packets includes an MPEG-2 header, and each of the data packets is processed with systematic/non-systematic RS encoding so as to include an RS parity byte. However, since the data groups of group type 4 disregards (or ignores) the compatibility with the main services, the data bytes that were used for the MPEG-2 header and the RS parity byte may be used for the transmission of mobile service data.

More specifically, for example, while each of the data groups of group type 0 to group type 3 includes 184 bytes of mobile service data, a 3-byte MPEG-2 header, and 20 bytes of RS parity bytes, each data group of group type 4 includes 207 bytes of mobile service data.

As described above, since the transmission amount of the mobile service data increases, the channel capacity for the transmission of mobile service data may be extended from 19.39 Mbps to 21.35 Mbps.

FIG. 34 illustrates a group structure of a packet domain of group type 4 according to an embodiment of the present invention. Herein, FIG. 34 shows the structure of a group prior to a data interleaving process.

Figure 35:
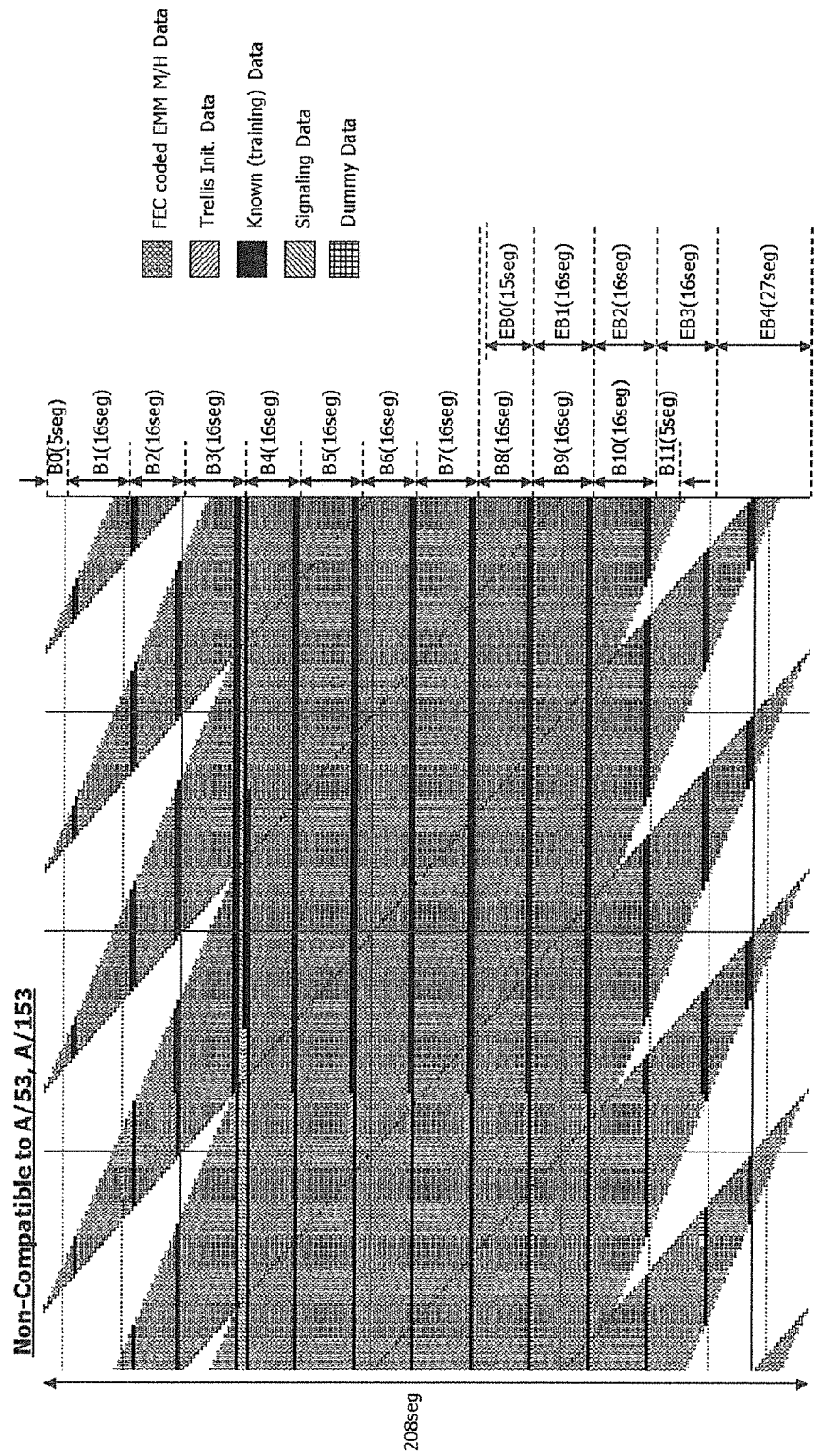
FIG. 35 illustrates a group structure of a data group of group type 4 after a data interleaving process according to an embodiment of the present invention.

FIG. 35 illustrates a group structure of a data group of group type 4 after a data interleaving process according to an embodiment of the present invention.

A group map may be configured of a plurality of data blocks or a plurality of extended data blocks, and the data group of group type 4 according to the embodiment of the present invention may be configured of 12 data blocks and 5 extended data blocks. Additionally, the size and position of each data block or extended data block are identical to those of a data group corresponding to another group type.

The data group of group type 4 may transmit only mobile services of SFCMM. Accordingly, an SCFMM primary parade may be allocated to the group type 4 having only a primary group division, thereby being transmitted.

In the ICM, since all data groups within at least one sub-frame corresponds to data groups of group type 4, each of the parade corresponds to the SFCMM primary parade, and each of the ensemble corresponds to the SFCMM primary ensemble. Also, although one super ensemble may be transmitted to two SCFMM primary parades, since there is no difference between transmitting a super ensemble to two SFCMM Primary parades and transmitting the super ensemble through one SFCMM primary parade in the ICM, there is no need to actually configure a super ensemble.

Meanwhile, as shown in FIG. 35, the data group of group type 4 may include 8 long training sequences and 6 short training sequences.

The first long training sequence is positioned in the last two segments of data block B3. The second long training sequence is positioned in the second and third segments of data block B4. The third to eighth long training sequences are respectively positioned in each of the last two segments of data block B4 to data block B9.

Among the above-described long training sequences, the first long training sequence and the third to eighth long training sequences each has an interval of 16 segments with its neighboring (or adjacent) training sequence. Also, the first long training sequence and the third to eighth long training sequences each share the same value. Furthermore, in case of the second long training sequence, the first half of the corresponding long training sequence and the second half of the corresponding long training sequence each has the same value.

The first short training sequence is positioned in third to fourth segments of data block B1, and the second short training sequence is positioned in third to fourth segments of data block B2. The third short training sequence is positioned in the last two segments of data block B2. And, the fourth short training sequence and the fifth short training sequence are respectively positioned in the last two segments of data block B10 and extended data block EB3. The sixth short training sequence is positioned in fifteenth and sixteenth segments of extended block EB4.

Since data groups of group type 4 are used in all slots in the ICM, a data group of the same group type 4 exists in each neighboring (or adjacent) slot.

In this case, the first short training sequence of the current data group is connected (or concatenated) to the fourth short training sequence of the very previous data group. The second short training sequence is connected to the fifth short training sequence of the very previous data group, and the third short training sequence is connected to the sixth short training sequence of the very previous data group. Also, the fourth short training sequence of the current data group is connected to the first short training sequence of the very next data group. The fifth short training sequence is connected to the second short training sequence of the very next data group, and the third short training sequence is connected to the third short training sequence of the very next data group.

Each of the connected training sequences becomes a long training sequence, and each of the long training sequence has the same value as the first or third to eighth long training sequences.

In the ICM, since a short training sequence always corresponds to a portion of a long training sequence, trellis initialization does not occur as often as in group map 1 or group map 2. Therefore, according to the embodiment of the present invention, the trellis encoder of the ICM uses only a state-0 initialization.

As described above, since there is no interference of main service data in the data group of group type 4, insertion of training sequences is easier than the data groups of group type 0 to group type 3. However, the number of long training sequences or the number of short training sequences included in the data group of group type 4 may vary depending upon the intentions of the system designer or the broadcasting environment (or condition).

Figure 36:
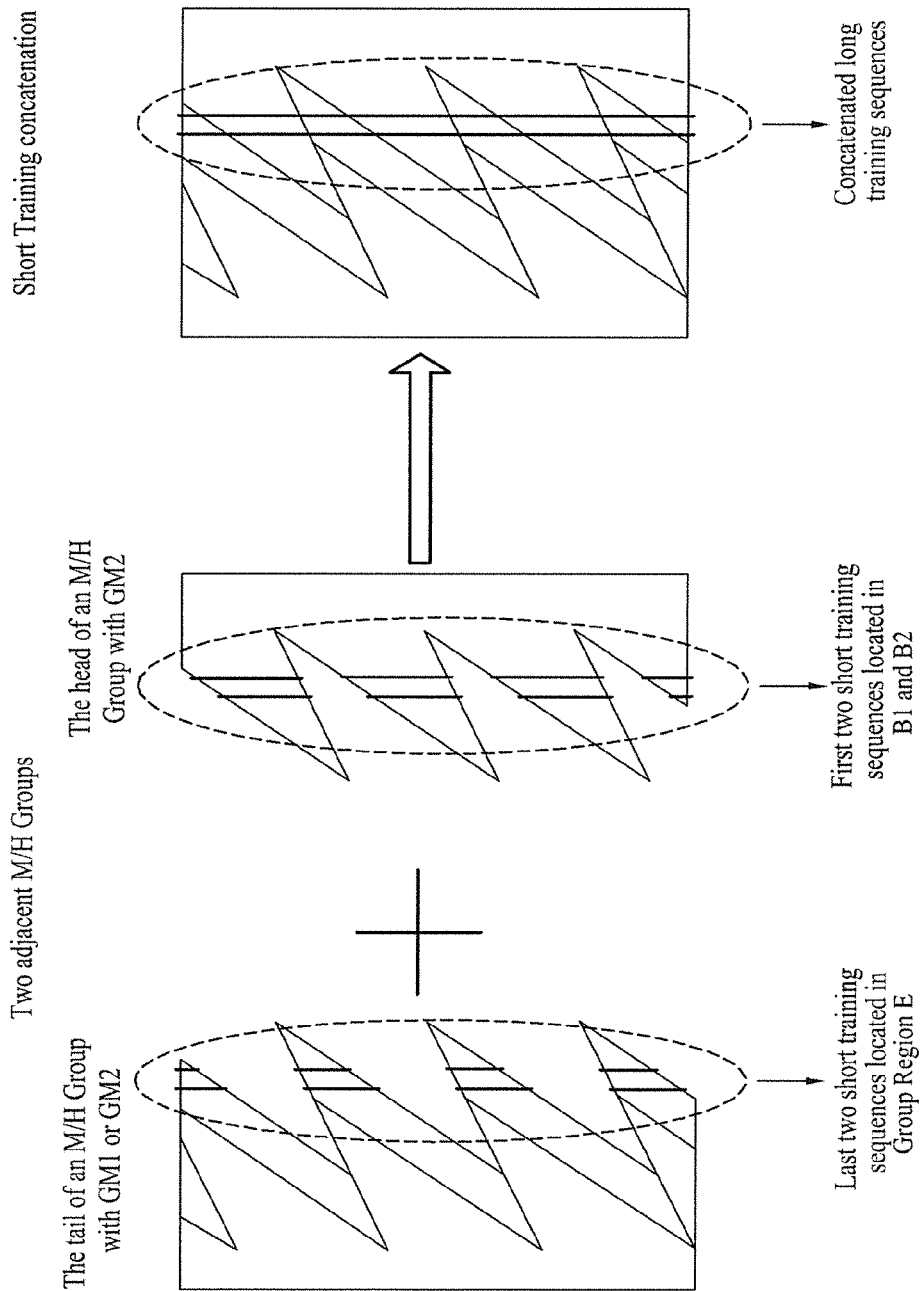
FIG. 36 illustrates a process of generating a long training sequence by combining short segmented training sequences according to an embodiment of the present invention.

FIG. 36 illustrates a process of generating a long training sequence by combining short segmented training sequences according to an embodiment of the present invention.

Among the training sequence included in regions C, D, and/or E within each of the above-described data groups, using short segmented training sequences is less effective in channel equalization, timing recovery, and carrier recovery performed by the receiving end than when using long training sequences. Therefore, by generating (or creating) long training sequences by combining short segmented training sequences, the receiving end may be able to show a more effective performance than when using the short segmented training sequences.

Group type 1 (group types 1-0, 1-1, 1-2, 1-4, and 1-8) and group type 2 (group types 2-0, 2-1, 2-2, 2-4, and 2-8) of FIG. 13, FIG. 15, FIG. 17, FIG. 19, FIG. 21, FIG. 23, FIG. 25, FIG. 27, FIG. 29, and FIG. 31 each includes a third short training sequence and a fourth short training sequence in group region E. According to the embodiment of the present invention, the third short training sequence is positioned in the $7^{th}$ and $8^{th}$ segments of extended data block EB3, and the fourth short training sequence is positioned in the $3^{rd}$ and $4^{th}$ segments of extended data block EB 4.

Also, group type 2 of FIG. 23, FIG. 25, FIG. 27, FIG. 29, and FIG. 31 includes a first short training sequence and a second short training sequence in regions C and D, which are positioned in the front portion of the data group. Herein, the first short training sequence is positioned in the $11^{th}$ and $12^{th}$ segments of data block B1, and the second short training sequence is positioned in the $7^{th}$ and $8^{th}$ segments of data block B2.

When data groups are allocated to both of two consecutive slots, and when the allocated data groups use group type 1 or group type 2, the $7^{th}$ and $8^{th}$ segments of extended data block EB3 of the data group allocated to the earlier slot share the same segments as the $11^{th}$ and $12^{th}$ segments of extended block EB1 of the data group allocated to the later slot. Also, the $3^{rd}$ and $4^{th}$ segments of extended data block EB4 of the data group allocated to the earlier slot share the same segments as the $7^{th}$ and $8^{th}$ segments of extended block EB2 of the data group allocated to the later slot. Although the above-described embodiment of the present invention specifically describes segments that are shared by data groups allocated to neighboring slots, the present invention will not be limited to having segments shared in specific portions, as described above. Therefore, the shared segments may be varied in accordance with the requirements of the system designer.

In case the data groups allocated to the earlier slot use group type 1 or group type 2, and in case the data groups allocated to the later slot use group type 2, the third short training sequence of the data group allocated to the earlier slot is located in the same segment as the first short training sequence of the data group allocated to the later slot, and the two short training sequences are connected (or concatenated) so as to configure one long training sequence or one segmented long training sequence. Also, the fourth short training sequence of the data group allocated to the earlier slot is located in the same segment as the second short training sequence of the data group allocated to the later slot, and the two short training sequences are connected so as to configure one long training sequence or one segmented long training sequence.

More specifically, in case the data group allocated to the current slot uses group type 1, and when data group allocated to consecutive slots uses group type 2, the third and fourth short training sequences positioned in the later portion of the data group may be used as a long training sequence. Also, in case the data group allocated to the current slot uses group type 2, and when the data group allocated to the earlier slot uses group type 1 or group type 2, the first and second short training sequences positioned in the earlier portion of the data group may be used as a long training sequence. In this case, when the data group allocated to the subsequent slot uses group type 2, the third and fourth short training sequence positioned in the later portion of the data group may be used as a long training sequence.

The transmitter may provide signaling on the connection of the training sequences to a transmission parameter channel (TPC), so that the receiver can use the connected training sequences.

The receiver uses the signaling information so as to determine whether or not a short training sequence positioned in the earlier portion of the data group allocated to the current slot or a short training sequence positioned in the later portion of the data group can be used as a long training sequence, and the receiver may acquire channel information from the connected long training sequences and may use the acquired channel information for channel equalization.

Also, according to the embodiment of the present invention, in case short training sequences are combined to configure a long training sequence, as described above, data such as trellis initialization bytes, which can be inserted in front of short training sequences that are inserted in regions C, D, and/or E of each data group, may be treated identically as data belonging to the training sequences. More specifically, for example, in case a pattern trellis initialization bytes is consistent, such data may be used as training sequence data that are mutually known by the transmitting end (or system) and the receiving end (or system).

Figure 37:
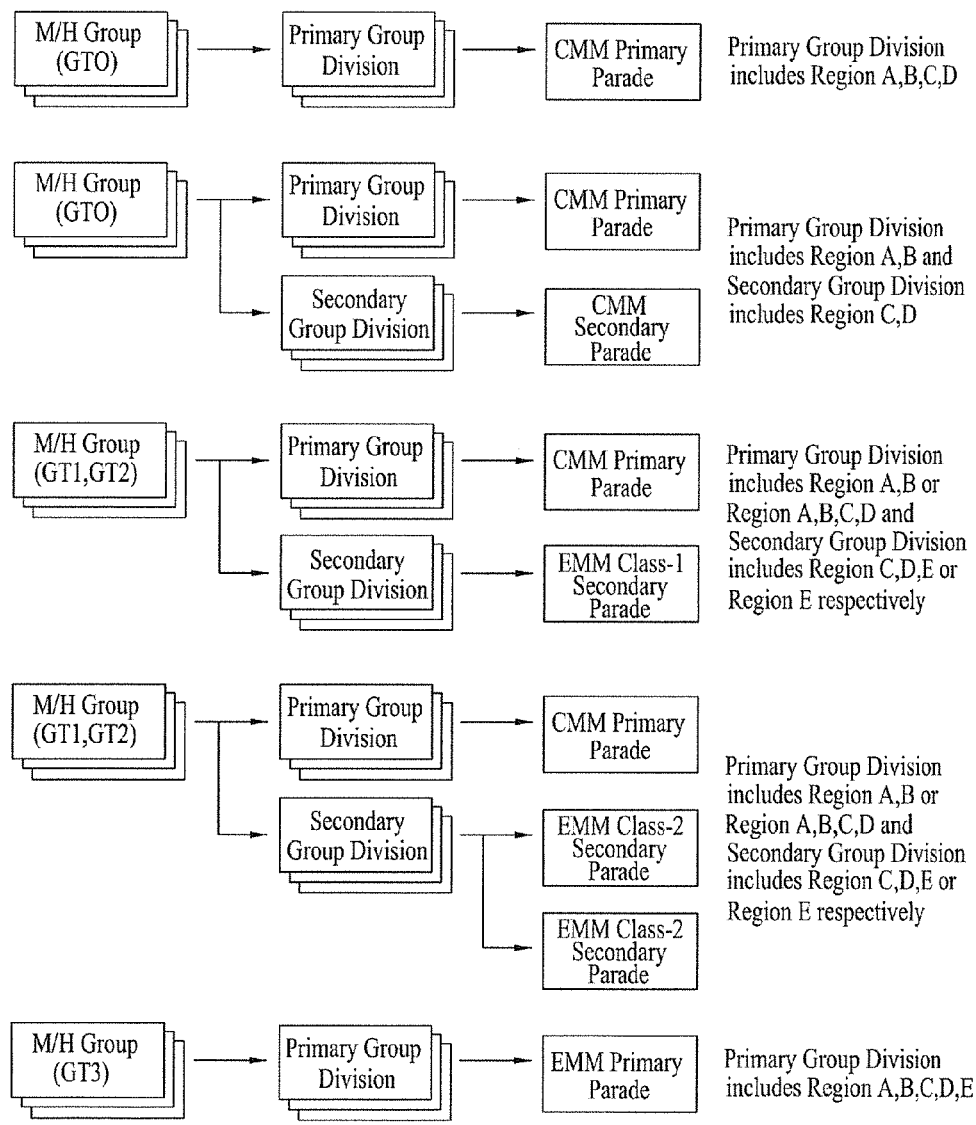
FIG. 37 illustrates a relation between a parade type and a group type according to an embodiment of the present invention.

FIG. 37 illustrates a relation between a parade type and a group type according to an embodiment of the present invention.

An M/H Parade is defined to be a collection of Group Divisions, transmitted through a single M/H Frame. The portion of an M/H Parade within an M/H Sub-frame shall consist of a collection of Group Divisions, where these Group Divisions belong to consecutively numbered DATA Groups. A Parade consists of Group Divisions from Groups having an identical Group Type.

A random primary parade includes primary group divisions of groups corresponding to group type 1-1. In other words, the data of one parade are assigned and transmitted to group divisions of groups having the same group type. For example, data of a random primary parade are assigned and transmitted to a primary group division of groups having the same group type.

The type of a parade is determined by a group type of a group to which the group division, which is included in the corresponding parade, belongs.

A CMM parade corresponds to a parade that is backward compatible with mobile service data of the first mobile mode or mobile service data of CMM.

A CMM primary parade corresponds to a collection of primary group divisions. And, at this point, each primary group division includes mobile service data backward compatible with the first mobile mode. A CMM secondary parade corresponds to a collection of secondary group divisions. And, at this point, each secondary group division includes mobile service data backward compatible with the first mobile mode.

A primary group division included in the CMM primary parade corresponds to a collection of group regions. And, the structure of the primary group division may vary depending upon the group type. Herein, the primary group division included in the CMM primary parade may include regions A, B, C, and D, or the primary group division included in the CMM primary parade may only include regions A and B.

A secondary group division included in the CMM secondary parade corresponds to a collection of group regions. And, the structure of the secondary group division may vary depending upon the group type. Herein, the secondary group division included in the CMM secondary parade may include regions C and D.

An EMM parade corresponds to a parade that is backward compatible with mobile service data of the second mobile mode or mobile service data of EMM.

An EMM primary parade corresponds to a collection of primary group divisions. And, at this point, each primary group division includes mobile service data backward compatible with the second mobile mode. An EMM secondary parade corresponds to a collection of secondary group divisions. And, at this point, each secondary group division includes mobile service data backward compatible with the second mobile mode.

A primary group division included in the EMM primary parade corresponds to a collection of group regions. And, the structure of the primary group division may vary depending upon the group type. Herein, the primary group division included in the EMM primary parade may include regions A, B, C, D, and E.

A secondary group division included in the EMM secondary parade corresponds to a collection of group regions. And, the structure of the secondary group division may vary depending upon the group type. Herein, the secondary group division included in the EMM secondary parade may only include region E.

In case a secondary group division does not exist in the group, the CMM secondary parade or the EMM secondary parade does not exist in the corresponding group.

Also, when the EMM secondary parade exists in a group, the primary parade being paired with the EMM secondary parade corresponds to the CMM primary parade. For example, if the EMM secondary parade corresponds to a collection of secondary group divisions including regions C, D, and E, the primary parade being paired with the EMM secondary parade corresponds to a collection of primary group divisions including regions A and B. At this point, the primary parade corresponds to the CMM primary parade.

Also, depending upon its characteristics, the EMM secondary parade may be classified as an EMM Class 1 secondary parade and an EMM Class 2 secondary parade.

The secondary parade according to the embodiment of the present invention is always paired with a primary parade. And, the secondary group divisions respectively being paired with the primary group divisions are transmitted through the same slots as those of the primary group divisions. Furthermore, the pair of primary parade and secondary parade shares the same parade identifier (parade ID) and the same Number Of Group Division (NOGD). Herein, the NOGD corresponds to the number of group divisions included in one parade within a sub-frame. Also, the NOGD has the same value as the Number of Group (NOG). Herein, the NOG corresponds to a number of groups being assigned with parades having the same parade ID within a sub-frame. For example, when the NOGD of a primary parade is equal to 4, the NOGD of the secondary parade should also be equal to 4.

Conversely, the EMM secondary parade may have a different NOGD value from that of its paired CMM primary parade. When the EMM secondary parade has the same NOGD value as its paired CMM parade, the corresponding EMM secondary parade is classified as an EMM Class 1 secondary parade. And, when the EMM secondary parade has a different NOGD value from that of its paired CMM parade, the corresponding EMM secondary parade is classified as an EMM Class 2 secondary parade.

Meanwhile, the NOGD values of the CMM primary parade, the CMM secondary parade, and the EMM primary parade each has the same value as the respective NOG values.

A group of group type 0 may only have a primary group division. And, in this case, the primary group division includes regions A, B, C, and D. Group type 0 may transmit only mobile services of the first mobile mode. Therefore, a CMM primary parade is assigned and transmitted to group type 0 having only the primary group division.

Moreover, a group of group type 0 may also have both a primary group division and a secondary group division. In this case, the primary group division includes regions A and B, and the secondary group division includes regions C and D. Herein, the group of group type 0 may transmit only the mobile services of the first mobile mode. Therefore, a CMM primary parade is assigned and transmitted to the primary group division of the group belonging to group type 0, and a CMM secondary parade is assigned and transmitted to the secondary group division.

A group of group type 1 has both the primary group division and the secondary group division. At this point, the primary group division includes regions A, B, C, and D, and the second group division includes region E. The group of group type 1 transmits mobile services of the first mobile mode to the primary group division and transmits mobile services of the second mobile mode to the secondary group division. Accordingly, a CMM primary parade is assigned and transmitted to the primary group division of the group of group type 1, and an EMM secondary parade is assigned and transmitted to the secondary group division.

A group of group type 2 has both the primary group division and the secondary group division. At this point, the primary group division includes regions A and B, and the second group division includes regions C, D, and E. The group of group type 2 transmits mobile services of the first mobile mode to the primary group division and transmits mobile services of the second mobile mode to the secondary group division. Accordingly, a CMM primary parade is assigned and transmitted to the primary group division of the group of group type 2, and an EMM secondary parade is assigned and transmitted to the secondary group division.

In the group of group type 1 or group type 1, the EMM secondary parade may correspond to the EMM Class 1 secondary parade, or the EMM secondary parade may correspond to the EMM Class 2 secondary parade.

A group of group type 3 only has a primary group division. And, in this case, the primary group division includes regions A, B, C, D, and E. The group of group type 3 may transmit only mobile services of the second mobile mode. Therefore, the EMM primary parade is assigned and transmitted to the group of group type 3, which only has the primary group division.

The EMM secondary parade may have an NOGD value different from that of its paired CMM primary parade. And, in this case, the EMM secondary parade is referred to as the EMM Class 2 secondary parade. When a plurality of primary group divisions is collected (or gathered) and included in a CMM primary parade, secondary group divisions of the same group may be collected (or gathered) and included in one EMM Class 1 secondary parade and may also be included in a plurality of EMM Class 2 secondary parades. Herein, in the example given according to the embodiment of the present invention, the number of EMM Class 2 secondary parades being paired with one CMM primary parade is limited to two EMM Class 2 secondary parades.

At this point, the sum of the NOGD values of two EMM Class 2 secondary parades is equal to the NOGD value of the paired CMM primary parade and also equal to the NOG value of the parades having the same parade identifier (parade ID).

Figure 38:
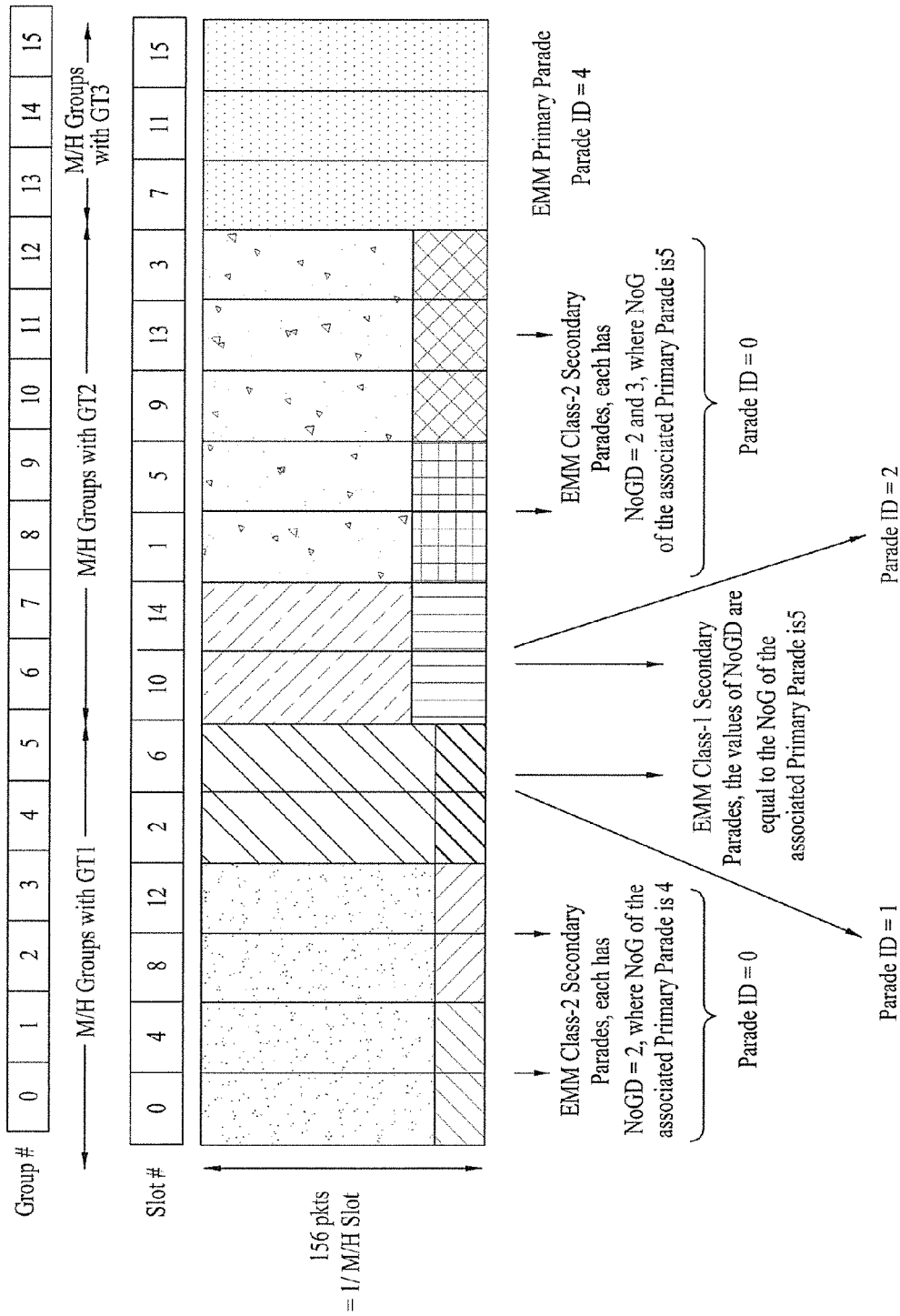
FIG. 38 illustrates an EMM Class 1 secondary parade and an EMM Class 2 secondary parade according to an embodiment of the present invention.

FIG. 38 illustrates an EMM Class 1 secondary parade and an EMM Class 2 secondary parade according to an embodiment of the present invention.

Referring to FIG. 38, each group and each parade are illustrates in accordance with the order of assigned to the respective slot.

As shown in FIG. 38, one primary parade may have one EMM secondary parade, two EMM secondary parades, or no EMM secondary parade depending upon the structure of the corresponding parade or the group type of the corresponding group.

The EMM secondary parade exists only in a group belonging to group type 1 or group type 2. The group of group type 0 includes only the CMM parade, and the group of group type 3 includes only the EMM primary parade.

When the EMM secondary parade has the same NOGD value as that of its paired CMM primary parade, the EMM secondary parade corresponds to an EMM Class 1 secondary parade. Referring to FIG. 38, since the EMM secondary parade of Slot #2 and Slot #6 has the same NOGD value of 2 as that of its paired CMM primary parade, the corresponding EMM secondary parade is referred to as the EMM Class 1 secondary parade. At this point, since the group type is group type 1, the EMM Class 1 secondary parade includes region E. Furthermore, since the EMM secondary parade of Slot #10 and Slot #14 also has the same NOGD value of 2 as that of its paired CMM primary parade, the corresponding EMM secondary parade is also referred to as the EMM Class 1 secondary parade. At this point, since the group type is group type 2, the EMM Class 1 secondary parade includes regions C, D, and E.

When the EMM secondary parade has a different NOGD value from that of its paired CMM primary parade, the corresponding EMM secondary parade is referred to as an EMM Class 2 secondary parade. Referring to FIG. 38, unlike the paired CMM primary parade, the EMM secondary parades of Slot #0, Slot #4, Slot #8, and Slot #12 are divided into two EMM secondary parades each having the NOGD value of 2. And, each of the corresponding EMM secondary parades is referred to as an EMM Class 2 secondary parade. The sum of the NOGD values of the EMM secondary parades is equal to 4, and this value is identical to the NOGD value of the CMM primary parade. At this point, since the group type is group type 1, the EMM Class 2 secondary parade includes region E. Furthermore, unlike the paired CMM primary parade, the EMM secondary parades of Slot #1, Slot #5, Slot #9, Slot #13, and Slot #3 are divided into two EMM secondary parades respectively having the NOGD value of 2 and the NOGD value of 3. And, each of the corresponding EMM secondary parades is referred to as an EMM Class 2 secondary parade. The sum of the NOGD values of the EMM secondary parades is equal to 5, and this value is identical to the NOGD value of the CMM primary parade. At this point, since the group type is group type 2, the EMM Class 2 secondary parade includes regions C, D, and E.

As shown in FIG. 38, the data groups may be assigned to each slot in accordance with the above-described Equation 1. At this point, groups respective to parades having one parade identifier may be assigned to one sub-frame, or groups respective to parades having a plurality of parade identifiers may be assigned to one sub-frame.

A CMM primary parade having Parade ID #0 and two EMM Class 2 secondary parades respectively have group numbers 0 to 3 (i.e., group #0 to group #3) and are assigned to Slot #0, Slot #4, Slot #8, and Slot #12 in accordance with Equation 1.

A CMM primary parade having Parade ID #1 and an EMM Class 1 secondary parade respectively have group numbers 4 and 5 (i.e., group #4 and group #5) and are assigned to Slot #2 and Slot #6 in accordance with Equation 1.

A CMM primary parade having Parade ID #2 and an EMM Class 1 secondary parade respectively have group numbers 6 and 7 (i.e., group #6 and group #7) and are assigned to Slot #10 and Slot #14 in accordance with Equation 1.

A CMM primary parade having Parade ID #3 and two EMM Class 2 secondary parades respectively have group numbers 8 to 12 (i.e., group #8 to group #12) and are assigned to Slot #1, Slot #5, Slot #9, Slot #13, and Slot #3 in accordance with Equation 1.

An EMM primary parade having Parade ID #4 has group numbers 13 to 15 (i.e., group #13 to group #15) and is assigned to Slot #7, Slot #11, and Slot #15 in accordance with Equation 1.

Although group numbers are given in accordance with the order of the parade identifiers and in accordance with the order of the group types, and although the slots are assigned in accordance with such given group numbers, this is merely exemplary, and, therefore, the group numbers may also be separately assigned without referring to the order of the parade identifiers or the group type of the groups. Nevertheless, parades having the same parade identifier should be assigned with consecutive group numbers, and each of the EMM Class 2 secondary parades should be assigned with consecutive group numbers. For example, in case of the parade having the parade identifier Parade ID #3, as shown in FIG. 38, should be assigned with consecutive group numbers from #8 to #12. And, each of the EMM Class 2 secondary parades should be respectively assigned with consecutive group numbers #8 and #9 and consecutive group number #10 to #12.

When parades having the same parade identifiers include the EMM Class 2 secondary parades, the EMM Class 2 secondary parade having the smaller group number is referred to as the first (1st) EMM Class 2 secondary parade, and the EMM Class 2 secondary parade having the greater group number is referred to as the second (2nd) EMM Class 2 secondary parade.

One RS frame payload is RS-CRC encoded so as to become an RS frame. Also, one RS frame is transmitted through one parade or two parades within a single M/H frame.

The CMM primary RS frame payload (ensemble) is RS-CRC encoded to a CMM primary RS frame, thereby being transmitted through a CMM primary parade. Similarly, the CMM secondary RS frame payload (ensemble) is RS-CRC encoded to a CMM secondary RS frame, thereby being transmitted through a CMM secondary parade.

The EMM primary RS frame payload (ensemble) is RS-CRC encoded to an EMM primary RS frame, thereby being transmitted through an EMM primary parade. Similarly, the EMM Class 1 secondary RS frame payload (ensemble) is RS-CRC encoded to an EMM Class 1 secondary RS frame, thereby being transmitted through an EMM Class 1 secondary parade. And, the EMM Class 2 secondary RS frame payload (ensemble) is RS-CRC encoded to an EMM Class 2 secondary RS frame, thereby being transmitted through an EMM Class 2 secondary parade.

The super RS frame payload (ensemble) is RS-CRC encoded to a super RS frame, thereby being transmitted through two random parades. At this point, since the super RS frame payload (ensemble) cannot be received by a receiver of the first mobile mode, the super RS frame payload (ensemble) is transmitted through two EMM parades.

The super RS frame payload (ensemble) may be transmitted through an EMM primary parade and another EMM primary parade. Also, super RS frame payload (ensemble) may be transmitted through an EMM primary parade and an EMM Class 1 secondary parade or an EMM Class 2 secondary parade. Alternatively, the super RS frame payload (ensemble) may be transmitted through an EMM Class 1 secondary parade and another EMM Class 1 secondary parade, and the super RS frame payload (ensemble) may also be transmitted through an EMM Class 1 secondary parade and an EMM Class 2 secondary parade. Furthermore, the super RS frame payload (ensemble) may be transmitted through an EMM Class 2 secondary parade and another EMM Class 2 secondary parade.

At this point, the two parades through which the super ensemble is transmitted, each has a different parade identifier.

Figure 39:
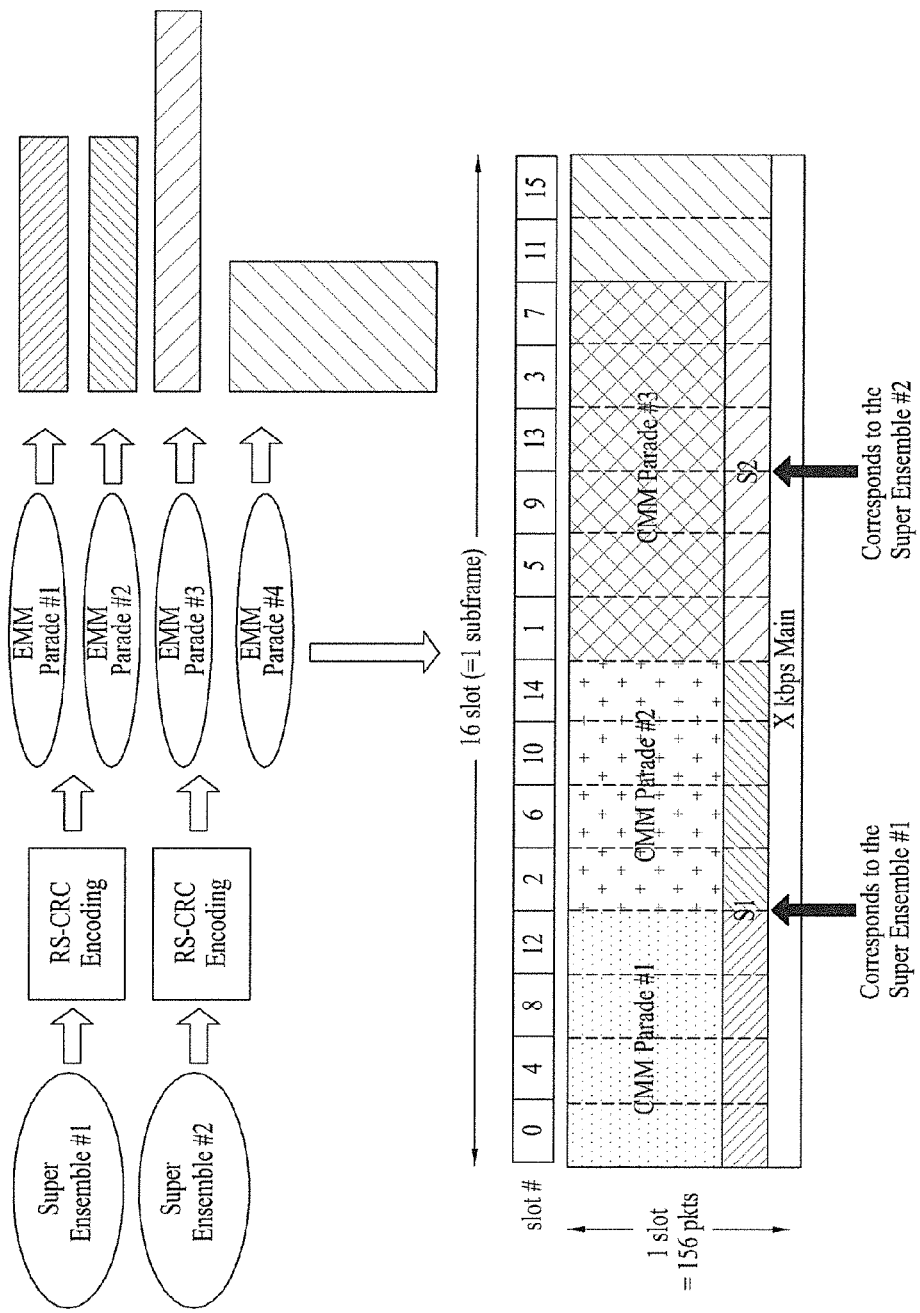
FIG. 39 illustrates the relation between a super ensemble, a super RS frame, and a parade according to an embodiment of the present invention.

FIG. 39 illustrates the relation between a super ensemble, a super RS frame, and a parade according to an embodiment of the present invention.

Super ensemble #1 is RS-CRC encoded so as to form Super RS frame #1. Herein, super RS frame #1 is transmitted through Parade #1 and Parade #2. Also, Super ensemble #2 is RS-CRC encoded so as to form Super RS frame #2. Herein, super RS frame #2 is transmitted through Parade #3 and Parade #4. One super ensemble and super RS frame may be transmitted to parades of the same type, such as Parade #1 and Parade #2. Also, the super ensemble and super RS frame may be transmitted to parades belonging to different parade types, such as Parade #3 and Parade #4.

Figure 40:
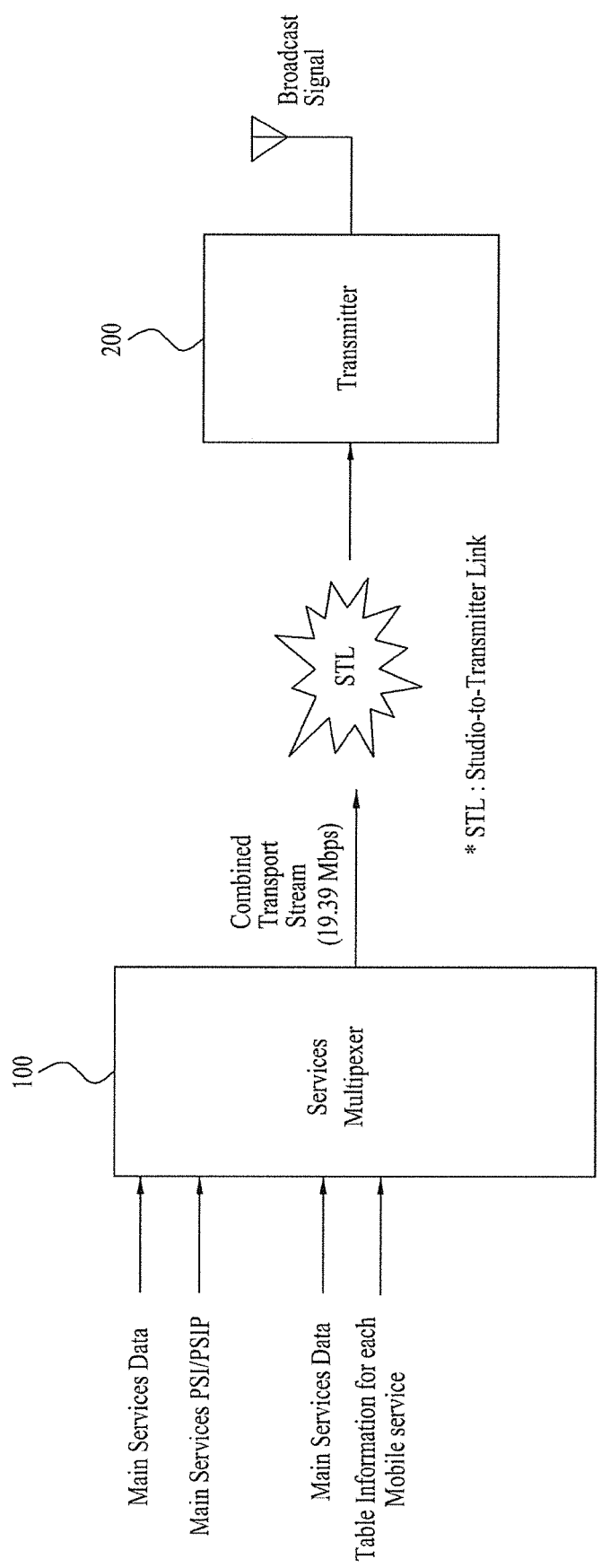
FIG. 40 illustrates a block diagram showing a general structure of a digital broadcast transmitting system according to an embodiment of the present invention.

FIG. 40 illustrates a block diagram showing a general structure of a digital broadcast transmitting system according to an embodiment of the present invention.

Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. This corresponds to data transmission using Single Frequency Network (SFN). Accordingly, in the receiving system, a channel equalizer may compensate signal distortion, which is caused by a reflected wave, so as to recover the original signal. In another example, the plurality of transmitters may have different frequencies with respect to the same channel. This corresponds to data transmission using Multi Frequency Network (MFN).

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of main service data and table information (e.g., PSI/PSIP table data) for each main service and encapsulates the received data into a transport stream (TS) packet.

Also, according to an embodiment of the present invention, the service multiplexer 100 receives at least one type of mobile service data and table information (e.g., PSI/PSIP table data) for each mobile service and encapsulates the received data into a transport stream (TS) packet.

The mobile service data being inputted to the service multiplexer 100 may correspond to mobile service data of the first mobile mode or may correspond to mobile service data of the second mobile mode. Also, the TS packet of the mobile service data of the first mobile mode will be referred to as a mobile service data packet of the first mobile mode, and the TS packet of the mobile service data of the second mobile mode will be referred to as a mobile service data packet of the second mobile mode.

The service multiplexer 100 multiplexes the encapsulated TS packets in accordance with a predetermined multiplexing rule, thereby outputting the multiplexed TS packets to the transmitter 200.

Figure 41:
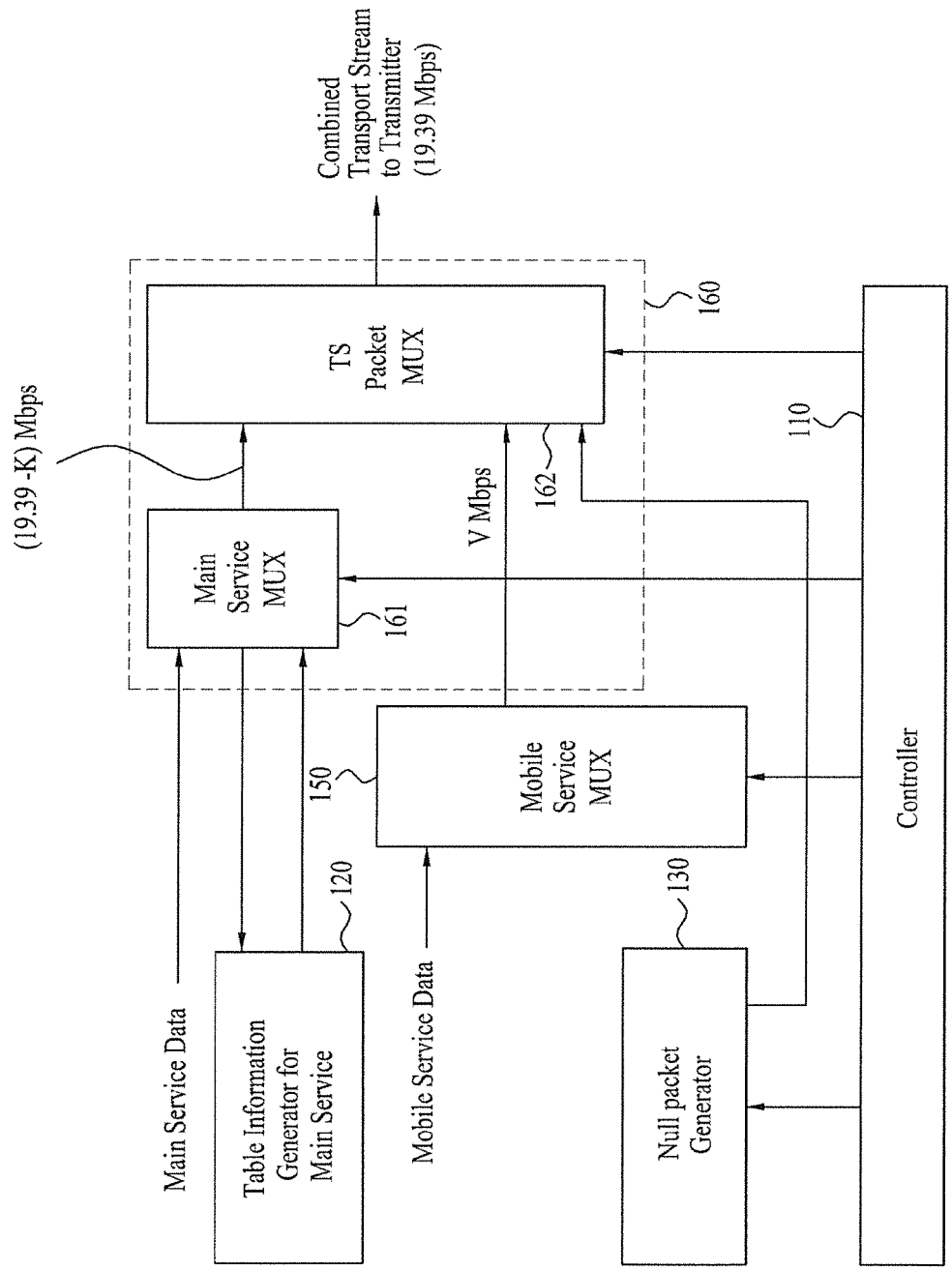
FIG. 41 illustrates a block diagram showing an example of the service multiplexer.

FIG. 41 illustrates a block diagram showing an example of the service multiplexer.

The service multiplexer includes a controller 110 for controlling the overall operations of the service multiplexer, a table information generator 120 for the main service, a null packet generator 130, a mobile service multiplexer 150, and a transport multiplexer 160.

The transport multiplexer 160 may include a main service multiplexer 161 and a transport stream (TS) packet multiplexer 162.

Referring to FIG. 41, at least one type of compression-encoded main service data and table data generated from the table information generator 120 for the main services are inputted to the main service multiplexer 161 of the transport multiplexer 160. According to the embodiment of the present invention, the table information generator 120 generates PSI/PSIP table data, which is configured in the form of an MPEG-2 private section.

The main service multiplexer 161 respectively encapsulates each of the main service data and the PSI/PSIP table data, which are being inputted, to MPEG-2 TS packet formats, thereby multiplexing the encapsulated TS packets and outputting the multiplexed packets to the TS packet multiplexer 162. Herein, the data packet being outputted from the main service multiplexer 161 will hereinafter be referred to as a main service data packet for simplicity.

The mobile service multiplexer 150 receives and respectively encapsulates at least one type of compression-encoded mobile service data and the table information (e.g., PSI/PSIP table data) for mobile services to MPEG-2 TS packet formats. Then, the mobile service multiplexer 150 multiplexes the encapsulated TS packets, thereby outputting the multiplexed packets to the TS packet multiplexer 162. Hereinafter, the data packet being outputted from the mobile service multiplexer 150 will be referred to as a mobile service data packet for simplicity.

At this point, the mobile service data being inputted to the mobile service multiplexer 150 may correspond to mobile service data of the first mobile mode or may correspond to mobile service data of the second mobile mode. Also, the mobile service data of the first mobile mode and the mobile service data of the second mobile mode may both be simultaneously inputted to the mobile service multiplexer 150. Also, a TS packet of mobile service data of the first mobile mode is referred to as a mobile service data packet of the first mobile mode, and a TS packet of mobile service data of the second mobile mode is referred to as a mobile service data packet of the first mobile mode, for simplicity.

At this point, in order to have the transmitter 200 identify and process the main service data packet, the mobile service data of the first mobile mode, and the mobile service data packet of the second mobile mode, identification information is required. A value pre-decided based upon an agreement between the transmitting system and the receiving system may be used as the identification information, or the identification information may include separate data, or a value of a predetermined position within the corresponding data packet may be modified and used as the identification information.

According to an embodiment of the present invention, different packet identifiers (PIDs) may be assigned to each of the main service data packet, the mobile service data packet of the first mobile mode, and the mobile service data packet of the second mobile mode, so as to identify the main service data packet, the mobile service data packet of the first mobile mode, and the mobile service data packet of the second mobile mode. More specifically, by assigning a PID that is not used for a main service (or a null PID) to a mobile service, the transmitter 200 may refer to the PID of the data packet that is being inputted, thereby being capable of identifying the main service data packet, the mobile service data packet of the first mobile mode, and the mobile service data packet of the second mobile mode.

The TS packet multiplexer 162 of the transport multiplexer 160 multiplexes the main service data packet being outputted from the main service multiplexer 161 with the mobile service data packet of the first mobile mode and/or the second mobile mode being outputted from the mobile service multiplexer 150. Then, the TS packet multiplexer 162 transmits the multiplexed data packets to the transmitter 200. If there are no main service data being outputted from the main service multiplexer 161, only the mobile service data packets being outputted from the mobile service multiplexer 150 are transmitted to the transmitter 200.

At this point, the output data rate of the TS packet multiplexer 162 included in the transport multiplexer 160 does not reach 19.39 Mbps. This is because, in case of the mobile service data, additional encoding is performed on the mobile service data by a pre-processor of the transmitter 200, thereby increasing the data size.

For example, since the pre-processor of the transmitter performs an encoding process on the mobile service data at a coding rate of ½ or lower, the amount (or size) of the data being outputted from the pre-processor becomes two times larger than the inputted data or more. Therefore, the sum of the data rate of the main service data being multiplexed by the service multiplexer 100 and the data rate of the mobile service data is always equal to or less than 19.39 Mbps.

The service multiplexer 100 according to the embodiment of the present invention may perform diverse exemplary embodiments in order to match the final output data rate of the TS Packet multiplexer 162 to 19.39 Mbps.

For example, a null packet generator 130 generates a null data packet and outputs the generated null data packet to the TS packet multiplexer 162. And, the TS Packet multiplexer 162 multiplexes the null data packet, the mobile service data packet, and the main service data packet, so as to match the output data rate to 19.39 Mbps. If there is no main service data packet being outputted from the main service multiplexer 161, the TS Packet multiplexer 162 multiplexes the null data packet with the mobile service data packet, so as to match the output data rate to 19.39 Mbps.

At this point, the null data packet is transmitted to the transmitter 200, thereby being discarded. More specifically, the null data packet is not transmitted to the receiving system.

In order to do so, identification information for identifying the null data is also required. Herein, the identification information for identifying the null data may also use a value pre-decided based upon an agreement between the transmitting system and the receiving system and may also be configured of a separate set of data. And, the identification information for identifying the null data may also change a predetermined position value within the null data packet and use the changed value. For example, the null packet generator 130 may modify (or change) a synchronization byte value within the header of the null data packet, thereby using the changed value as the identification information. Alternatively, the transport_error_indicator flag may be set to '1', thereby being used as the identification information. According to the embodiment of the present invention, the transport_error_indicator flag within the header of the null data packet is used as the identification information for identifying the null data packet. In this case, the transport_error_indicator flag of the null data packet is set to '1', and the transport_error_indicator flag for each of the other remaining data packets is reset to '0', so that the null data packet can be identified (or distinguished).

More specifically, when the null packet generator 130 generated a null data packet, and if, among the fields included in the header of the null data packet, the transport_error_indicator flag is set to '1' and then transmitted, the transmitter 200 may identify and discard the null data packet corresponding to the transport_error_indicator flag.

Herein, any value that can identify the null data packet may be used as the identification information for identifying the null data packet. Therefore, the present invention will not be limited only to the example proposed in the description of the present invention.

Meanwhile, signaling data, such as transmission parameters, are required for enabling the transmitter 200 to process the mobile service data.

According to an embodiment of the present invention, the transmission parameter is inserted in the payload region of the OM packet, thereby being transmitted to the transmitter.

At this point, in order to enable the transmitter 200 to identify the insertion of the transmission parameter in the OM packet, identification information that can identify the insertion of the transmission parameter in the type field of the corresponding OM packet (i.e., OM_type field).

More specifically, an operations and maintenance packet (OMP) is defined for the purpose of operating and managing the transmitting system. For example, the OMP is configured in an MPEG-2 TS packet format, and the value of its respective PID is equal to '0x1FFA'. The OMP consists of a 4-byte header and a 184-byte payload. Among the 184 bytes, the first byte corresponds to the OM_type field indicating the type of the corresponding OM packet (OMP). And, the remaining 183 bytes correspond to an OM_payload field, wherein actual data are inserted.

According to the present invention, among the reserved field values of the OM_type field, a pre-arranged value is used, thereby being capable of indicating that a transmission parameter has been inserted in the corresponding OM packet. Thereafter, the transmitter 200 may locate (or identify) the corresponding OMP by referring to the respective PID. Subsequently, by parsing the OM_type field within the OMP, the transmitter 200 may be able to know (or recognize) whether or not a transmission parameter has been inserted in the corresponding OM packet.

The transmission parameters that can be transmitted to the OM packet include M/H frame information (e.g., M/H frame_index), FIC information (e.g., next_FIC_version_number), parade information (e.g., number_of_parades, parade_id, parade_repetition_cycle, and ensemble_id), group information (e.g., number_of_group and start_group_number), SCCC information (e.g., SCCC_block_mode and SCCC_outer_code_mode), RS frame information (e.g., RS_Frame_mode and RS_frame_continuity_counter), RS encoding information (e.g., RS_code_mode), and so on.

At this point, the OM packet in which the transmission parameter is inserted may be periodically generated by a constant cycle, so as to be multiplexed with the mobile service data packet.

The multiplexing rules and the generation of null data packets of the mobile service multiplexer 150, the main service multiplexer 161, and the TS packet multiplexer 160 are controlled by the controller 110.

Figure 42:
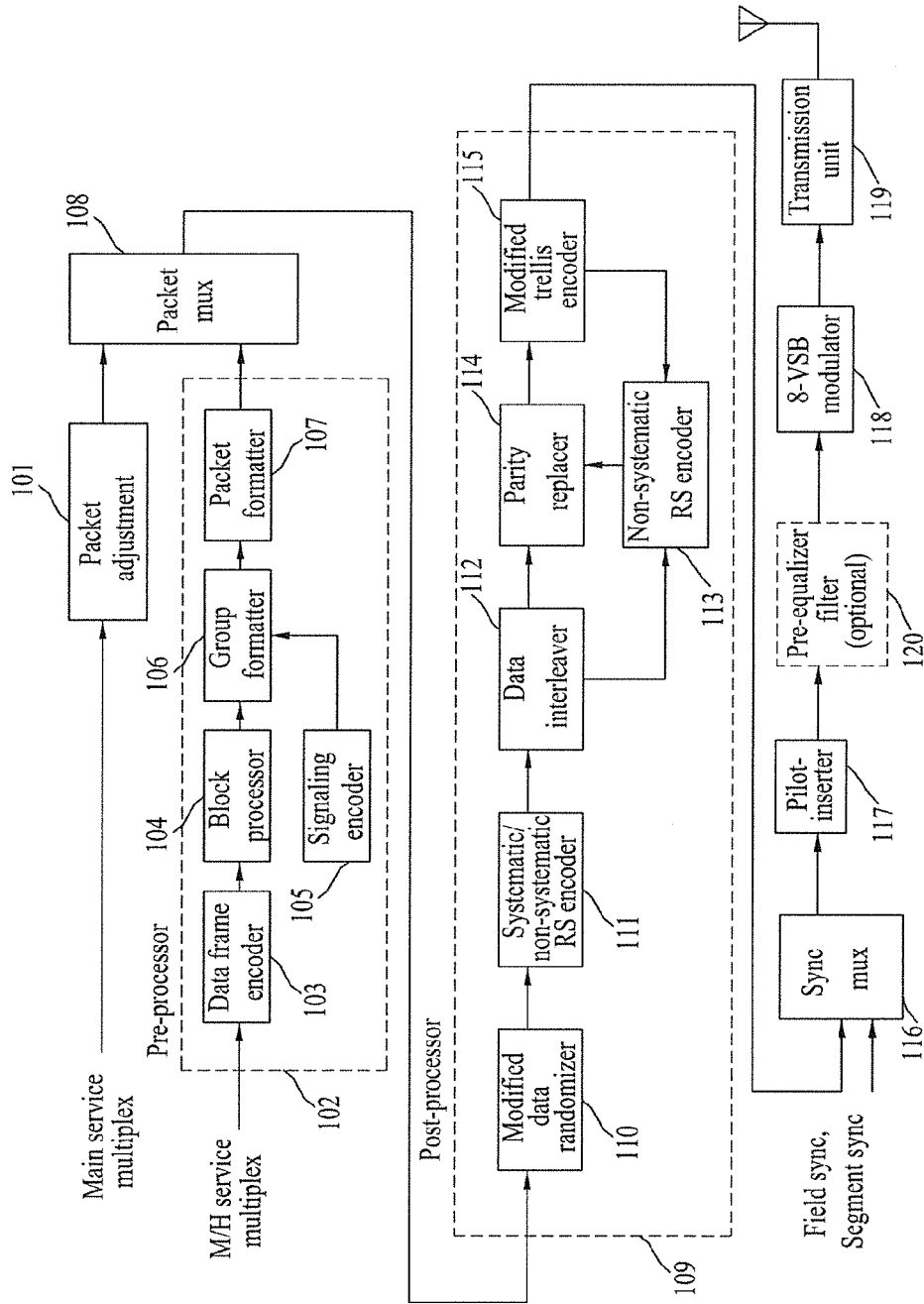
FIG. 42 is a block diagram illustrating a transmission system according to an embodiment of the present invention.

FIG. 42 is a block diagram illustrating a transmission system according to an embodiment of the present invention.

Referring to FIG. 42, the transmission system includes a packet adjustment unit 101, a pre-processor 102, a data frame encoder 103, a block processor 104, a signaling encoder 105, a group formatter 106, a packet formatter 107, a Packet multiplexer (Packet MUX) 108, a post-processor 109, a modified data randomizer 110, a systematic/non-systematic RS encoder 111, a data interleaver 112, a non-systematic RS encoder 113, a parity replacer 114, a modified trellis encoder 115, a synchronization multiplexer (Sync MUX) 116, a pilot inserter 117, a VSB modulator 118, and a Radio Frequency (RF) up-converter 119. In addition, the transmission system of FIG. 1 may further include a pre-equalizer filter 120.

When a mobile service data packet and a main service data packet are multiplexed, there may occur a displacement between a service stream packet including a mobile service stream and another service stream packet including no mobile service stream. In order to compensate for the displacement, the packet adjustment unit 101 may be used.

The pre-processor 102 configures mobile service data in a form of a mobile service structure for transmitting the mobile service data. In addition, the pre-processor 102 performs additional FEC coding of mobile service data. Also, the pre-processor 102 inserts known data. That is, the pre-processor 102 increases the stability of transmission and reception of mobile service data under a mobile environment.

Also, the pre-processor 102 performs an additional encoding process on the mobile service data of the first mobile mode extracted from the mobile service data packet of the first mobile mode and/or on the mobile service data of the second mobile mode extracted from the mobile service data packet of the second mobile mode, and the pre-processor 102 also performs a group forming process enabling data to be positioned in a specific position depending upon the purpose of the data that are to be transmitted to the transmission frame. Such processes are performed to enable the mobile service data to respond more swiftly and with robustness against noise and change in channels.

The pre-processor 102 may include data frame encoder 103, block processor 104, signaling encoder 105, group formatter 106, packet formatter 107, and packet multiplexer (packet MUX) 108. In other words, the above-mentioned constituent components may be contained in the pre-processor 102, and may be configured separately from the pre-processor 102.

The data frame encoder 103 randomizes mobile service data of the first mobile mode or second mobile mode, and performs RS encoding and CRC encoding of the mobile service data to build RS frame.

The mobile service data included in the RS frame may correspond to mobile service data of the first mobile mode, or may correspond to mobile service data of the second mobile mode. Furthermore, the RS frame may include both the mobile service data of the first mobile mode and the mobile service data of the second mobile mode.

Herein, the mobile service data may be broadly divided into two types of mobile modes. One of the mobile modes is referred to as a first mobile mode or a Core Mobile Mode (CMM), and the other mobile mode is referred to as a second mobile mode or a Scalable Full Channel Mobile Mode (SFCMM). Furthermore, the first mobile mode and the second mobile mode may be collectively referred to as the Scalable Full Channel Mobile Mode (SFCMM).

More specifically, SFCMM is a mode in which Mobile DTV services are transmitted while reserving fewer than 38 of the 156 packets in some or all M/H Slots for legacy A/53-compatible services. Also SFCMM can be said as a mode in which the mobile service data are transmitted while reserving greater than 118 packets out of 156 packets in the slot. And CMM is a mode in which Mobile DTV services are transmitted while reserving at least 38 of the 156 packets in each M/H Slot for legacy A/53-compatible services. Also CMM can be said as a mode in which the mobile service data are transmitted while reserving less than or equal to 118 packets out of 156 packets in the slot The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Although the data of the RS frame being outputted include raw (i.e., non-processed) mobile service data, CRC data, stuffing data, and so on, in a broader definition, such data all correspond to data for mobile services. Therefore, the data of each frame will hereinafter be described under the assumption that the data all correspond to mobile service data.

The block processor 104 converts an RS frame portion into an SCCC block. The block processor 104 converts a mobile service data byte contained in the SCCC block into bit-based mobile service data. The block processor 104 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 104 performs interleaving of the convolution-encoded output symbol. The block processor 104 converts an interleaved symbol into byte-based data, and converts an SCCC block into a data block. A detailed description of the data block will hereinafter be described in detail.

The signaling encoder 105 generates signaling information for signaling at a reception end, performs FEC encoding and PCCC encoding of the generated signaling information, and inserts the signaling information into some regions of the data group. For example, examples of the signaling information may be a transmission parameter channel (TPC) data, fast information channel (FIC) data, and the like.

The group formatter 106 forms a data group using the output data of the block processor 104. The group formatter 106 maps FEC-encoded mobile service data to an interleaved form of a data group format. At this time, the above-mentioned mapping is characterized in that FEC-encoded mobile service data is inserted into either a data block of a corresponding group or a group region according to a coding rate of each FEC-encoded mobile service data received from the block processor 104. In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 106 may insert dummy data to generate a data group of a desired format. After inserting various data, the group formatter 106 performs deinterleaving of data of the interleaved data group. After performing the deinterleaving operation, the data group returns to an original group formed before the interleaving operation.

The packet formatter 107 converts output data of the group formatter 106 into a Transport Stream (TS) packet. In this case, the TS packet is a mobile service data packet. In addition, the output of the packet formatter 107 according to an embodiment of the present invention is characterized in that it includes (118+M) mobile service data packets in a single data group. In this case, M is 38 or less.

The packet multiplexer (Packet MUX) 108 multiplexes a packet including mobile service data processed by the pre-processor 102 and a packet including main service data output from the packet adjustment unit 101. In this case, the multiplexed packet may include (118+M) mobile service data packets and L main service data packets. For example, according to an embodiment of the present invention, M is any one of integers from 0 to 38, and the sum of M and L is set to 38. In other words, although the packet multiplexer (packet MUX) 108 may multiplex the mobile service data packet and the main service data packet, in the case where the number of input main service data packets is set to '0' (i.e., L=0), only the mobile service data packet is processed by the packet multiplexer (packet MUX) 108, such that the packet multiplexer (packet MUX) 108 outputs the processed mobile service data packet only.

The post-processor 109 processes mobile service data in such a manner that the mobile service data generated by the present invention can be backward compatible with a conventional broadcast system. In accordance with one embodiment of the present invention, the post-processor 109 may include modified data randomizer 110, systematic/non-systematic RS encoder 111, data interleaver 112, non-systematic RS encoder 113, parity replacer 114 and modified trellis encoder 115. In other words, each of the above-mentioned constituent components may be located outside of the post-processor 109 according to the intention of a designer as necessary.

The modified data randomizer 110 does not perform randomizing of a mobile service TS packet, and bypasses a mobile service TS packet. The modified data randomizer 110 performs randomizing of the main service data TS packet. Therefore, according to one embodiment of the present invention, the randomizing operation is not performed when a data group generated by the pre-processor 102 has no main service data.

In the case where input data is a main service data packet, the systematic/non-systematic RS encoder 111 performs systematic RS encoding of the main service data packet acting as the input data, such that it generates RS FEC data. In the case where input data is a mobile service data packet, the systematic/non-systematic RS encoder 111 performs non-systematic RS encoding, such that it generates RS FEC data. In accordance with one embodiment of the present invention, the systematic/non-systematic RS encoder 111 generates RS FEC data having the size of 20 bytes during the systematic/non-systematic RS encoding process. The RS FEC data generated in the systematic RS encoding process is added to the end of a packet having the size of 187 bytes. RS FEC data generated in the non-systematic RS encoding process is inserted into the position of an RS parity byte predetermined in each mobile service data packet. Therefore, according to one embodiment of the present invention, in the case where the data group generated by the pre-processor has no main service data, the systematic RS encoder 111 for main service data performs no RS encoding. In this case, the non-systematic RS encoder 111 does not generate a non-systematic RS parity for backward compatibility.

The data interleaver 112 performs byte-based interleaving of data that includes main service data and mobile service data.

In the case where it is necessary to initialize the modified trellis encoder 115, the non-systematic RS encoder 113 receives an internal memory value of the modified trellis encoder 115 as an input, and receives mobile service data from the data interleaver 112 as an input, such that it changes initialization data of mobile service data to a memory value. The non-systematic RS encoder 113 performs non-systematic RS encoding of the changed mobile service data, and outputs the generated RS parity to the parity replacer 114.

In the case where it is necessary to initialize the modified trellis encoder 115, the parity replacer 114 receives mobile service data output from the data interlever 112, and replaces an RS parity of the mobile service data with an RS parity generated from the non-systematic RS encoder 113.

In the case where the data group generated in the pre-processor does not include main service data at all, the data group need not have an RS parity for backward compatibility. Accordingly, in accordance with one embodiment of the present invention, the non-systematic RS encoder 113 and the parity replacer 114 do not perform each of the above-mentioned operations, and bypass corresponding data.

The modified trellis encoder 115 performs trellis encoding of output data of the data interleaver 112. In this case, in order to allow data formed after the trellis encoding to have known data pre-engaged between a transmission end and a reception end, a memory contained in the modified trellis encoder 115 should be initialized before the beginning of the trellis encoding. The above-mentioned initialization operation begins by trellis initialization data belonging to a data group.

The synchronization multiplexer (Sync MUX) 116 inserts a field synchronization signal and a segment synchronization signal into output data of the modified trellis encoder 115, and multiplexes the resultant data.

The pilot inserter 117 receives the multiplexed data from the synchronization multiplexer (Sync MUX) 116, and inserts a pilot signal, that is used as a carrier phase synchronization signal for demodulating a channel signal at a reception end, into the multiplexed data.

The VSB modulator 118 performs VSB modulation so as to transmit data.

The transmission unit 119 performs frequency up-conversion of the modulated signal, and transmits the resultant signal.

In the present invention, the transmitting system provides backward compatibility in the main service data so as to be received by the conventional receiving system. Herein, the main service data and the mobile service data are multiplexed to the same physical channel and then transmitted.

Meanwhile, a transmitter of the ICM, i.e., a transmitter including group type 4, is not particularly any different from a transmitter of a mode other than the ICM, i.e., a transmitter supporting group type 0 to group type 3. And, the transmitter of a mode other than the ICM may be extended so as to be capable of supporting the ICM.

A pre-processor of the transmitter for the ICM may also include data frame encoder 103, block processor 104, group formatter 106, signaling encoder 105, and packet formatter 107.

The data frame encoder 103 may be configured identically as the transmitter of a mode other than the ICM.

In the block processor, with respect to a data group of group type 4, one SCCC block may be configured of one data block or may be configured of a plurality of data blocks. Additionally, one SCCC block may also be configured of a combination of one or more data blocks or one or more extended data blocks. The data group of group type 4 does not transmit mobile service data of CMM. Instead, mobile service data of SFCMM are transmitted through all data blocks (B0 to B11) and all extended data blocks (EB0 to EB4).

The group formatter 106 and the signaling encoder 105 may operate identically as the transmitter of a mode other than the ICM.

The packet formatter 107 removes a place holder of a non-systematic RS parity from the output of the group formatter with respect to group type 0 to group type 3. And, the packet formatter 107 may also replace the place holder of the MPEG-2 header with an MPEG-2 header value having a pre-defined PID, among the PIDs that are not being used in the main service data packet. Thereafter, the packet formatter 107 adds a 1-byte MPEG-2 TS sync byte to the very beginning (or front portion) of the 187-byte packet, which is acquired by the above-described process, thereby creating a 188-byte unit mobile service data packet.

However, since the data group of group type 4 does not include a non-systematic RS parity, the removal process of the corresponding place holder may be omitted, and since the data group does not include an MPEG-2 header, the replacement process of the PID may also be omitted. Furthermore, since the corresponding data packet is not configured in an MPEG-2 TS format, the MPEG-2 sync byte is not added. Therefore, the output of the packet formatter for the ICM is equal to 207 bytes.

The packet multiplexer 108 multiplexes the mobile service data packet and the main service data packet. However, since the main service data packet does not exist in the ICM, the mobile service data packet is outputted directly without any modification.

The data randomizer 110 does not perform any randomizing process on the mobile service data. And, since all of the output of the packet multiplexer of the ICM corresponds to the mobile service data, the data randomizer is not required to be operated in the ICM.

Furthermore, since group type 4 does not include any RS parity byte, the RS encoder/non-systematic RS encoder 111 may also be omitted from the transmitter designated only for the ICM. Accordingly, the parity replacer 114 and the non-systematic RS encoder 113 may also be omitted.

The trellis encoding module 115 operates identically as the transmitter of a mode other than the ICM. However, since the parity replacer 114 and the non-systematic RS encoder 113 do not operate herein, no information is given to the parity replacer 114 and the non-systematic RS encoder 113 when performing trellis initialization.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Figure 43:
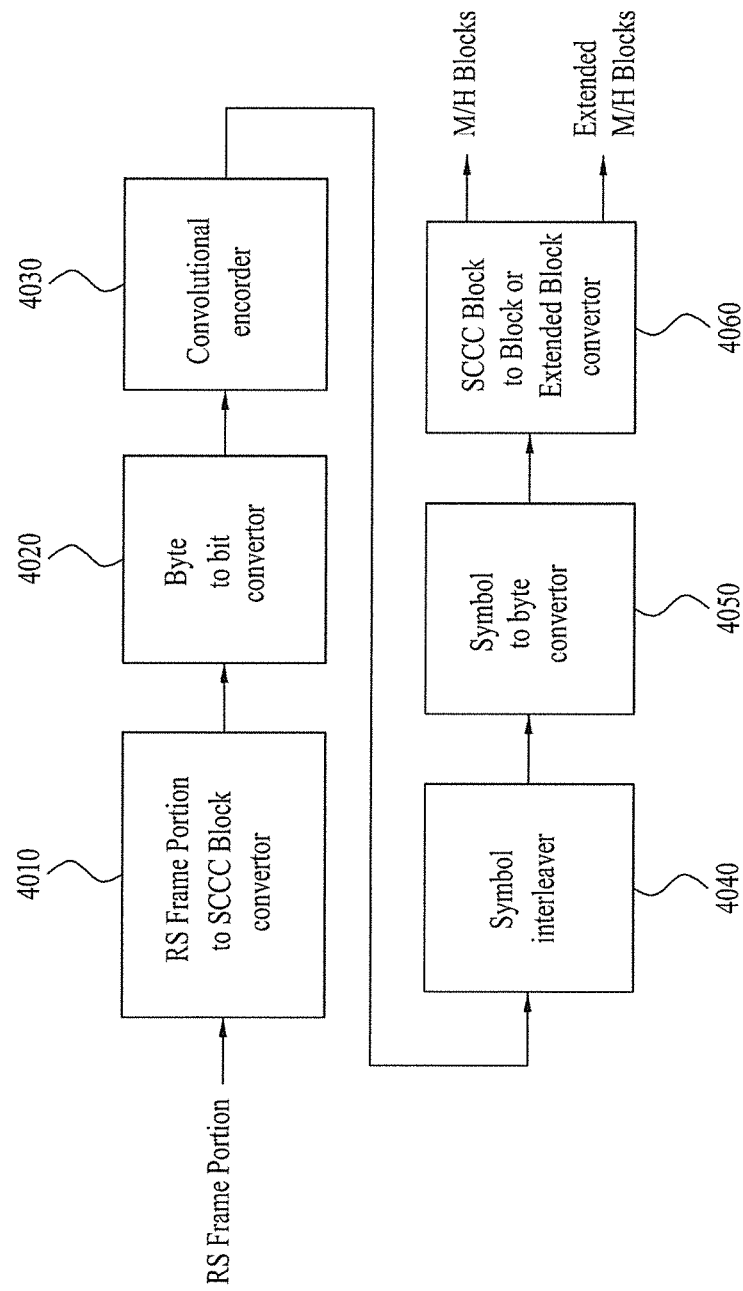
FIG. 43 illustrates diagram showing a detailed structure of a block processor according to an embodiment of the present invention.

FIG. 43 illustrates a diagram showing a detailed structure of a block processor according to an embodiment of the present invention.

The block processor includes an SCCC block converter 4010, a byte to bit converter 4020, a convolutional encoder 4030, a symbol interleaver 4040, a symbol to byte converter 4050, and a data block converter 4060.

The SCCC block converter 4010 divides a primary RS frame portion outputted from the data frame encoder into a plurality of SCCC blocks, or the SCCC block converter 4010 divides both a primary RS frame portion and a secondary RS frame portion outputted from the data frame encoder into a plurality of SCCC blocks. The number of SCCC blocks that are divided from the RS frame portion(s) outputted from the data frame encoder may be known by SCCC_block_mode information, which is included in the TPC.

The byte-to-bit converter 4020 shall convert parallel bytes to serial bits for the purpose of bit-wise operation in the convolutional encode.

The convolutional encoder 4030 performs outer convolutional coding for the SCCC. The coding rate of the convolutional encoder can be one of ½ rate, ⅓ rate and ¼ rate.

The symbol interleaver 4040 scrambles the output symbols from the convolutional encoder. The symbol interleaver is a type of Block interleaver The symbol-to-byte converter converts the interleaved symbols into bytes. The MSB of the output byte shall be the MSB in the first input symbol.

The data block converter 4060 maps the SCCC blocks to data blocks or data blocks and extended data blocks.

More specifically, the block processor forms (or configures) an SCCC block after receiving portions of the RS frame from the DATA frame encoder. Thereafter, the block processor outputs the SCCC block in a data block format. At this point, an extended data block is also included in the outputted data block.

An SCCC block respective to a group of group type 0 may include one data block or may include a plurality of data blocks. The group of group type 0 transmits only mobile service data of the first mobile mode and does not include any extended DATA blocks. Table 1 below shows exemplary inclusions of an SCCC block respective to the group of group type 0. In table 1 shown below, the SCCC block mode indicates a relation between a DATA block and an SCCC block.

TABLE 1

| | SCCC Block Mode | |
|---|---|---|
| | 00 | 01 |
| SCCC Block | DATA Blocks | DATA Blocks |
| SCB1 | B1 | B1, B6 |
| SCB2 | B2 | B2, B7 |
| SCB3 | B3 | B3, B8 |
| SCB4 | B4 | B4, B9 |
| SCB5 | B5 | B5, B10 |
| SCB6 | B6 | |
| SCB7 | B7 | |
| SCB8 | B8 | |

TABLE 1-continued

| | SCCC Block Mode | |
|---|---|---|
| SCCC Block | 00<br>DATA Blocks | 01<br>DATA Blocks |
| SCB9 | B9 | |
| SCB10 | B10 | |

When 1/H-rate encoding is performed on a group of group type 0 in units of one DATA block, data blocks (B1 to B10) and SCCC blocks (SCB1 to SCB10) are identical to one another (i.e., SCB1=B1, SCB2=B2, SCB3=B 3, SCB4=B4, SCB5=B5, SCB6=B6, SCB7=B7, SCB8=B8, SCB9=B9, SCB10=B10). For example, DATA block B1 may be encoded at a coding rate of ½ (or ½-rate encoded), DATA block B2 may be encoded at a coding rate of ¼ (or ¼-rate encoded), and DATA block B3 may be encoded at a coding rate of ½ (or ½-rate encoded). The coding process is performed similarly on the remaining DATA blocks. At this point, since DATA block 0 (B0) and DATA block 11 (B11) do not include any mobile service data, DATA block 0 (B0) and DATA block 11 (B11) may be excluded from the SCCC block. The above-described example corresponds to an example of the SCCC block mode 00 shown in Table 1.

Alternatively, a plurality of DATA blocks within regions A, B, C, and D may be grouped (or gathered) as a single SCCC block, thereby being processed with 1/H-rate encoding in SCCC block units. Accordingly, the receiving performance (or capability) of regions C/D may be enhanced. For example, DATA blocks may be grouped by 2, so as to be included in one SCCC block. For example, DATA block B1 and DATA block B6 may be grouped so as to be included in one SCCC block (SCB1). Similarly, DATA block B2 and DATA block B7 may be grouped so as to be included in another SCCC block (SCB2). DATA block B3 and DATA block B8 may be grouped so as to be included in yet another SCCC block (SCB3), and DATA block B4 and DATA block B9 may be grouped so as to be included in another SCCC block (SCB4). And, DATA block B5 and DATA block B10 may be grouped so as to be included in another SCCC block (SCB5). The above-described cases correspond to an example wherein 10 DATA blocks are included in 5 SCCC blocks. More specifically, the above-described example corresponds to an example of the SCCC block mode 01 shown in Table 1.

In another example, DATA block B1 to DATA block B5 are grouped to a single SCCC block, which is then ½-rate encoded. Accordingly, the ½-rate encoded mobile service data, as described above, may be inserted in DATA block B1 to DATA block B5 of the corresponding group.

Also, DATA block B6 to DATA block B10 are grouped to another single SCCC block, which is then ¼-rate encoded. Accordingly, the ¼-rate encoded mobile service data, as described above, may be inserted in DATA block B6 to DATA block B10 of the corresponding group. In this case, one group includes two SCCC blocks.

When one SCCC block includes a plurality of DATA blocks, in a data receiving environment (or condition) undergoing frequent channel changes, the receiving performance of regions C and D, which are relatively deficient as compared to region A, may be supplemented. Also, the number of main service data symbols increases as the region progresses from region A to region D. Such increase in main service data symbols leads to a deterioration in the performance (or capability) of an error correction code. As described above, by having one SCCC block include a plurality of DATA blocks, the deterioration in error correction code performance may be reduced.

An SCCC block respective to a group of group type 1 may include one DATA block or may include a plurality of DATA blocks. Also, an SCCC block respective to a group of group type 1 may include one extended DATA block or may include a plurality of extended DATA blocks. Herein, the group of group type 1 transmits mobile service data of the first mobile mode through DATA blocks (B0 to B11) corresponding to regions A, B, C, and D, and the group of group type 1 transmits mobile service data of the second mobile mode through extended DATA blocks (EB0 to EB4) corresponding to region E. Therefore, the cases wherein one SCCC block respective to a group of group type 1 is configured of a combination of DATA blocks and extended DATA blocks are excluded. At this point, since DATA block 0 (B0) and DATA block 11 (B11) do not include any mobile service data, DATA block 0 (B0) and DATA block 11 (B11) may be excluded from the SCCC block.

Table 2 below shows an exemplary configuration of an SCCC block respective to the group of group type 1. In table 2 shown below, the SCCC block mode indicates a relation between a DATA block and an SCCC block.

TABLE 2

| | SCCC Block Mode | |
|---|---|---|
| SCCC Block | 00<br>(Extended) DATA<br>Blocks | 01<br>(Extended) DATA<br>Blocks |
| SCB1 | B1 | B1, B6 |
| SCB2 | B2 | B2, B7 |
| SCB3 | B3 | B3, B8 |
| SCB4 | B4 | B4, B9 |
| SCB5 | B5 | B5, B10 |
| SCB6 | B6 | EB0~EB4 |
| SCB7 | B7 | |
| SCB8 | B8 | |
| SCB9 | B9 | |
| SCB10 | B10 | |
| SCB11 | EB0~EB4 | |

Referring to Table 2, when the SCCC block mode is '00', one SCCC block may include one DATA block respective to a DATA block transmitting mobile service data of the first mobile mode. This is identical to the case wherein the SCCC block mode is '00' in group type 0. Also, all extended DATA blocks may be gathered so as to be included in one SCCC block respective to extended DATA blocks transmitting mobile service data of the second mobile mode.

When the SCCC block mode is '01', one SCCC block may include two DATA blocks respective to a DATA block transmitting mobile service data of the first mobile mode. This is identical to the case wherein the SCCC block mode is '01' in group type 0. Also, all extended DATA blocks may be gathered so as to be included in one SCCC block respective to extended DATA blocks transmitting mobile service data of the second mobile mode.

One SCCC block respective to a group of group type 2 may include one DATA block or may include a plurality of DATA blocks. Moreover, one SCCC block respective to a group of group type 2 may also include one extended DATA block or may include a plurality of extended DATA blocks. Furthermore, one SCCC block respective to a group of group type 2 may also include a combination of at least one or more DATA blocks and at least one or more extended DATA blocks. The group of group type 2 transmits mobile service data of the first mobile mode through DATA blocks (B3 to B8) corresponding to regions A and B and, also, transmits mobile service data of the second mobile mode through DATA blocks (B0 to B2 and B9 to B11) corresponding to regions C, D, and E and extended DATA blocks (EB0 to EB4). Herein, an SCCC block respective to a group of group type 2 being configured of a combination of DATA blocks corresponding to regions A and B and DATA blocks corresponding to regions C, D, and E or extended DATA blocks, may be excluded.

Table 3 below shows an exemplary configuration of an SCCC block respective to the group of group type 2. In table 3 shown below, the SCCC block mode indicates a relation between a DATA block and an SCCC block.

TABLE 3

|  | SCCC Block Mode | |
| --- | --- | --- |
| SCCC Block | 00 (Extended) DATA Blocks | 01 (Extended) DATA Blocks |
| SCB1 | B3 | Not allowed |
| SCB2 | B4 | |
| SCB3 | B5 | |
| SCB4 | B6 | |
| SCB5 | B7 | |
| SCB6 | B8 | |
| SCB7 | B0~B2, B9, EB0, EB1 | |
| SCB8 | B10~B11, EB2~EB4 | |

Referring to Table 3, when the SCCC block mode is '00', with respect to DATA blocks (B3 to B8) of regions A and B transmitting the mobile service data of the first mobile mode, one SCCC block includes one DATA block. This is identical to the case wherein the SCCC block mode is '00' in group type 0 and in group type 1. Also, with respect to DATA blocks (B0 to B2 and B9 to B11) and extended DATA blocks (EB0 to EB4) transmitting mobile service data of the second mobile mode, one SCCC block includes a combination of multiple DATA blocks and multiple extended DATA blocks.

In the above described example, according to the present invention, in case of the DATA blocks and extended DATA blocks transmitting mobile service data of the second mobile mode, a DATA block and an extended DATA block sharing the same segments and positioned in the same segments belong to the same SCCC block. More specifically, B9 and EB1 are positioned in the same 16 segments and are included in the same SCCC block. Also, B10 and EB2 are positioned in the same 16 segments, and the 5 segments of B11 are positioned in the same segments as the first 5 segments of EB3, and such DATA block and extended DATA block are included in the same SCCC block.

According to another embodiment of the present invention, when the SCCC block mode is '00', one extended DATA block and one DATA block may be included in one SCCC block. At this point, in case the number of extended DATA blocks is smaller than the number of DATA blocks, SCCC blocks configured only of DATA blocks may also be included in the present invention.

The case wherein the SCCC block mode is '01' is not defined in the above-described example.

An SCCC block respective to a group of group type 3 may include only one DATA block or may include a plurality of DATA blocks. Also, the SCCC block may include only one extended DATA block or a plurality of extended DATA blocks. Furthermore, the SCCC block may also include a combination of at least one or more DATA blocks and at least one or more extended DATA blocks. A group of group type 2 does not transmit mobile service data of the first mobile mode, and, therefore, mobile service data of the second mobile mode are transmitted through all DATA blocks (B0 to B11) and extended DATA blocks (EB0 to EB4).

Table 4 below shows an exemplary configuration of an SCCC block respective to the group of group type 3. In Table 4 shown below, the SCCC block mode indicates a relation between a DATA block and an SCCC block.

TABLE 4

|  | SCCC Block Mode | |
| --- | --- | --- |
| SCCC Block | 00 (Extended) DATA Blocks | 01 (Extended) DATA Blocks |
| SCB1 | Not allowed | B0~B2, B7 |
| SCB2 | | B3, B8, EB0 |
| SCB3 | | B4, B9, EB1 |
| SCB4 | | B5, B10, EB2 |
| SCB5 | | B6, B11, EB3, EB4 |

Referring to Table 4, when the SCCC block mode is '01', one SCCC block includes a combination of multiple DATA blocks and multiple extended DATA blocks.

According to the present invention, in case of the DATA blocks and extended DATA blocks in the above described example, a DATA block and an extended DATA block sharing the same segments and positioned in the same segments belong to the same SCCC block. More specifically, B8 and EB0 are positioned in the same 16 segments and are included in the same SCCC block. And, B9 and EB1 are positioned in the same 16 segments and are included in the same SCCC block. Also, B10 and EB2 are positioned in the same 16 segments and included in the same SCCC block. Furthermore, 5 segments of B11 are positioned in the same segments as the first 5 segments of EB3, and such DATA block and extended DATA block are included in the same SCCC block.

The case wherein the SCCC block mode is '00' is not defined in the above-described example.

In the examples of Table 1 to Table 4, when an SCCC block respective to the DATA block transmitting mobile service data of the first mobile mode includes only one DATA block, the SCCC block mode is defined as '00'. And, when an SCCC block respective to a DATA block transmitting mobile service data of the first mobile mode includes a plurality of DATA blocks, or when the corresponding SCCC block does not include any DATA block transmitting the mobile service data of the first mobile mode, the SCCC block mode is defined as '01'.

Herein, the number of bytes included in each SCCC block may vary depending upon the group type of the corresponding group and also depending upon the coding rate of the corresponding SCCC block.

Also, the DATA blocks and extended DATA blocks included in an SCCC block are not limited only to the above-described examples of the present invention. Therefore, the DATA blocks and extended DATA blocks included in an SCCC block may vary depending upon the intentions and design of the system designer. For example, when the SCCC block mode is '00', DATA block 1 and extended DATA block 3 may be included in SCCC block 1, and DATA block 2 and extended DATA block 4 may be included in SCCC block 2. Each of DATA blocks 3, 4, 5, 6, 7, and 8 may be respectively included in SCCC block 3, 4, 5, 6, 7, and 8. Furthermore, DATA block 9 and extended DATA block 1 may be included in SCCC block 9, and DATA block 10 and extended DATA block 2 may be included in SCCC block 10. Meanwhile, when the SCCC block mode is '01', DATA block 1, DATA block 6, and extended DATA block 3 may be included in SCCC block 1. And, DATA block 2, DATA block 7, and extended DATA block 4 may be included in SCCC block 2. DATA block 3 and DATA block 8 may be included in SCCC block 3, and DATA block 4, DATA block 9, and extended DATA block 1 may be included in SCCC block 4. And, finally, DATA block 5, DATA block 10, and extended DATA block 2 may be included in SCCC block 5.

Data bytes of the SCCC block formed in accordance with the group type are converted to data bits, so as to be inputted to the convolutional encoder.

According to the embodiment of the present invention, the convolutional encoder encodes the mobile service data of the first mobile mode and the mobile service data of the second mobile mode at a coding rate of ½, a coding rate of ¼, or a coding rate of ⅓.

Figure 44:
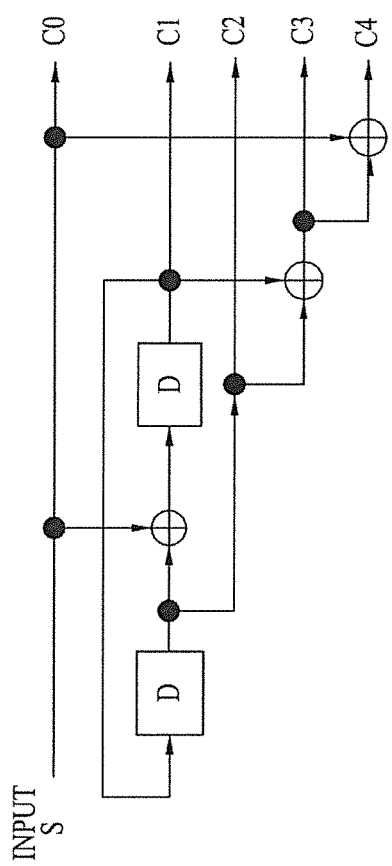
FIG. 44 illustrates a convolutional encoder according to an embodiment of the present invention.

FIG. 44 illustrates a convolutional encoder according to an embodiment of the present invention.

Among the 5 output bits with respect to one input bit, the 1/H-rate encoding process may select and output H number of bits. Also, in case of the ⅓-rate encoding process, the encoding process may be performed by combining the ½-rate encoding process and the ¼-rate encoding process. More specifically, 2 bits are selected and outputted with respect to the first input bit, and 4 bits are selected and outputted with respect to the second input bit. Accordingly, since 6 bits are selected and outputted with respect to a total of 2 input bits, the ⅓-rate encoding process may be realized and performed.

The selected H number of bits configures one symbol using 2-bit units, and the convolutional encoder outputs the symbol configured as described above.

Also, the method of selecting H number of output bits with respect to each coding rate may be varied depending upon the SCCC block mode and group type for each SCCC block or the SCCC block mode and group type for the SCCC block belonging to each group region.

Table 5 shown below shows exemplary realizations of coding rates for each coding rate based upon the SCCC block mode and group type for the SCCC block belonging to each group region. In the embodiment of the present invention shown below, the ⅓-rate encoding process is configured by combining the ½-rate encoding process and the ¼-rate encoding process.

TABLE 5

| Group Type | Group Region | 1/2 Rate | 1/4 Rate SCCC Block mode = '00' | 1/4 Rate SCCC Block mode = '01' | 1/3 Rate SCCC Block mode = '00' | 1/3 Rate SCCC Block mode = '01' |
|---|---|---|---|---|---|---|
| GT0 | A, B | (C0, C1) | (C0, C2), (C1, C4) | (C0, C2), (C1, C4) | Not allowed | Not allowed |
|  | C, D |  | (C0, C1), (C3, C4) |  | Not allowed |  |
| GT1 | A, B |  | (C0, C2), (C1, C4) | (C0, C2), (C1, C4) | Not allowed | Not allowed |
|  | C, D |  | (C0, C1), (C3, C4) |  | Not allowed |  |
|  | E |  | (C0, C1), (C3, C4) | (C0, C1), (C3, C4) | Combination of 1/2 and 1/4 | 1/2, 1/3 or 1/4 |
| GT2 | A, B |  | (C0, C2), (C1, C4) | Not allowed | Not allowed | Not allowed |
|  | C, D, E |  | (C0, C1), (C3, C4) |  | Combination of 1/2 and 1/4 |  |

TABLE 5-continued

| Group Type | Group Region | 1/2 Rate | 1/4 Rate SCCC Block mode = '00' | 1/4 Rate SCCC Block mode = '01' | 1/3 Rate SCCC Block mode = '00' | 1/3 Rate SCCC Block mode = '01' |
|---|---|---|---|---|---|---|
| GT3 | A, B, C, D, E |  | Not allowed | (C0, C2), (C1, C4) | Not allowed | 1/2, 1/3 or 1/4 |
| GT4 | A, B, C, D, E |  | Not allowed | (C0, C2), (C1, C4) | Not allowed | 1/2, 1/3 or 1/4 |

For example, in case of an SCCC block belonging to region A with respect to a group of group type 1, and, more specifically, when the SCCC block mode is '00', and when the SCCC block includes only a portion of the DATA blocks (B3 to B8) belonging to regions C and D, when such an SCCC block is ¼-rate encoded, the convolutional encoder outputs two symbols for the one input bit, wherein the first symbol includes output bits C0 and C2, and wherein the second symbol includes output bits C1 and C4.

In another example, when a SCCC block belonging to regions C, D, and E with respect to the group of group type 2 is encoded at a coding rate of ⅓, the convolutional encoder outputs 3 symbols for 2 consecutive input bits. Herein, the first symbol includes output bits C0 and C1, which are obtained by encoding the first input bit at a coding rate of ½, the second symbol includes output bits C0 and C1, which are obtained by encoding the second input bit at a coding rate of ¼, and the third symbol includes output bits C3 and C4, which are obtained by encoding the second input bit at a coding rate of ¼.

The memory of the convolutional encoder is initialized to '0' at the beginning (or starting point) of each SCCC block.

The output of the convolutional encoder is processed with symbol-interleaving, thereby being outputted to the symbol to byte converter.

The symbol to byte converter gathers four (4) symbols each including 2 bits, so as to form one byte.

The mobile service data byte, which is encoded by being processed with the above-described procedures, is mapped to a respective DATA block or extended DATA block, thereby being outputted to the group formatter, wherein the group formatter is positioned at the end portion of the block processor.

According to yet another embodiment of the present invention, the convolutional encoder may separately perform a ⅓-rate encoding process without combining the ½-rate encoding process and the ¼-rate encoding process.

In this case, for ½-rate coding, the leftmost bit, C0, of each symbol (C0, C1) shall be the MSB for definition of processing order in subsequent stages and shall be passed first to succeeding processing stages. This MSB will eventually become the X2 input to the legacy trellis encoder. The LSB (C1) will eventually become the X1 input to the legacy trellis encoder.

For ⅓ rate coding, 2 input bits shall be encoded into 3 output symbols. The leftmost symbol of a symbol pair shall be output first. Also, similarly to ½-rate coding, the leftmost bit in a symbol shall be the MSB and shall be output before the LSB. For example, a first output symbol is composed of a (C0, C2) bit-pair and a second output symbol is composed of a (C4, C0) bit-pair and a third output symbol is composed of a (C2, C4) bit-pair. The first C0, C2 and C4 are generated from the first input bit; and the second C0, C2 and C4 are generated from the second input bit.

For the case of ¼ rate, two output symbols shall be constructed according to the associated Region. The leftmost symbol of a symbol pair shall be output first. Also, similarly to the ½-rate case, the leftmost bit in a symbol shall be the MSB and shall be output before the LSB. For example, in the ¼ rate mode of Region A (or B), a first output symbol is composed of a (C0, C2) bit-pair, and a second output symbol is composed of a (C1, C4) bit-pair, and the order of bits in the output is C0, C2, C1, C4.

Meanwhile, the relation between the SCCC block and data block of the group type 4 is identical to the relation between the SCCC block and data block of the group type 3. Additionally, the embodiment of the coding rate of the SCCC block belonging to each group region is also identical to the embodiment of group type 3. However, the size of each data block or extended data block may be different from that of group type 3.

The above-described relation between the SCCC block and the DATA block, the method of configuring an SCCC block, the value of the SCCC block mode, the coding rate of the SCCC block, and so on, are merely examples given to describe the embodiment of the present invention. Therefore, the present invention will not be limited only to the example given in the description presented herein.

Figure 45:
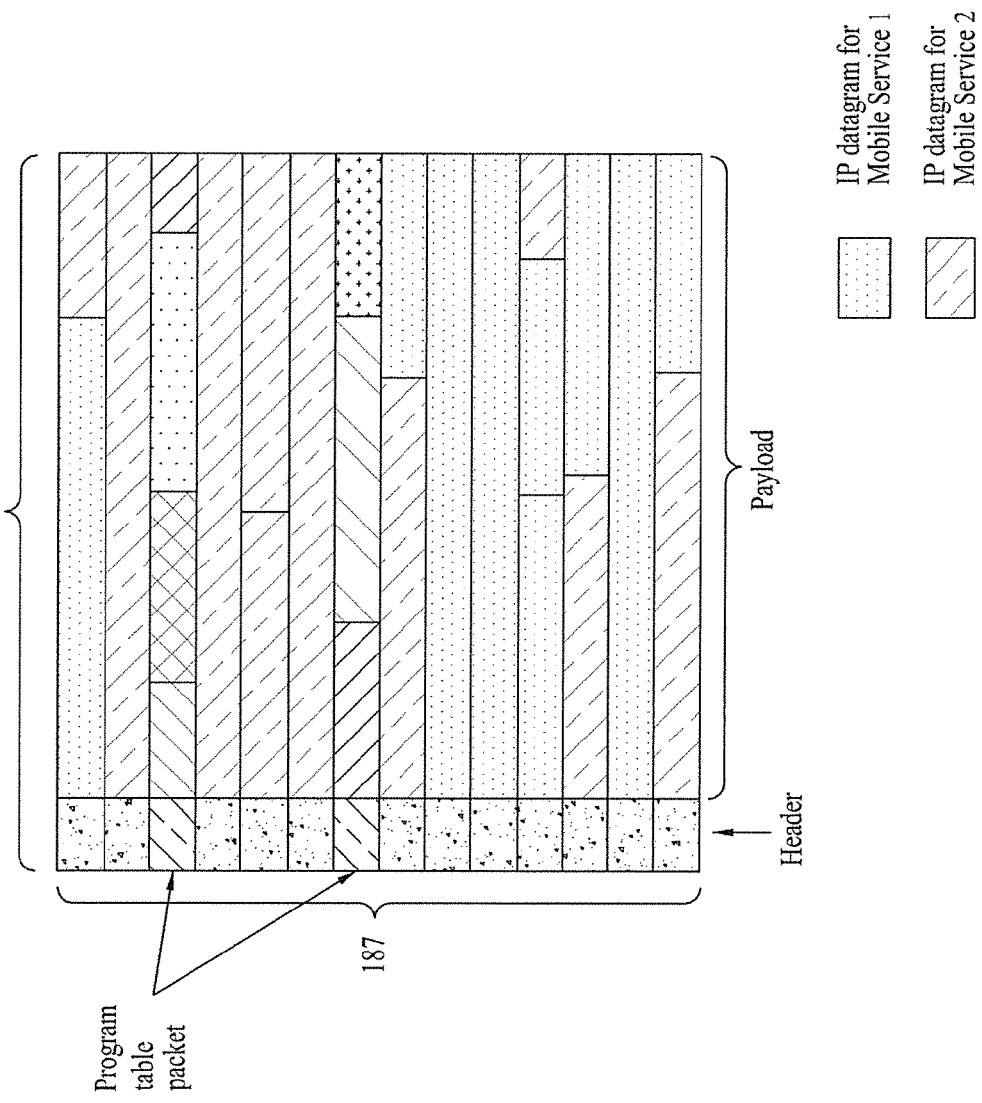
FIG. 45 illustrates a payload of an RS frame being outputted from a data frame encoder according to an embodiment of the present invention.

FIG. 45 illustrates a payload of an RS frame being outputted from a data frame encoder according to an embodiment of the present invention.

Payloads of the RS frame are gathered (or collected) to form an ensemble. Herein, an ensemble corresponds to a collection of services having the same quality of service (QoS).

Data frame encoder 103 includes at least one or more RS frame encoders. Herein, one RS frame encoder receives one RS frame payload and encodes the received RS frame payload, thereby outputting the encoded RS frame payload.

According to the embodiment of the present invention, the RS frame payload has the size of (N×187) bytes, as shown in FIG. 45. Herein, N represents the length of a row (i.e., the number of columns), and 187 indicates the length of a column (i.e., the number of rows).

According to the embodiment of the present invention, each row configured of N bytes will be referred to as a mobile service data packet for simplicity. The mobile service data packet may include a 2-byte header and an (N−2)-byte mobile service payload. Herein, the assignment of 2 bytes to the header region is merely exemplary. Accordingly, the assignment of the data bytes may be varied and modified by the system designer. Therefore, the present invention will not be limited only to the examples given in the description of the present invention.

One RS frame payload is created by gathering (or collecting) table information and/or IP datagrams having the size of (N−2)×187 bytes from one ensemble. Also, one RS frame payload may include table information and IP datagrams corresponding to at least one or more mobile services. For example, IP datagrams and table information for two different types of mobile services, such as news (e.g., IP datagram for mobile service 1) and stock information (e.g., IP datagram for mobile service 2), may be included in one RS frame payload.

More specifically, table information of a section structure or IP datagrams of mobile service data may be assigned to a mobile payload within a mobile service data packet included in the RS frame payload. Alternatively, IP datagrams of table information or IP datagrams of mobile service data may be assigned to a mobile payload within a mobile service data packet included in the RS frame payload.

In case the size of a mobile service data packet does not reach the size of N bytes, even when including a mobile header, stuffing data bytes may be assigned to the remaining payload portion of the corresponding mobile service data packet. For example, after assigning program table information to a mobile service data packet, if the length of the mobile service data packet including the header is (N−20) bytes, stuffing data bytes may be assigned to the remaining 20-byte portion of the corresponding mobile service data packet.

FIG. 46 is a diagram illustrating examples of fields allocated to the header region within the mobile service data packet according to the present invention. Examples of the fields include type_indicator field, error_indicator field, stuff_indicator field, and pointer field.

The type_indicator field can allocate 3 bits, for example, and represents a type of data allocated to payload within the corresponding mobile service data packet. In other words, the type_indicator field indicates whether data of the payload is IP datagram or program table information. At this time, each data type constitutes one logical channel. In the logical channel which transmits the IP datagram, several mobile services are multiplexed and then transmitted. Each mobile service undergoes demultiplexing in the IP layer.

The error_indicator field can allocate 1 bit, for example, and represents whether the corresponding mobile service data packet has an error. For example, if the error_indicator field has a value of 0, it means that there is no error in the corresponding mobile service data packet. If the error_indicator field has a value of 1, it means that there may be an error in the corresponding mobile service data packet.

The stuff_indicator field can allocate 1 bit, for example, and represents whether stuffing byte exists in payload of the corresponding mobile service data packet. For example, if the stuff_indicator field has a value of 0, it means that there is no stuffing byte in the corresponding mobile service data packet. If the stuff_indicator field has a value of 1, it means that stuffing byte exists in the corresponding mobile service data packet.

The pointer field can allocate 11 bits, for example, and represents position information where new data (i.e., new signaling information or new IP datagram) starts in the corresponding mobile service data packet.

Figure 48:
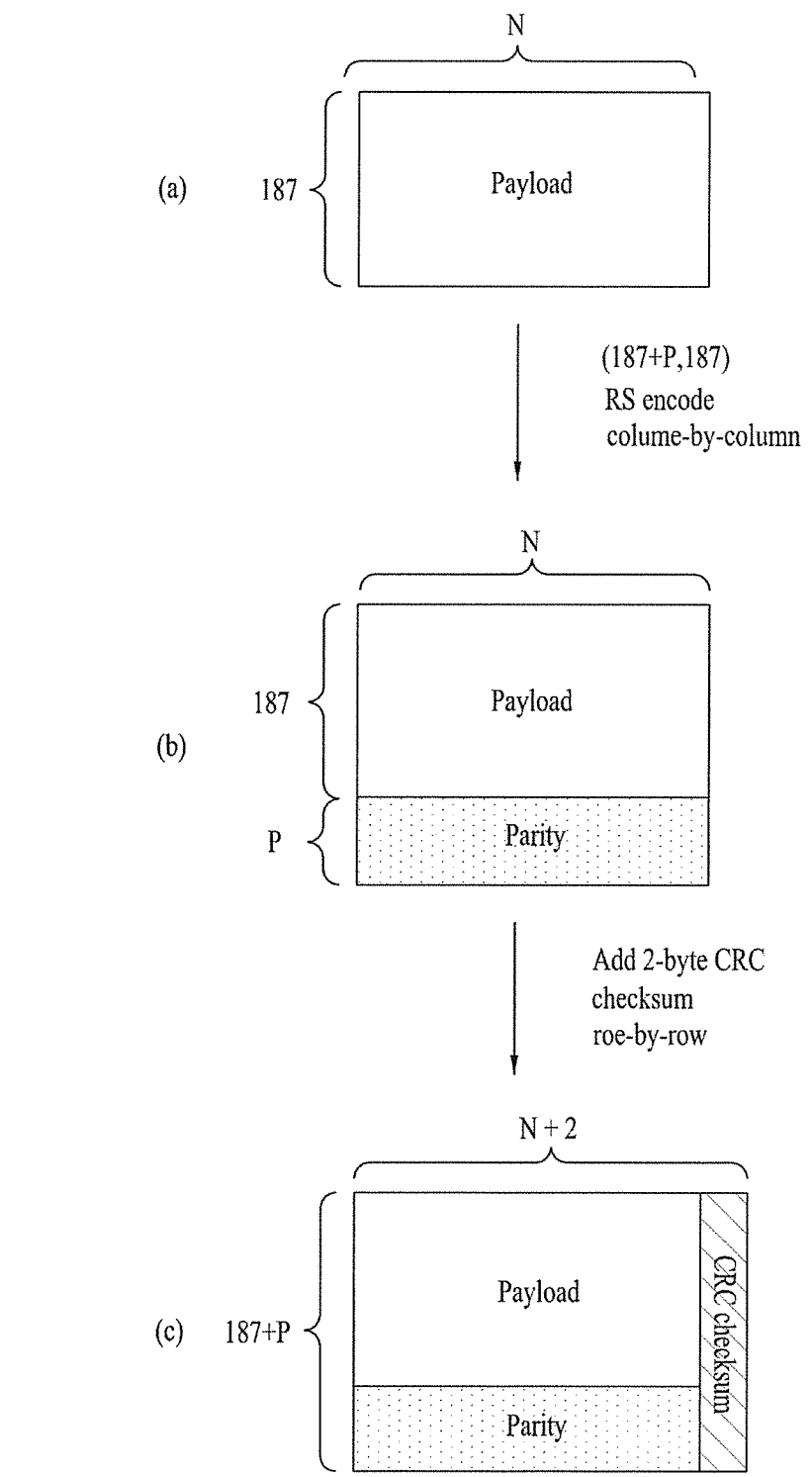
FIG. 48(a)-48(c) illustrate the operations of an RS-CRC encoder according to an embodiment of the present invention.

For example, if IP datagram for mobile service 1 and IP datagram for mobile service 2 are allocated to the first mobile service data packet within the RS frame payload as illustrated in FIG. 48, the pointer field value represents the start position of the IP datagram for mobile service 2 within the mobile service data packet.

Also, if there is no new data in the corresponding mobile service data packet, the corresponding field value is expressed as a maximum value exemplarily. According to the embodiment of the present invention, since 11 bits are allocated to the pointer field, if 2047 is expressed as the pointer field value, it means that there is no new data in the packet. The point where the pointer field value is 0 can be varied depending on the type_indicator field value and the stuff_indicator field value.

It is to be understood that the order, the position, and the meaning of the fields allocated to the header within the mobile service data packet illustrated in FIG. 46 are exemplarily illustrated for understanding of the present invention. Since the order, the position and the meaning of the fields allocated to the header within the mobile service data packet and the number of additionally allocated fields can easily be modified by those skilled in the art, the present invention will not be limited to the above example.

FIG. 47 illustrates a data frame encoder according to an embodiment of the present invention.

(a) of FIG. 47 corresponds to an example of a data frame encoder. The data frame encoder receives a plurality of ensembles, and an input demultiplexer outputs the received ensembles by distributing the received ensembles to each RS frame encoder. The output of each RS frame encoder passes through an output multiplexer, so as to become the output of the data frame encoder. According to the embodiment of the present invention, one data frame encoder includes a number of RS frame encoders corresponding to the number of the received ensembles.

(b) of FIG. 47 corresponds to an example of an RS frame encoder. The RS frame encoder may include a data randomizer, an RS-CRC encoder, and an RS Frame divider.

The data randomizer randomizes data, and the RS-CRC encoder performs forward error correction (FEC) encoding on the mobile service data, thereby building (or creating) an RS frame. At this point, the built (or created) RS frame may correspond to a primary RS frame or a combination of a primary RS frame and a secondary RS frame. The RS frame divider divides the RS frame into a plurality of data portions. Herein, according to the embodiment of the present invention, one data portion forms one data group.

A CMM primary ensemble, a CMM secondary ensemble, an EMM primary ensemble, an EMM secondary ensemble, and a super ensemble may be inputted as the input of the RS frame encoder. When a primary ensemble is inputted, primary RS frame portions are outputted from the RS frame divider. And, when a secondary ensemble is inputted, secondary RS frame portions are outputted from the RS frame divider.

The randomizer within the RS frame encoder randomizes an (N×187)-byte RS frame payload included in the received ensemble. Thereafter, the randomized result is outputted to the RS-CRC encoder.

FIG. 48 illustrates the operations of an RS-CRC encoder according to an embodiment of the present invention.

(a) of FIG. 48 illustrates an example of an RS frame being generated from the RS-CRC encoder according to the present invention.

When the RS frame payload is formed, as shown in (a) of FIG. 48, the RS-CRC encoder performs a (Nc,Kc)-RS encoding process on each column, so as to generate Nc-Kc(=P) number of parity bytes. Then, the RS-CRC encoder adds the newly generated P number of parity bytes after the very last byte of the corresponding column, thereby creating a column of (187+P) bytes. Herein, as shown in (a) of FIG. 48, Kc is equal to 187 (i.e., Kc=187), and Nc is equal to 187+P (i.e., Nc=187+P). Herein, the value of P may vary depending upon the RS code mode. Table a below shows an example of an RS code mode, as one of the RS encoding information.

TABLE 6

| RS code mode | RS code | Number of parity bytes (P) |
| --- | --- | --- |
| 00 | (211, 187) | 24 |
| 01 | (223, 187) | 36 |
| 10 | (235, 187) | 48 |
| 11 | Reserved | Reserved |

Table 6 shows an example of 2 bits being assigned in order to indicate the RS code mode. The RS code mode represents the number of parity bytes corresponding to the RS frame payload.

For example, when the RS code mode value is equal to '10', (235,187)-RS-encoding is performed on the RS frame payload of (a) of FIG. 48, so as to generate 48 parity data bytes. Thereafter, the 48 parity bytes are added after the last data byte of the corresponding column, thereby creating a column of 235 data bytes.

When the RS frame mode value is equal to '00' in Table 6 (i.e., when the RS frame mode indicates a single RS frame), only the RS code mode of the corresponding RS frame is indicated. However, when the RS frame mode value is equal to '01' in Table 6 (i.e., when the RS frame mode indicates multiple RS frames), the RS code mode corresponding to a primary RS frame and a secondary RS frame. More specifically, it is preferable that the RS code mode is independently applied to the primary RS frame and the secondary RS frame.

When such RS encoding process is performed on all N number of columns, a size of N(row)×(187+P)(column) bytes may be generated, as shown in (b) of FIG. 48.

Each row of the RS frame payload is configured of N bytes. However, depending upon channel conditions between the transmitting system and the receiving system, error may be included in the RS frame payload. When errors occur as described above, CRC data (or CRC code or CRC checksum) may be used on each row unit in order to verify whether error exists in each row unit.

The RS-CRC encoder may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system.

(c) of FIG. 48 illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 2 below corresponds to an exemplary equation for generating a 2-byte CRC checksum for each row being configured of N number of bytes.

$$g(x)=x^{16}+x^{12}+x^{5}+1 \qquad \text{[Equation 2]}$$

The process of adding a 2-byte checksum in each row is only exemplary. Therefore, the present invention is not limited only to the example proposed in the description set forth herein. As described above, when the process of RS encoding and CRC encoding are completed, the (N×187)-byte RS frame payload is converted into a (N+2)×(187+P)-byte RS frame.

The RS frame having the size of (N+2)×(187+P) bytes, which is created by the RS-CRC encoder, is outputted to the RS frame divider.

When an RS frame payload created from a primary ensemble is inputted to the RS frame encoder, the RS-CRC encoder generates (or creates) a primary RS frame. Thereafter, the generated primary RS frame passes through the RS frame divider, so as to be transmitted through the primary parade.

When an RS frame payload created from a secondary ensemble is inputted to the RS frame encoder, the RS-CRC encoder generates (or creates) a secondary RS frame. Thereafter, the generated secondary RS frame passes through the RS frame divider, so as to be transmitted through the secondary parade.

When an RS frame payload created from a super ensemble is inputted to the RS frame encoder, the RS-CRC encoder generates (or creates) a super RS frame. Thereafter, the generated super RS frame passes through the RS frame divider, so as to be transmitted through two different parades. At this point, each of the two different parades may respectively correspond to one of an EMM primary parade, an EMM Class 1 secondary parade, and an EMM Class 2 secondary parade.

When the output of the RS frame encoder corresponds to a primary RS frame or a secondary RS frame, the number of columns N included in the RS frame may be decided in accordance with Equation 3 shown below.

$$N = \left\lfloor \frac{5 \times NoGD \times PL}{187 + P} \right\rfloor - 2 \qquad \text{[Equation 3]}$$

In Equation 3, NOGD signifies the number of group divisions having a parade assigned to one sub-frame. PL represents the number of serial concatenated convolution code (SCCC) payload bytes assigned to one group division. And, P indicates the number of RS parity bytes added to each column of the RS frame. Finally, $\lfloor X \rfloor$ corresponds to the greatest integer equal to or less than X.

In Equation 3, the PL value may be differently decided based upon the group type of the group having the corresponding parade assigned thereto, the type of a group region included in the group division having the corresponding parade assigned thereto, the SCCC coding rate of each group region, and a combination method of an SCCC block and a DATA block.

When the output of the RS frame encoder corresponds to a super RS frame, the number of columns N included in the RS frame may be decided in accordance with Equation 4 shown below.

$$N = \left\lfloor \frac{(5 \times NoGD_1 \times PL_1) + (5 \times NoGD_2 \times PL_2)}{187 + P} \right\rfloor - 2 \qquad \text{[Equation 4]}$$

In Equation 4, among the two parades through which a super RS frame passing through the RS frame divider is to be transmitted, NOGD 1 signifies the number of group divisions having the first parade assigned to one sub-frame, and PL1 represents the number of SCCC payloads of the group division assigned to the first parade. Also, among the two parades through which a super RS frame passing through the RS frame divider is to be transmitted, NOGD2 signifies the number of group divisions having the second parade assigned to one sub-frame, and PL2 represents the number of SCCC payloads of the group division assigned to the second parade. At this point, the order of the first parade and the second parade may be decided based upon the transmission order of the group divisions that are assigned to the parades. And, P indicates the number of RS parity bytes added to each column of the RS frame. Finally, $\lfloor X \rfloor$ corresponds to the greatest integer equal to or less than X.

In Equation 4, each of the PL1 and PL2 values may be differently decided based upon the group type of the group having the corresponding parade assigned thereto, the type of a group region included in the group division having the corresponding parade assigned thereto, the SCCC coding rate of each group region, and a combination method of an SCCC block and a DATA block.

The RS frame divider receives the RS frame having the size of (N+2)×(187+P) bytes, which is outputted from the RS-CRC encoder. Thereafter, the RS frame divider divides the received RS frame into a plurality of portions, thereby outputting the divided portions.

Figure 49:
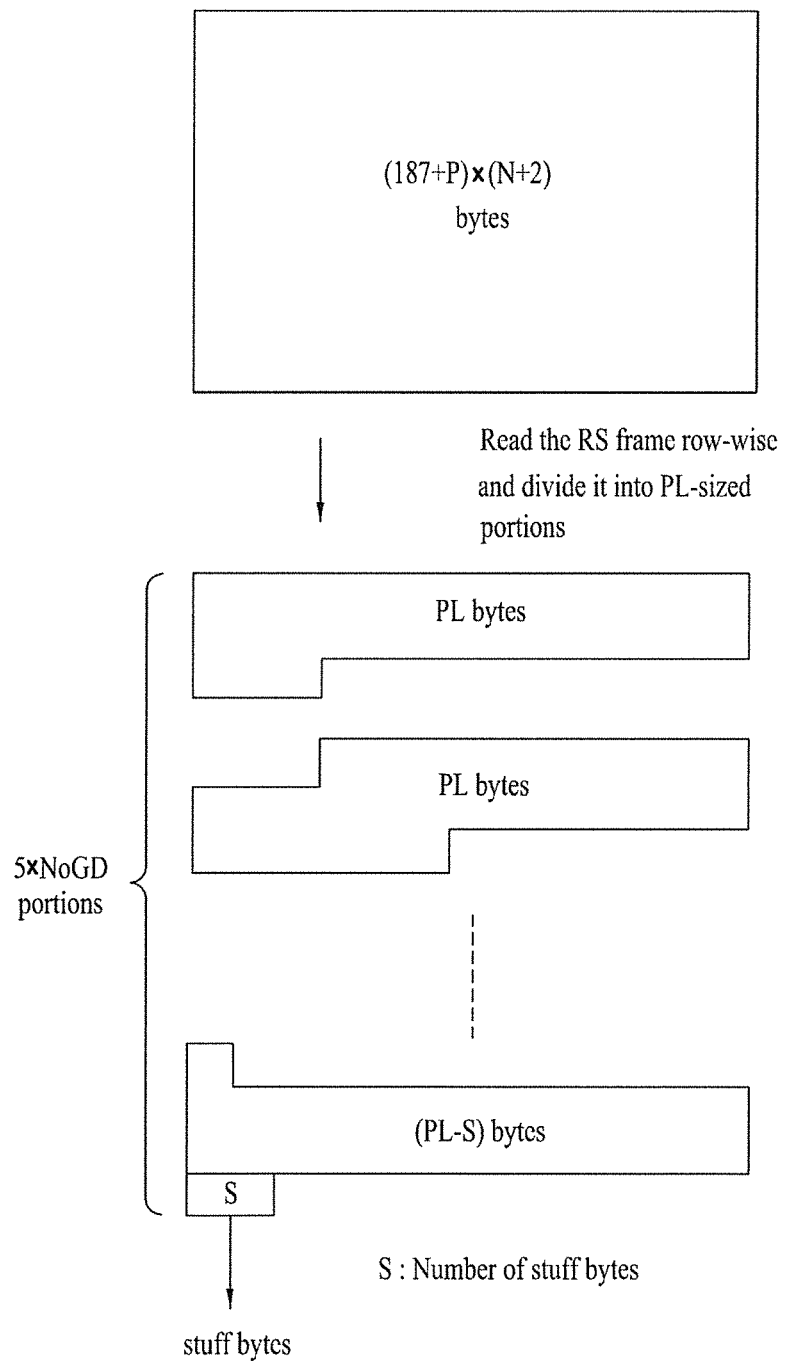
FIG. 49 illustrates the operation of the RS frame divider according to an embodiment of the present invention, when the output of the RS frame encoder corresponds to a primary RS frame or a secondary RS frame.

FIG. 49 illustrates the operation of the RS frame divider according to an embodiment of the present invention, when the output of the RS frame encoder corresponds to a primary RS frame or a secondary RS frame.

At this point, the number of portions divided and created from one RS frame is equal to 5×NOGD. Herein, 5 corresponds to the number of sub-frames existing in one M/H frame, and NOGD corresponds to the number of group divisions having a parade assigned to one sub-frame.

Herein, one portion includes data of PL bytes.

At this point, one portion is assigned to one group division, thereby being transmitted.

When dividing an RS frame having the size of (N+2)×(187+P) bytes into (5×NOGD) number of portions, wherein each portion includes PL bytes, one portion may have a byte size smaller than PL bytes. In this case, the last portion may include RS frame data having the size of (PL-S) bytes and may also include additional data byes of S bytes, wherein S has a random value. At this point, the value of S may be decided based upon Equation 5 shown below.

$$S = (5 \times NoGD \times PL) - (187+P) \times (N+2) \qquad \text{[Equation 5]}$$

Figure 50:
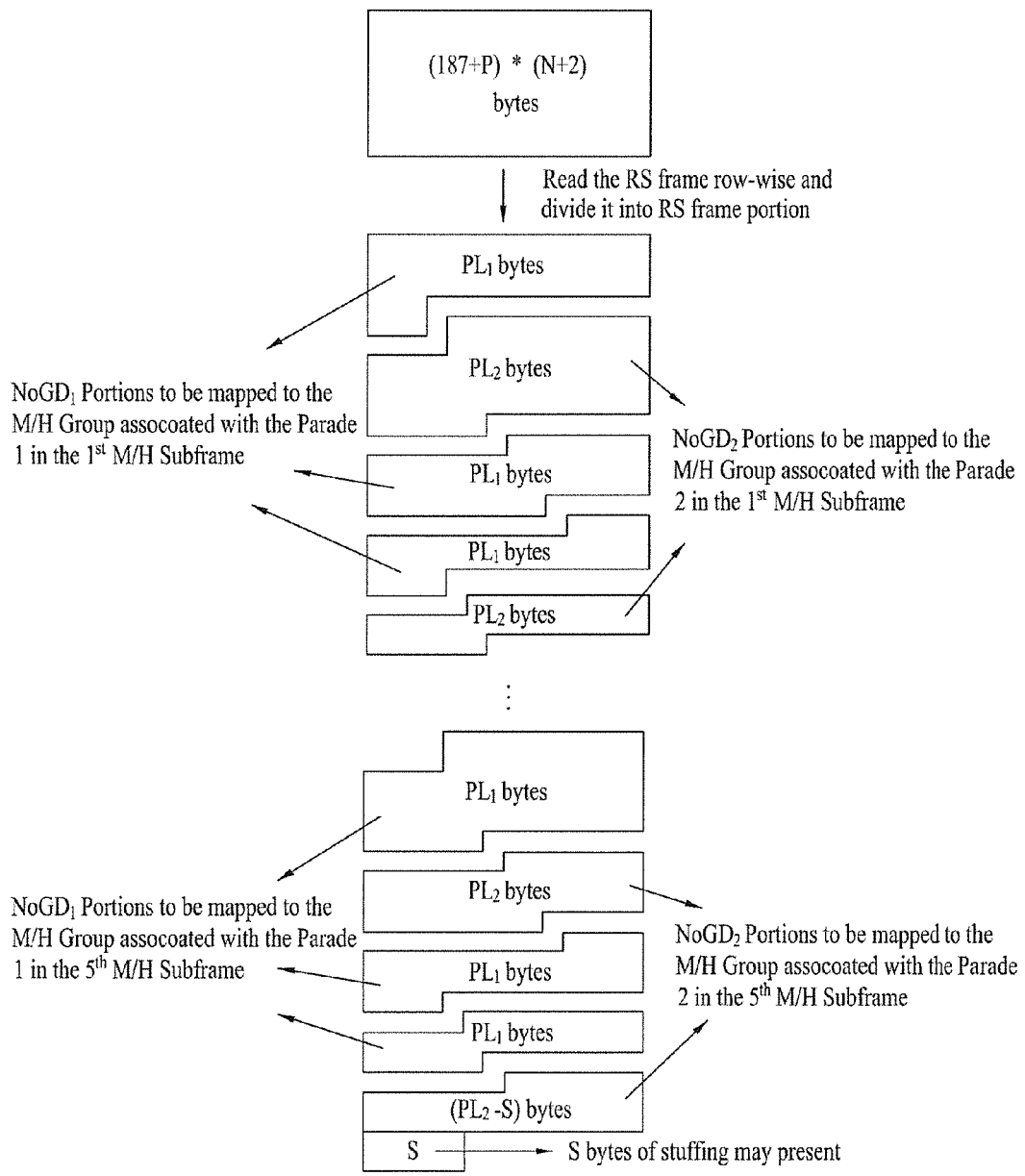
FIG. 50 illustrates the operation of the RS frame divider according to an embodiment of the present invention, when the output of the RS frame encoder corresponds to a super RS frame.

FIG. 50 illustrates the operation of the RS frame divider according to an embodiment of the present invention, when the output of the RS frame encoder corresponds to a super RS frame.

At this point, the number of portions divided and created from one RS frame is equal to 5×(NOGD1+NOGD2). Herein, 5 corresponds to the number of sub-frames existing in one M/H frame, and each of NOGD 1 and NOGD2 corresponds to the number of group divisions having one of the first parade and the second parade, among the two parades through which a super RS frame passing through the RS frame divider is to be transmitted, assigned to one sub-frame. Herein, the order of the first parade and the second parade may be decided based upon the transmission order of the group divisions that are assigned to the parades.

One portion of the first parade includes data of PL1 bytes, and one portion of the second parade includes data of PL2 bytes.

At this point, one portion of PL1 bytes is assigned to a group division, through which the first parade is to be transmitted. Thereafter, the assigned portion of PL1 bytes is transmitted. Also, one portion of PL2 bytes is assigned to a group division, through which the second parade is to be transmitted. Thereafter, the assigned portion of PL2 bytes is transmitted.

When an RS frame having the size of (N+2)×(187+P) bytes is divided into (5×NOGD1+5×NOGD2) number of portions each having PL1 bytes or PL2 bytes, one portion may have a byte size smaller than PL1 bytes or PL2 bytes. In this case, when the last portion corresponds to a portion belonging to a group division assigned to the first parade, the last portion may include RS frame data having the size of (PL1-S) bytes and may also include additional data byes of S bytes, wherein S has a random value. Alternatively, when the last portion corresponds to a portion belonging to a group division assigned to the second parade, the last portion may include RS frame data having the size of (PL2-S) bytes and may also include additional data byes of S bytes, wherein S has a random value. At this point, the value of S may be decided based upon Equation 6 shown below.

$$S = (5 \times NoGD_1 \times PL_1 + 5 \times NoGD_2 \times PL_2) - \{(187+P) \times (N+2)\} \qquad \text{[Equation 6]}$$

Figure 51:
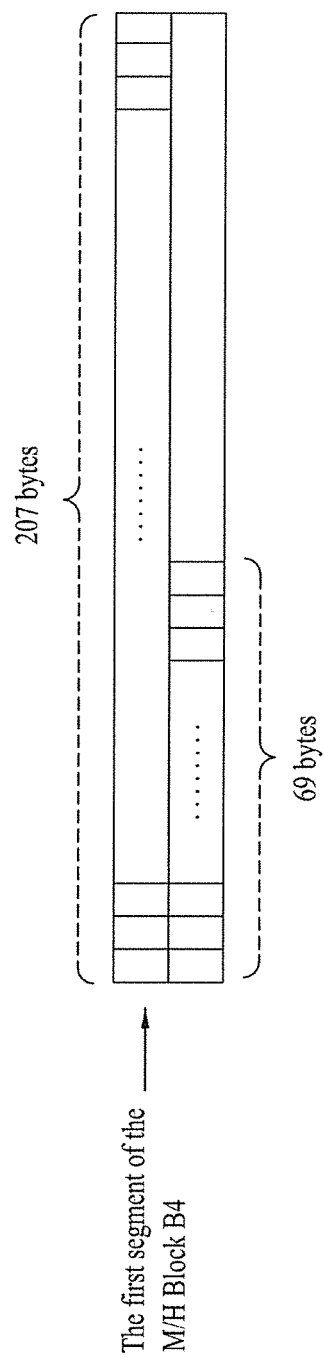
FIG. 51 illustrates an example of assigning signaling information areas for inserting signaling information starting from the 1st segment of the 4th DATA block (B4) to a portion of the 2nd segment.

FIG. 51 illustrates an example of assigning signaling information areas for inserting signaling information starting from the 1st segment of the 4th DATA block (B4) to a portion of the 2nd segment.

The present invention assigns signaling information areas for inserting signaling information to some areas within each data group. More specifically, 276(=207+69) bytes of the 4th DATA block (B4) in each data group are assigned as the signaling information area. In other words, the signaling information area consists of 207 bytes of the 1st segment and the first 69 bytes of the 2nd segment of the 4th DATA block (B4). For example, the 1st segment of the 4th DATA block (B4) corresponds to the 17th or 173rd segment of a VSB field.

The signaling information that is to be inserted in the signaling information area is FEC-encoded by the signaling encoder, thereby inputted to the group formatter. The signaling information may include a transmission parameter which is included in the payload region of an OM packet, and then received to the demultiplexer.

The group formatter inserts the signaling information, which is FEC-encoded and outputted by the signaling encoder, in the signaling information area within the data group. Herein, the signaling information may be identified by two different types of signaling channels: a transmission parameter channel (TPC) and a fast information channel (FIC).

Herein, the TPC data corresponds to signaling information including transmission parameters, such as RS frame information, RS encoding information, FIC information, data group information, SCCC information, and M/H frame information and so on. However, the TPC data presented herein is merely exemplary. And, since the adding or deleting of signaling information included in the TPC may be easily adjusted and modified by one skilled in the art, the present invention will, therefore, not be limited to the examples set forth herein.

Furthermore, the FIC data is provided to enable a fast service acquisition of data receivers, and the FIC data includes cross layer information between the physical layer and the upper layer(s).

Figure 52:
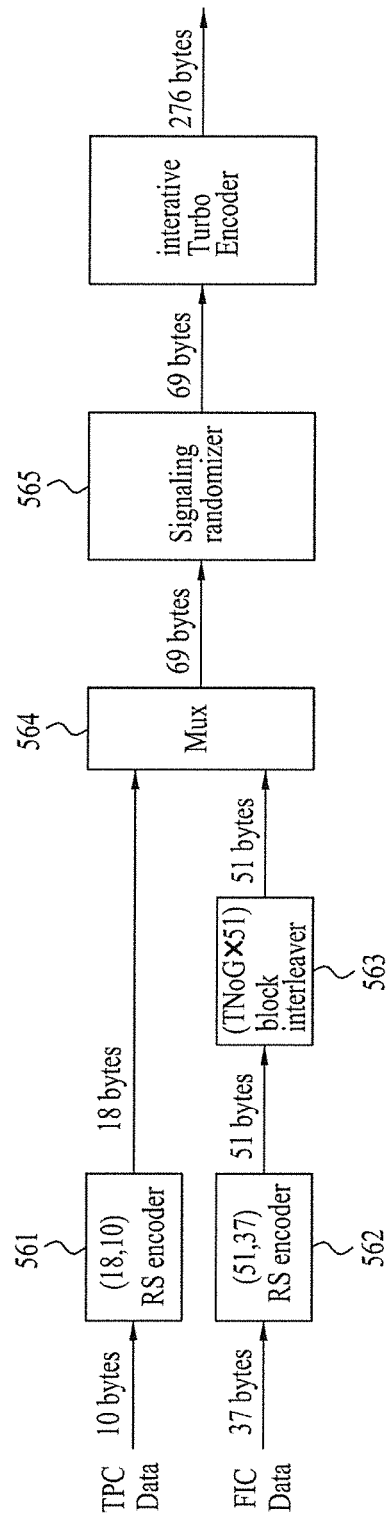
FIG. 52 illustrates a detailed block diagram of the signaling encoder according to the present invention.

FIG. 52 illustrates a detailed block diagram of the signaling encoder according to the present invention.

Referring to FIG. 52, the signaling encoder includes a TPC encoder 561, an FIC encoder 562, a block interleaver 563, a multiplexer 564, a signaling randomizer 565, and an iterative turbo encoder 566.

The TPC encoder 561 receives 10-bytes of TPC data and performs (18,10)-RS encoding on the 10-bytes of TPC data, thereby adding 8 bytes of RS parity data to the 10 bytes of TPC data. The 18 bytes of RS-encoded TPC data are outputted to the multiplexer 564.

The FIC encoder 562 receives 37-bytes of FIC data and performs (51,37)-RS encoding on the 37-bytes of FIC data, thereby adding 14 bytes of RS parity data to the 37 bytes of FIC data. Thereafter, the 51 bytes of RS-encoded FIC data are inputted to the block interleaver 563, thereby being interleaved in predetermined block units. Herein, the block interleaver 563 corresponds to a variable length block interleaver. The block interleaver 563 interleaves the FIC data within each sub-frame in TNoG(column)×51(row) block units and then outputs the interleaved data to the multiplexer 564. Herein, the TNoG corresponds to the total number of data groups being assigned to a sub-frame. The block interleaver 563 is synchronized with the first set of FIC data in each sub-frame.

The block interleaver 563 writes 51 bytes of incoming (or inputted) RS codewords in a row direction (i.e., row-by-row) and left-to-right and up-to-down directions and reads 51 bytes of RS codewords in a column direction (i.e., column-by-column) and left-to-right and up-to-down directions, thereby outputting the RS codewords.

The multiplexer 564 multiplexes the RS-encoded TPC data from the TPC encoder 561 and the block-interleaved FIC data from the block interleaver 563 along a time axis. Then, the multiplexer 564 outputs 69 bytes of the multiplexed data to the signaling randomizer 565. The signaling randomizer 565 randomizes the multiplexed data and outputs the randomized data to the iterative turbo encoder 566. The signaling randomizer 565 may use the same generator polynomial of the randomizer used for mobile service data. Also, initialization occurs in each data group.

The iterative turbo encoder 566 corresponds to an inner encoder performing iterative turbo encoding in a PCCC method on the randomized data (i.e., signaling information data).

FIG. 53 illustrates a syntax structure of Transmission Parameter Channel (TPC) data according to an embodiment of the present invention.

TPC data are inserted in a signaling information region in each group, thereby being transmitted. The TPC data may include a sub_frame_number field, a slot_number field, a parade_id field, a starting_group_number (SGN) field, a number_of group_minus_1 (NoG-1) field, a parade_repetition_cycle_minus_1 (PRC−1) field, an rs_frame_mode field, an rs_code_mode_primary field, an rs_code_mode_secondary field, an sccc_block_mode field, an sccc_outer_code_mode_a field, an sccc_outer_code_mode_b field, an sccc_outer_code_mode_c field, an sccc_outer_code_mode_d field, an sccc_outer_code_mode_e field, an fic_version field, a parade_continuity_counter field, a TNoG field, a group_extension_mode field, a c2s_parade_nogd field, a c2s_parade_num field, a training_concatenation_indicator field, and a tpc_protocol_version field.

Among the TPC data, a portion of the TPC data may include signaling information on a current data frame depending upon a number of a sub-frame in which the group is positioned (or located), or a portion of the TPC data may include signaling information on a future data frame or signaling information on a future sub-frame. When transmitting in advance signaling information on a future data frame, surplus time is given to the receiver by acquiring the information in advance, thereby being provided with enough time to prepare for the reception of data that will follow. Also, in a portion of the TPC data, identical data may be iterated (or repeated) in the sub-frame or the data frame. In a poor channel environment, the iteration (or repetition) of identical data may help the decoding process of the receiver on the TPC data.

Among the TPC data, a portion of the TPC data corresponds to a field defined in a CMM mobile service, and another portion of the TPC data corresponds to a field defined in an SFCMM mobile service. As a field being inserted in an undefined section among the TPC data that are defined in the CMM mobile service, the field defined in the SFCMM mobile service decides the syntax structure of the TPC data. The CMM receiver may not be capable of receiving the TPC data defined in the SFCMM mobile service, or, even if the CMM receiver receives the corresponding TPC data, the CMM receiver does not process the received TPC data. The SFCMM receiver may receive both the TPC data defined in the CMM service and the TPC data defined in the SFCMM service. Furthermore, the TPC data may also be configured only of a field for the SCFMM.

In the TPC data, the tpc_protocol_version field indicates whether the current TPC data include only the TPC data of CMM, or whether the current TPC data include both the TPC data of CMM and the TPC data of SFCMM.

The tpc_protocol_version field corresponds to a 5-bit field. Herein, the first 2-bit section corresponds to a major version field, and the last 3-bit section corresponds to a minor version field. In the TPC data of the CMM, the tpc_protocol_version field is set to '11111'. Herein, when the minor version is increased, the last 3-bit section is incremented by '1'. And, when the major version is increased, the first 2-bit section is incremented by '1'. When the modified (or varied) TPC data have a backward compatibility with the TPC data of the previous version, the minor version increases. And, when the modified (or varied) TPC data do not have a backward compatibility with the TPC data of the previous version, the major version increases.

According to the embodiment of the present invention, when the field defined for the SFCMM mobile service is inserted in an undefined section within the TPC data defined in the CMM mobile service, the CMM receiver is capable of receiving the TPC data of the CMM. Therefore, the minor version may be increased. At this point, the value of the tpc_protocol_version field is equal to '11000'.

The value of sub_frame_number field shall be in the range of 0 through 4 inclusive and shall indicate the current Sub-Frame number within the data Frame. It is transmitted to aid data Frame synchronization in the receiver.

The value of Slot number field shall be in the range of 0 through 15 inclusive and shall indicate the current Slot number within the Sub-Frame. It is transmitted to aid data Frame synchronization in the receiver.

Parade_id field identifies the Parade to which the current Group belongs, for the current data Frame. Each Parade in an data transmission shall have a unique Parade_id.

The value of SGN field shall be the first-assigned Group_number for a Parade to which this Group belongs.

The value of NoG−1 field shall be the number of Groups in a Sub-Frame assigned to the Parade to which this Group belongs, minus 1, for the current data Frame. The value of number of groups_minus_1 shall be in the range of 0 through 7 inclusive.

When the current sub-frame number is '0' or '1', the SGN field and the NoG−1 field indicate an SGN value or an NoG−1 value given to a parade, to which the corresponding group belongs, within the current data frame.

Alternatively, when the current sub-frame number is '2', '3', or '4', the SGN field and the NoG−1 field indicate an SGN value or an NoG−1 value given to a parade, to which the corresponding group belongs, within the next data frame. As described above, the next M/H frame refers to a very first M/H frame to which the respective identical identifier parade group (or collection) is being transmitted, after the current M/H frame.

The PRC−1 field indicates a value, wherein '1' is subtracted from an iteration (or repetition) cycle period of a parade being transmitted to the data frame. For example, when the value of the PRC−1 field is equal to '000', the corresponding identical identifier parade group is transmitted at a cycle of one data frame. And, when the value of the PRC−1 field is equal to '010', the corresponding identical identifier parade group is transmitted at a cycle of 3 data frames.

More specifically, when the current data frame number is equal to n, in a sub-frame having the sub-frame number of 2, 3, or 4, the SGN field and the NoG−1 field respectively indicate the SGN and NoG−1 values given to a (n+PRC) data frame.

RS_frame_mode field shall be the RS frame mode of the Parade to which this group belongs, as defined in Table 7.

TABLE 7

| RS Frame mode | Description |
| --- | --- |
| 00 | Primary RS frame: Region ABCD |
|  | Secondary RS frame: None or Region E |
| 01 | Primary RS frame: Region AB |
|  | Secondary RS frame: None or Region CD or CDE |
| 10 | Primary RS frame: Region ABCDE |
|  | Secondary RS frame: None |
| 11 | Reserved | rs_code_mode_primary field shall be the RS code mode for the primary RS Frame.

rs_code_mode_secondary field shall be the RS code mode for the secondary RS Frame of the Parade to which this group belongs, for the current data Frame.

SCCC_Block_mode field indicates how a data block or extended data block within the data group is allocated to the SCCC block. For example, when one SCCC block respective to a data block transmitting the mobile service data of the CMM is configured of one data block, the SCCC block mode is defined as '00'. And, when one SCCC block respective to a data block transmitting the mobile service data of the CMM is configured of a plurality of data blocks, or when a data block transmitting the mobile service data of the CMM does not exist, the SCCC block mode may be defined as '01'.

sccc_outer_code_mode_A field shall be the SCCC outer code mode for Region A of the Parade to which this group belongs.

sccc_outer_code_mode_B field shall be the SCCC outer code mode for Region B of the Parade to which this group belongs.

sccc_outer_code_mode_C field shall be the SCCC outer code mode for Region C of the Parade to which this group belongs.

sccc_outer_code_mode_D field shall be the SCCC outer code mode for Region D of the Parade to which this group belongs.

sccc_outer_code_mode_E field shall be the SCCC outer code mode for Region E of the Parade to which this group belongs.

According to the embodiment of the present invention, the sccc_outer_code_mode_E field may be defined in the TPC, or the sccc_outer_code_mode_E field may not be defined in the TPC. In case the sccc_outer_code_mode_E field is not defined, the SCCC outer code mode of region E may be decided depending upon a portion of the SCCC outer code mode or the entire SCCC outer code mode of regions A, B, C, and D. For example, EB1 and EB4 included in region E of the data group may have the same SCCC outer code mode as region C of the data group. Similarly, EB2 and EB3 may have the same SCCC outer code mode as region D of the data group. Furthermore, EB5 may have the same SCCC outer code mode as region A of the data group. In this case, even though the SCCC_outer_code_mode_E is not defined, the SCCC outer code mode of region E may be defined by using the SCCC_outer_code_mode_A field to the SCCC_outer_code_mode_D field.

Table 8 shown below corresponds to a table showing an exemplary SCCC outer code mode according to the present invention.

TABLE 8

| SCCC Outer Code Mode | Description |
| --- | --- |
| 00 | The outer code rate of a SCCC Block is ½ rate |
| 01 | The outer code rate of a SCCC Block is ¼ rate |
| 10 | The outer code rate of a SCCC Block is ⅓ rate |
| 11 | [Reserved for future use] |

The sub-frame_number, slot_number, parade_id, parade_repetition_cycle_minus_1, parade_continuity_counter, fic_version and sccc_block_extension_mode shall have their values corresponding to the current data Frame throughout the 5 Sub-Frames within a particular data Frame.

Certain TPC parameters and FIC data are signaled in advance.

The values of SGN, number_of groups_minus_1, and all FEC mode parameters (rs_frame_mode, rs_code_mode_primary, rs_code_mode_secondary, sccc_block_mode, sccc_outer_code_mode_a, sccc_outer_code_mode_b, sccc_outer_code_mode_c, sccc_outer_code_mode_d, sccc_outer_code_mode_e and group_extension_mode) corresponding to the current data Frame are given in the first two Sub-Frames of the current data Frame. The values of SGN, number_of groups_minus_1, and all FEC mode parameters corresponding to the data Frame in which the Parade next appears are given in the 3rd, 4th and 5th Sub-Frames of the current data Frame.

The fic_version shall be incremented by 1 modulo 32 when an FIC-Chunk in the current data Frame that describes the current+1 data frame is different from the FIC-Chunk with the same FIC_chunk_major_protocol_version in the current-1 data frame that described the current data frame.

The value of parade_continuity_counter field shall increment by 1 every (PRC) data Frames. The value of this field shall increase from 0 to 15 and then repeat. For example, parade_repetition_cycle_minus_1=011 (i.e., PRC=4) implies that parade_continuity_counter increases every fourth data frame.

The value of TNoG field shall be the total number of groups to be transmitted during a Sub-Frame for the data Frame. In other words, it is the sum of NoGs of all Parades within a Sub-Frame of the data Frame. Its value shall be in the range of 0 through 16 inclusive.

In case the current sub-frame number is '0' or '1', the TPC data may include a TNoG value of the current data frame. And, in case the current sub-frame number is '2', '3', or '4', the TPC data may include both the TNoG value of the next M/H frame and the TNoG value of the current data frame.

According to the embodiment of the present invention, 3 bits of the TPC are used to indicate the extended group information. In the description of the present invention, the 3 bits will be referred to as a group_extension_mode field.

By using the rs_frame_mode field and the group_extension_mode field of the TPC data, all group types may be identified.

Table 9 shown below shows exemplary values being assigned to the group_extension_mode field and the significance of each value according to the present invention.

TABLE 9

| Group Extension Mode | Description |
| --- | --- |
| 000 | Only the 1st mobile mode exists, and region E does not exist. |

TABLE 9-continued

| Group Extension Mode | Description |
| --- | --- |
| 001 | There are no packets reserved for main services in the slot. |
| 010 | 1 packet for main services is reserved in the slot. |
| 011 | 2 packets for main services are reserved in the slot. |
| 100 | 4 packets for main services are reserved in the slot. |
| 101 | 8 packets for main services are reserved in the slot. |
| 110 | Reserved |
| 111 | Increased Capacity Mode |

Furthermore, Table 10 shown below indicates values of an RS frame mode field and values of the group_extension_mode field being assigned to each segmented group type, when each group type is segmented in accordance with the size of region E, according to the present invention.

TABLE 10

| | Group Regions | | | |
| --- | --- | --- | --- | --- |
| Group Type | Primary Group Division | Secondary Group Division | RS Frame Mode | Group Extension Mode |
| 0 (GT0) | ABCD | — | 00 | 000 |
| | AB | CD | 01 | 000 |
| 1-0 (GT1-0) | ABCD | E | 00 | 001 |
| 1-1 (GT1-1) | | | | 010 |
| 1-2 (GT1-2) | | | | 011 |
| 1-4 (GT1-4) | | | | 100 |
| 1-8 (GT1-8) | | | | 101 |
| 2-0 (GT2-0) | AB | CDE | 01 | 001 |
| 2-1 (GT2-1) | | | | 010 |
| 2-2 (GT2-2) | | | | 011 |
| 2-4 (GT2-4) | | | | 100 |
| 2-8 (GT2-8) | | | | 101 |
| 3-0 (GT3-0) | ABCDE | — | 10 | 001 |
| 3-1 (GT3-1) | | | | 010 |
| 3-2 (GT3-2) | | | | 011 |
| 3-4 (GT3-4) | | | | 100 |
| 3-8 (GT3-8) | | | | 101 |
| 4 (GT4) | ABCDE | — | 10 | 111 |

According to the embodiment of the present invention, when the rs_frame_mode field value is equal to '01', and when the group_extension_mode field value is equal to '010', in the TPC, it may be known that the group type of the corresponding group is 2-1(GT2-1).

The group_extension_mode field indicates a value associated to each respective field within the current data frame, when the current sub-frame number is '0' or '1'. And, the group_extension_mode field indicates a value associated to each respective field within a data frame after PRC, when the current sub-frame number is '2', '3', or '4'.

The c2s_parade_nogd field indicates a number of group divisions, wherein a Class 2 secondary parade being transmitted to the corresponding data group is allocated within a single sub-frame. When the Class 2 secondary parade is not transmitted to the corresponding data group, the c2s_parade_nogd field value is indicated as '0'.

The c2s_parade_num field indicates a number of the Class 2 secondary parade. On identical identifier parade group (or collection) may include a maximum of two Class 2 secondary parades. Herein, the c2s_parade_num field is indicated as '0' for the first Class 2 secondary parade. And, the c2s_parade_num field is indicated as '1' for the second Class 2 secondary parade. In case the c2s_parade_nogd field value is equal to '0', the c2s_parade_num field value may be disregarded (or ignored).

The c2s_parade_nogd field and the c2s_parade_num field respectively indicate the values of each field given to the corresponding Class 2 secondary parade in the current data frame, when the current sub-frame number is '0' or '1'. And, the c2s_parade_nogd field and the c2s_parade_num field respectively indicate the values of each field given to the corresponding Class 2 secondary parade in a current data frame after the PRC, when the current sub-frame number is '2', '3', or '4'.

The training_concatenation_indicator field indicates whether or not short training sequence of a data group within the sub-frame can create a long training sequence or a segmented long training sequence by being connected (or concatenated) to short training sequences of a neighboring data group. Herein, the training_concatenation_indicator field may indicate information on the current sub-frame and may also indicate information on sub-frames subsequent to the current sub-frame.

The training_concatenation_indicator field may signal whether or not an earlier short training sequence of the data group can be connected (or concatenated) to a short training sequence of a data group allocated to a neighboring immediately previous slot through the backward_concatenation_indicator field, and the training_concatenation_indicator field may signal whether or not a later short training sequence of the data group can be connected (or concatenated) to a short training sequence of a data group allocated to a neighboring immediately subsequent slot through the forward_concatenation_indicator_field. Also, the short training sequence values may vary in accordance with the group type of the neighboring slot, and, in case the group type of the current slot and the group type of a neighboring slot are known, the connection (or concatenation) status of the short training sequences may also be known. Therefore, the indicator field may be replaced with group type information of the neighboring slot.

Even though the data group corresponds to a data group transmitting the identical identifier parade group (or collection), the value of the training_concatenation_indicator field may vary depending upon the group type of the neighboring group of each data group.

Figure 54:
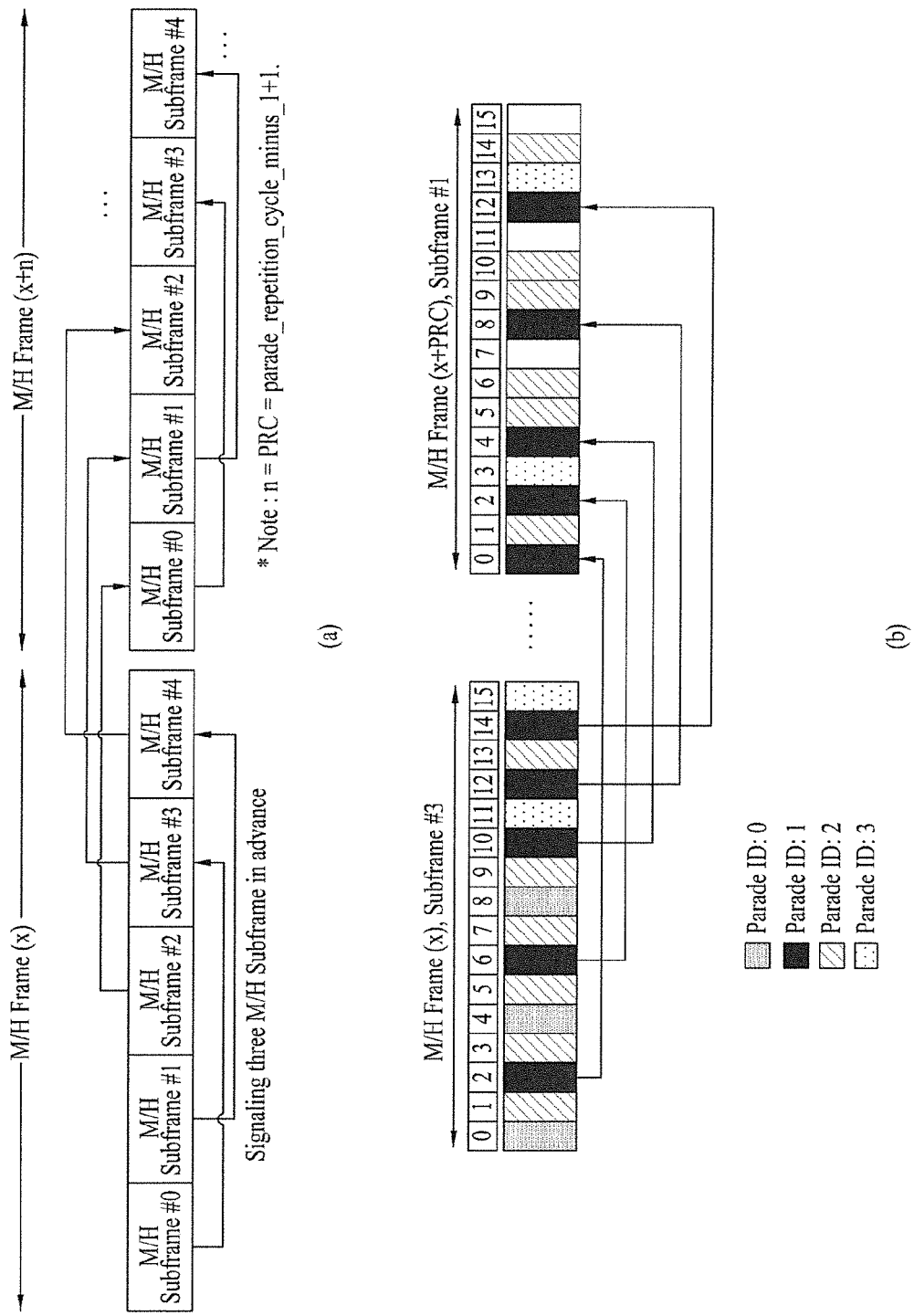
FIG. 54(a)-54(b) illustrate operations of the TPC data according to an embodiment of the present invention.

FIG. 54 illustrates operations of the TPC data according to an embodiment of the present invention.

As shown in (a) of FIG. 54, in case of an identical identifier parade group (or collection) being transmitted to a data group of the current sub-frame, the corresponding identical identifier parade group may perform signaling on an identical identifier parade group being transmitted to a data group after 3 sub-frames from the sub-frame having the corresponding parade group transmitted thereto.

More specifically, in case the current data frame corresponds to an $x^{th}$ data frame, an identical identifier parade group being transmitted to a data group of sub-frame #0 may signal an identical identifier parade group being transmitted to a data group of sub-frame #3 of the same data frame. Also, an identical identifier parade group being transmitted to a data group of sub-frame #1 may signal an identical identifier parade group being transmitted to a data group of sub-frame #4 of the same data frame. And, identical identifier parade groups being transmitted to a data group of sub-frame #2 to sub-frame #4 may signal identical identifier parade groups being transmitted to a data group of sub-frame #0 to sub-frame #2 of an (x+PRC) data frame.

Also, as shown in (b) of FIG. 54, among the identical identifier parade group being transmitted from the current sub-frame, the group being transmitted chronologically as the $n^{th}$ group may signal a group being transmitted chronologically as an $n^{th}$ group among the identical identifier parade group being transmitted from a sub-frame positioned after 3 sub-frames from the current sub-frame.

This will be described in more detail with reference to an identical identifier parade group having parade identifier #1. Herein, a parade group of parade identifier #1 within sub-frame #3 of the $x^{th}$ data frame is transmitted in a chronological order of slot #2, slot #6, slot #10, slot #12, and slot #14. Also, a parade group of parade identifier #1 within sub-frame #1 of the $(x+PRC)^{th}$ data frame is transmitted in a chronological order of slot #0, slot #2, slot #4, slot #8, and slot #12. At this point, the group being transmitted to slot #2 within sub-frame #3 of the $x^{th}$ data frame signals a group being transmitted to slot #0 of sub-frame #1 of the $(x+PRC)^{th}$ data frame. Also, at this point, the groups being transmitted to slot #6, slot #10, slot #12, and slot #14 within sub-frame #3 of the $x^{th}$ data frame may respectively signal the groups being transmitted to slot #2, slot #4, slot #8, and slot #12 within sub-frame #1 of the $(x+PRC)^{th}$ data frame.

In the above-described embodiment of the present invention, the NoG of the parade group of parade identifier #1 within sub-frame #3 of the $x^{th}$ data frame is identical to the NoG of the parade group of parade identifier #1 within sub-frame #1 of the $(x+PRC)^{th}$ data frame. However, when the above-described NoG values are not identical to one another, signaling may not be performed in some of the groups.

When the main services and the mobile services of CMM are not transmitted, and when only the mobile services of SFCMM are transmitted, or when only the main services and the mobile services of SFCMM are transmitted, the major version of the tpc_protocol_version field may be increased, and the TPC data may transmit only the fields respective to the SFCMM. In this case, the tpc_protocol_version field may be set to '00111'.

According to the embodiment of the present invention, a group is allocated to all slots, and each of the allocated groups may correspond to one of group types 3-0, 3-1, 3-2, 3-4, and 3-8. Alternatively, when all of the groups correspond to group type 4, i.e., in case of group type 4, the TPC data having the major version increased may be transmitted.

Depending upon the increase in the major version of the TPC data, some of fields within the syntax of the TPC data shown in FIG. 53 may be deleted or integrated. In this case, the TPC data required by the system may be transmitted by using a smaller number of bits. And, ensuring a larger number of reserved bits may facilitate the extension of the system in a later process.

FIG. 55 illustrates a syntax of the TPC data, when the major version is increased, according to the embodiment of the present invention.

The TPC data may include a sub_frame_number field, a slot number field, a parade_id field, an SGN field, an NoG-1 field, a PRC-1 field, a group_extension_mode field, an rs_code_mode field, an sccc_outer_code_mode field, an fic_version field, a parade_continuity_counter field, a training_concatenation field, and a tpc_protocol_version field.

Since each rs_frame_mode field in the groups of group type 3 or group type 4 is equal to '10', the rs_frame_mode field may be deleted. Also, since each sccc_block_mode field in the groups of group type 3 or group type 4 is equal to '01', the sccc_block_mode field may be deleted. And, since a group is allocated to each slot, the TNoG is always equal to '16'. And, therefore, the TNoG field may also be deleted.

Since the groups of group type 3 or group type 4 transmit only the primary parade, the rs_code_mode field, which is divided into a primary rs_code_mode field and a secondary rs_code_mode field, may be combined to a single rs_code_mode field. Also, since each region has the same SCCC outer code rate, the sccc_outer_code_mode field, which is divided (or differentiated) for each group region, may be combined to a single sccc_outer_code_mode field. Furthermore, since the secondary parade does not exist, the Class 2 secondary parade does not exist either. Therefore, the respective c2s_parade_nogd field and the c2s_parade_num field may be deleted.

According to the embodiment of the present invention, the diverse information included in the TPC data is merely exemplary information given to facilitate the understanding of the present invention. And, since the addition or deletion (or removal) of the information included in the TPC data can be varied by anyone skilled in the art, the present invention will not be limited only to the examples given in the above-described embodiment of the present invention.

Figure 56:
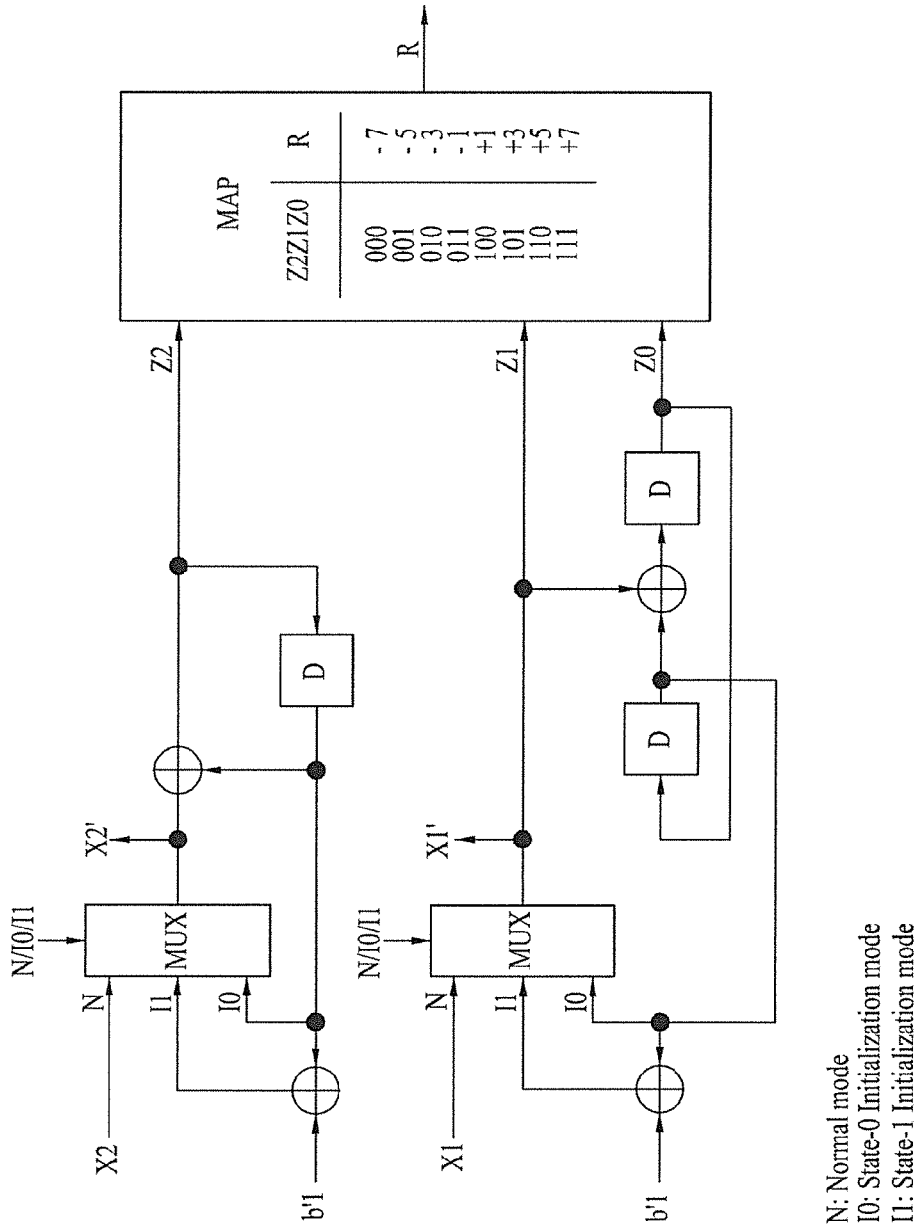
FIG. 56 illustrates a detailed block of the trellis encoding module according to an embodiment of the present invention.

FIG. 56 illustrates a detailed block of the trellis encoding module 115 according to an embodiment of the present invention.

The trellis encoding module 115 includes a trellis encoder for each trellis way. More specifically, according to the present invention, the trellis encoding module 115 includes 12 trellis encoders. In order to trellis encode known data so as to create training sequences pre-known by the transmitting system and the receiving system with the trellis encoded known data, the trellis encoder initializes the memory of the trellis encoder before inputting the known data.

The initialization of the memory of the trellis encoder corresponds to a process of initializing a plurality of memories included in the trellis encoder to a pre-defined value.

In order to perform the initialization process, an input multiplexer exists at the inputting end of the trellis encoder. The trellis encoder receives a 2-bit input symbol, and the input multiplexer exists for each bit. If the current encoder input does not correspond to a symbol for the initialization process, the current encoder input is directly outputted without any modification. Alternatively, if the current encoder input corresponds to a symbol for the initialization process, a value referred to from the memory of the trellis encoder is outputted.

According to the embodiment of the present invention, the initialization process of the trellis encoder is performed by using two different methods.

A state-0 initialization process corresponds to a process of initializing all memories of the trellis encoder to state-0.

A state-1 initialization process corresponds to a process of initializing all memories of the trellis encoder to state-1.

If the current encoder input corresponds to a symbol for state-0 initialization, the input multiplexer of the trellis encoder outputs the memory value of the current trellis encoder. In FIG. 49, when a trellis input X2 corresponding to an upper bit of the input bit is received, and if the input of the current trellis encoder corresponds to a bit for state-0 initialization, the input multiplexer discards (or deletes) the X2 and outputs the value of the memory D2. Also, when a trellis input X1 corresponding to a lower bit of the input bit is received, and if the input of the current trellis encoder corresponds to a bit for state-0 initialization, the input multiplexer discards (or deletes) the X1 and outputs the value of the memory D0.

If the current encoder input corresponds to a symbol for state-1 initialization, the input multiplexer of the trellis encoder outputs an inverse value of the memory value of the current trellis encoder. When a trellis input X2 corresponding to an upper bit of the input bit is received, and if the input of the current trellis encoder corresponds to a bit for state-1 initialization, the input multiplexer discards (or deletes) the X2 and performs an XOR operation on the value of the memory D2 with '1', thereby outputting an inverse value of D2. Also, when a trellis input X1 corresponding to a lower bit of the input bit is received, and if the input of the current trellis encoder corresponds to a bit for state-1 initialization, the input multiplexer discards (or deletes) the X1 and performs an XOR operation on the value of the memory D0 with '1', thereby outputting an inverse value of D0.

In case the two consecutive symbols correspond to symbols for the initialization of the trellis encoder, the trellis encoder may initialize the memory value.

If the two consecutive symbols correspond to symbols for the state-0 initialization, D0, D1, and D2 are all equal to '0'. And, if the two consecutive symbols correspond to symbols for the state-1 initialization, D0, D1, and D2 are all equal to '1'.

The state-0 initialization and the state-1 initialization may be decided based upon the group type, the type of training sequence, and the position (or location) of the training sequence.

As compared to other training sequences, a short training sequence has a relatively larger number of initialization symbols. And, when the large number of initialization symbols performs the same type of initialization, the DC value of the symbols may have a value concentrated to a specific code (or sign). For example, when all initialization symbols of a short training sequence perform the state-0 initialization, after the initialization process of the two symbols, all memories are given the value '0'. And, at this point, since the trellis encoder always outputs a negative value, i.e., since Z2 is always equal to '0', the DC value of the entire training sequence is very likely to have a negative value. Conversely, when all initialization symbols of a short training sequence perform the state-1 initialization, the DC value of the entire training sequence is very likely to have a positive value.

In order to resolve this problem according to the embodiment of the present invention, state-0 initialization and state-1 initialization are collectively used on the initialization symbols for the short training sequences, and state-0 initialization is used for long training sequences and long additional training sequences or segmented long additional training sequences. Furthermore, according to the embodiment of the present invention, for the short training sequences, trellis encoders corresponding to even-number trellis ways (ways 0, 2, 4, 6, 8, and 10) perform state-1 initialization, and trellis encoders corresponding to odd-number trellis ways (ways 1, 3, 5, 7, 9, and 11) perform state-0 initialization. As described above, when state-0 initialization and state-1 initialization are collectively used for each trellis way on the short training sequences, the present invention may prevent the DC value of the symbols from being concentrated to a specific code (or sign).

The initialization values respective to the state-0 initialization mode and the state-1 initialization mode being decided by the inputting end of the trellis encoder has been described according to the embodiment of the present invention. According to another embodiment of the present invention, the input value for each of the state-0 initialization mode and the state-1 initialization mode of the trellis encoder may be decided in a process step prior to the trellis encoder and then transmitted. More specifically, an I0 input of the trellis encoder may be omitted without existing separately. And, in this case, the input value for the state-0 initialization mode and the state-1 initialization mode may be decided before the trellis encoder, and the decided value may be inputted to the trellis encoder.

Figure 57:
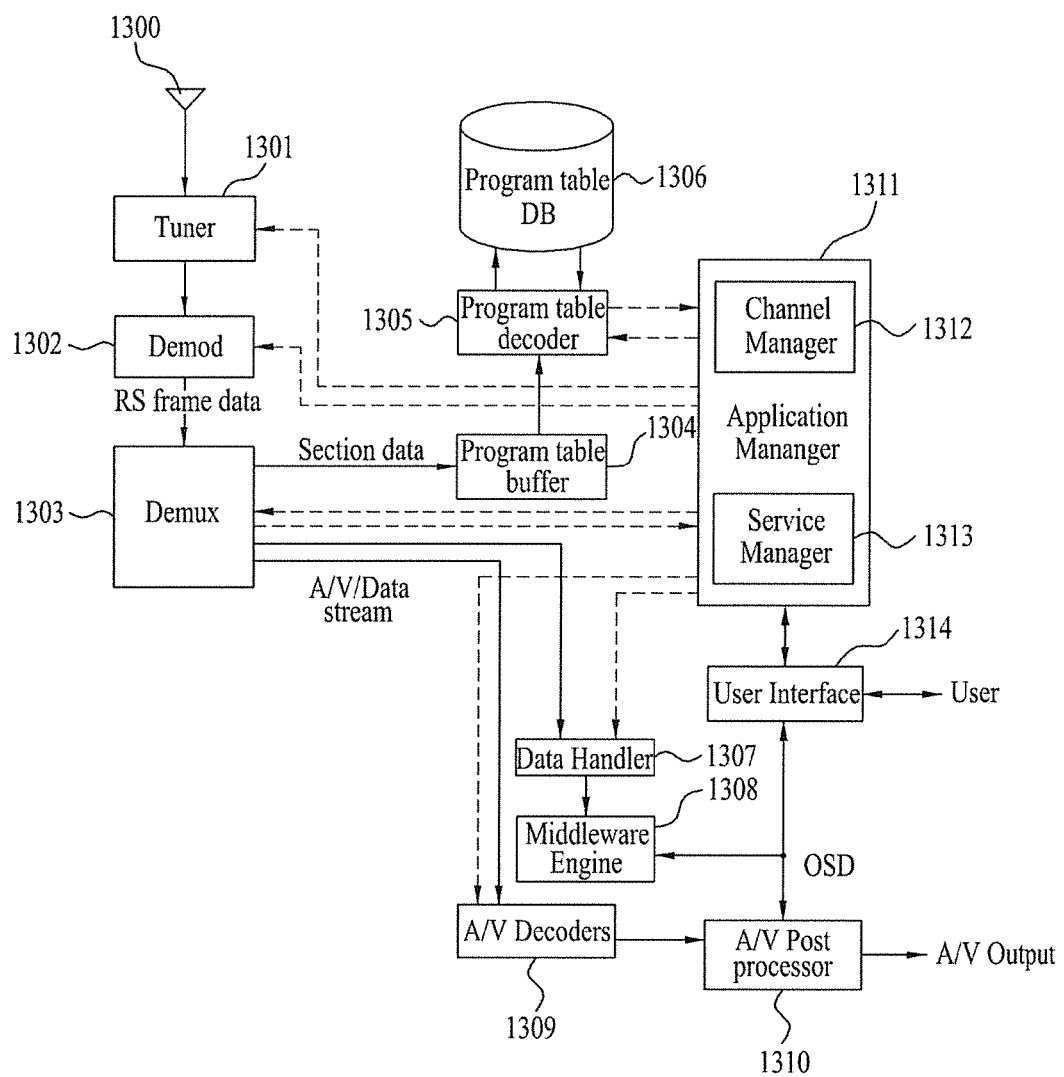
FIG. 57 is a block diagram illustrating a receiving system according to an embodiment of the present invention.

FIG. 57 is a block diagram illustrating a receiving system according to an embodiment of the present invention.

The receiving system of FIG. 57 includes an antenna 1300, a tuner 1301, a demodulating unit 1302, a demultiplexer 1303, a program table buffer 1304, a program table decoder 1305, a program table storage unit 1306, a data handler 1307, a middleware engine 1308, an A/V decoder 1309, an A/V post-processor 1310, an application manager 1311, and a user interface 1314. The application manager 1311 may include a channel manager 1312 and a service manager 1313.

In FIG. 57, solid lines indicate data flows and dotted lines indicate control flows.

The tuner 1301 tunes to a frequency of a specific channel through any of an antenna, a cable, or a satellite and down-converts the frequency to an Intermediate Frequency (IF) signal and outputs the IF signal to the demodulating unit 1302.

In one embodiment of the present invention, the tuner 1301 may select a frequency of a specific mobile broadcasting channel from among broadcasting channels transmitted via the antenna 1300. For example, if it is assumed that the receiving system is a terminal having both a communication function such as a phone function and a broadcast function such as a mobile broadcasting function, the antenna 1300 may be used as a broadcasting antenna, and an additional communication antenna may also be included in the receiving system. That is, the broadcasting antenna may be physically different than the communication antenna. For another example, one antenna may be used as both the broadcasting antenna and the communication antenna. For still another example, a plurality of antennas having different polarization characteristics may be used as a substitute for the broadcasting antenna, so that a multi-path diversity scheme is made available. In this case, although a quality of a received broadcast signal increases in proportion to the number of used antennas, power consumption excessively increases and the size of a space occupied by an overall system also increases. Therefore, it is preferable that a proper number of diversity antennas be used in consideration of the above-mentioned limitations.

Herein, the tuner 1301 is controlled by the channel manager 1312 in the application manager 1311 and reports the result and strength of a broadcast signal of the tuned channel to the channel manager 1312. Data received through the frequency of the specific channel includes main service data, mobile service data, a transmission parameter, and program table information for decoding the main service data and the mobile service data.

The demodulating unit 1302 performs VSB demodulation, channel equalization, etc., on the signal output from the tuner 1301 and identifies and separately outputs main service data and mobile service data. The demodulating unit 1302 will be described in detail in a later.

On the other hand, the transmitter can transmit signaling information (or TPC information) including transmission parameters by inserting the signaling information into at least one of a field synchronization region, a known data region, and a mobile service data region. Accordingly, the demodulating unit 1302 can extract the transmission parameters from the field synchronization region, the known data region, and the mobile service data region.

The transmission parameters may include sub_frame_number field, slot_number field, parade_id field, starting_group_number (SGN) field, number_of group_minus_1 (NoG−1) field, parade_repetition_cycle_minus_1 (PRC−−1) field, rs_frame_mode field, rs_code_mode_primary field, rs_code_mode_secondary field, sccc_block_mode field, sccc_outer_code_mode_a field, sccc_outer_code_mode_b field, sccc_outer_code_mode_c field, sccc_outer_code_mode_d field, sccc_outer_code_mode_e field, fic_version field, parade_continuity_counter field, TNoG field, group_extension_mode field, c2s_parade_nogd field, c2s_parade_num field, training_concatenation_indicator field and tpc_protocol_version field, etc.

The demodulating unit 1302 performs block decoding, RS frame decoding, etc., using the extracted transmission parameters. For example, the demodulating unit 1302 performs block decoding of each region in a data group with reference to SCCC-related information (for example, SCCC block mode information or an SCCC outer code mode) included in the transmission parameters and performs RS frame decoding of each region included in the data group with reference to RS-related information (for example, an RS code mode).

In the embodiment of the present invention, an RS frame including mobile service data demodulated by the demodulating unit 1302 is input to the demultiplexer 1303.

That is, data inputted to the demultiplexer 1303 has an RS frame payload format as shown in FIG. 48. More specifically, the RS frame decoder of the demodulating unit 1302 performs the reverse of the encoding process performed at the RS frame encoder of the transmission system to correct errors in the RS frame and then outputs the error-corrected RS frame payload to a data derandomizer. The data derandomizer then performs derandomizing on the error-corrected RS frame payload through the reverse of the randomizing process performed at the transmission system to obtain an RS frame payload as shown in FIG. 48.

The demultiplexer 1303 may receive RS frame payloads of all parades and may also receive only an RS frame payload of a parade including a mobile service that the user desires to receive through power supply control. For example, when RS frame payloads of all parades are received, the demultiplexer 1303 can demultiplex a parade including a mobile service that the user desires to receive using a parade_id.

When one parade carries two RS frames, the demultiplexer 1303 needs to identify an RS frame carrying an ensemble including mobile service data to be decoded from a parade containing a mobile service that the user desires to receive. That is, when a received single parade or a parade demultiplexed from a plurality of parades carries a primary ensemble and a secondary ensemble, the demultiplexer 1303 selects one of the primary and secondary ensembles.

In an embodiment, the demultiplexer 1303 can demultiplex an RS frame carrying an ensemble including mobile service data to be decoded using an ensemble_id created by adding one bit to a left position of the parade_id.

The demultiplexer 1303 refers to the header of the mobile service data packet within the RS frame payload belonging to the ensemble including the mobile service data that are to be decoded, thereby identifying when the corresponding mobile service data packet is the signaling table information or the IP datagram of the mobile service data. Alternatively, when the signaling table information and the mobile service data are both configured in the form of IP datagrams, the demultiplexer 1303 may use the IP address in order to identify the IP datagram of the program table information and the mobile service data.

Herein, the identified signaling table information is outputted to the program table buffer 1304. And, audio/video/data streams are separated from the IP datagram of mobile service data that are to be selected among the IP datagrams of the identified mobile service data, thereby being respectively outputted to the A/V decoder 1309 and/or the data handler 1307.

According to an embodiment of the present invention, when the stuff_indicator field within the header of the mobile service data packet indicates that stuffing bytes are inserted in the payload of the corresponding mobile service data packet, the demultiplexer 1303 removes the stuffing bytes from the payload of the corresponding mobile service data packet. Then, the demultiplexer 1303 identifies the program table information and the mobile service data. Thereafter, the demultiplexer 1303 identifies A/V/D streams from the identified mobile service data.

The program table buffer 1304 temporarily stores the section-type program table information and then outputs the section-type program table information to the program table decoder 1305.

The program table decoder 1305 identifies tables using a table_id and a section_length in the program table information and parses sections of the identified tables and produces and stores a database of the parsed results in the program table storage unit 1306. For example, the program table decoder 1305 collects sections having the same table identifier (table_id) to construct a table. The program table decoder 1305 then parses the table and produces and stores a database of the parsed results in the program table storage unit 1306.

The A/V decoder 1309 decodes the audio and video streams outputted from the demultiplexer 1303 using audio and video decoding algorithms, respectively. The decoded audio and video data is outputted to the A/V post-processor 1310.

Here, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The data handler 1307 processes data stream packets required for data broadcasting among data stream packets separated (or identified) by the demultiplexer 1303 and provides the processed data stream packets to the middleware engine 1310 to allow the middleware engine 1310 to be multiplexed them with A/V data. In an embodiment, the middleware engine 1310 is a Java middleware engine.

The application manager 1311 receives a key input from the TV viewer and displays a Graphical User Interface (GUI) on the TV screen in response to a viewer request through a User Interface (UI). The application manager 1311 also writes and reads information regarding overall GUI control of the TV, user requests, and TV system states to and from a memory (for example, NVRAM or flash memory). In addition, the application manager 1311 can receive parade-related information (for example, a parade_id) from the demodulating unit 1302 to control the demultiplexer 1303 to select an RS frame of a parade including a required mobile service. The application manager 1311 can also receive an ensemble_id to control the demultiplexer 1303 to select an RS frame of an ensemble including mobile service data to be decoded from the parade. The application manager 1311 also controls the channel manager 1312 to perform channel-related operations (for example, channel map management and program table decoder operations).

The channel manager 1312 manages physical and logical channel maps and controls the tuner 1301 and the program table decoder 1305 to respond to a channel-related request of the viewer. The channel manager also requests that the program table decoder 1305 parse a channel-related table of a channel to be tuned and receives the parsing results from the program table decoder 1305.

Figure 58:
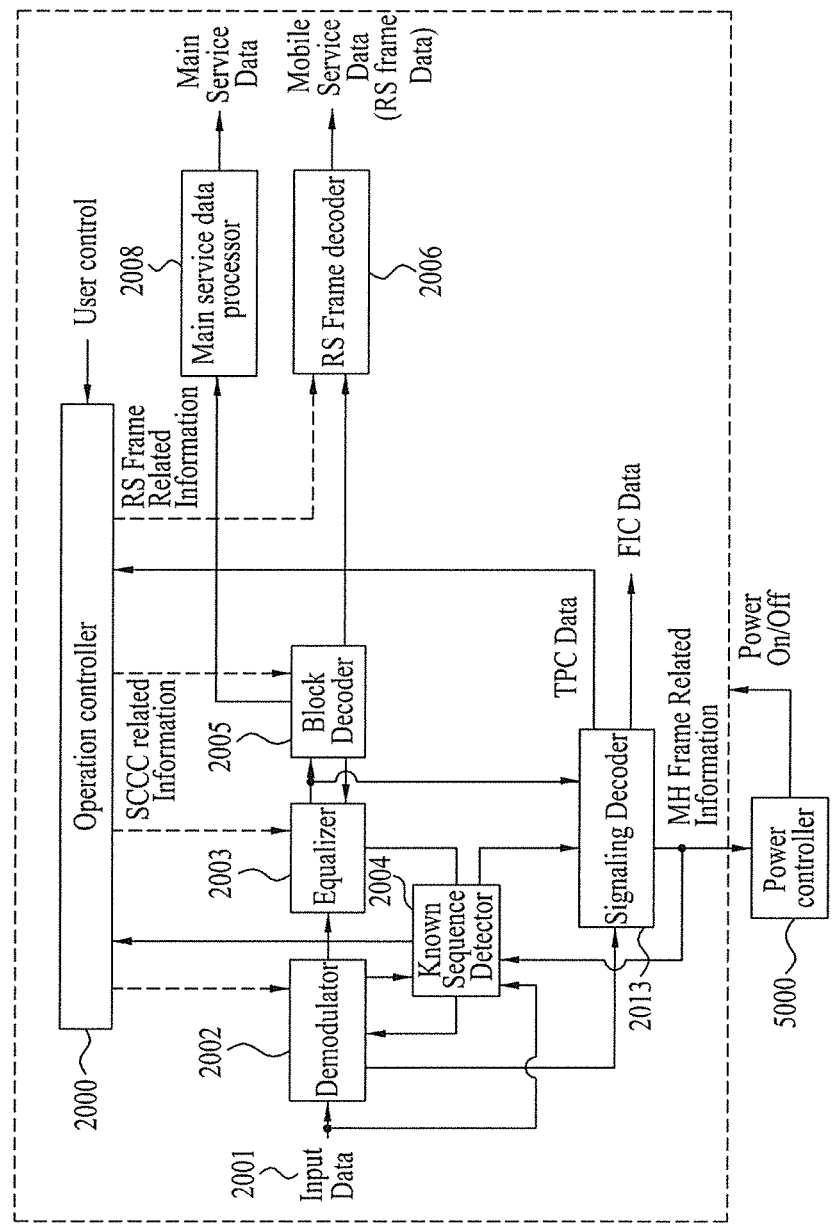
FIG. 58 illustrates an example of a demodulating unit in a digital broadcast receiving system according to the present invention.

FIG. 58 illustrates an example of a demodulating unit in a digital broadcast receiving system according to the present invention.

The demodulating unit of FIG. 58 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 58, the demodulating unit includes an operation controller 2000, a demodulator 2002, an equalizer 2003, a known sequence detector 2004, a block decoder 2005, and a RS frame decoder 2006. The demodulating unit may further include a main service data processor 2008. The main service data processor 2008 may include a data deinterleaver, a RS decoder, and a data derandomizer. The demodulating unit may further include a signaling decoder 2013. The receiving system also may further include a power controller 5000 for controlling power supply of the demodulating unit.

More specifically, a frequency of a particular channel tuned by a tuner down converts to an intermediate frequency (IF) signal. Then, the down-converted data 2001 outputs the down-converted IF signal to the demodulator 2002 and the known sequence detector 2004. At this point, the down-converted data 2001 is inputted to the demodulator 2002 and the known sequence detector 2004 via analog/digital converter ADC (not shown). The ADC converts pass-band analog IF signal into pass-band digital IF signal.

The demodulator 2002 performs self gain control, carrier recovery, and timing recovery processes on the inputted pass-band digital IF signal, thereby modifying the IF signal to a base-band signal. Then, the demodulator 2002 outputs the newly created base-band signal to the equalizer 2003 and the known sequence detector 2004.

The equalizer 2003 compensates the distortion of the channel included in the demodulated signal and then outputs the error-compensated signal to the block decoder 2005.

At this point, the known sequence detector 2004 detects the known sequence position information inserted by the transmitting end from the input/output data of the demodulator 2002 (i.e., the data prior to the demodulation process or the data after the demodulation process). Thereafter, the position information along with the symbol sequence of the known data, which are generated from the detected position, is outputted to the operation controller 2000, the demodulator 2002, the equalizer 2003, and the signaling decoder 2013. Also, the known sequence detector 2004 outputs a set of information to the block decoder 2005. This set of information is used to allow the block decoder 2005 of the receiving system to identify the mobile service data that are processed with additional encoding from the transmitting system and the main service data that are not processed with additional encoding.

In addition, although the connection status is not shown in FIG. 58, the information detected from the known sequence detector 2004 may be used throughout the entire receiving system and may also be used in the RS frame decoder 2006.

The data demodulated in the demodulator 2002 or the data equalized in the channel equalizer 2003 is inputted to the signaling decoder 2013. The known data position information detected in the known sequence detector 2004 is inputted to the signaling decoder 2013.

The signaling decoder 2013 extracts and decodes signaling information (e.g., TPC information, and FIC information), which inserted and transmitted by the transmitting end, from the inputted data, the decoded signaling information provides to blocks requiring the signaling information.

More specifically, the signaling decoder 2013 extracts and decodes TPC data and FIC data, which inserted and transmitted by the transmitting end, from the equalized data, and then the decoded TPC data and FIC data outputs to the operation controller 2000, the known sequence detector 2004, and the power controller 5000. For example, the TPC data and FIC data is inserted in a signaling information region of each data group, and then is transmitted to a receiving system.

The signaling decoder 2013 performs signaling decoding as an inverse process of the signaling encoder shown in FIG. 57, so as to extract TPC data and FIC data. For example, the signaling decoder 2013 decodes the inputted data using the PCCC method and derandomizes the decoded data, thereby dividing the derandomized data into TPC data and FIC data. At this point, the signaling decoder 2013 performs RS-decoding on the divided TPC data, so as to correct the errors occurring in the TPC data. Subsequently, the signaling decoder 2013 deinterleaves the divided FIC data and then performs RS-decoding on the deinterleaved FIC data, so as to correct the error occurring in the FIC data. The error-corrected TPC data are then outputted to the operation controller 2000, the known sequence detector 2004, and the power controller 5000.

The TPC data may also include a transmission parameter which is inserted into the payload region of a packet by the service multiplexer, and then is transmitted to transmitter.

Herein, the TPC data may include RS frame information, SCCC information, M/H frame information, and so on, as shown in FIG. 57. The RS frame information may include RS frame mode information and RS code mode information. The SCCC information may include SCCC block mode information and SCCC outer code mode information. The M/H frame information may include M/H frame index information, and the TPC data may include sub-frame count information, slot count information, parade_id information, SGN information, NoG information, and so on.

At this time, the signaling information area within the data group can be identified using known data information output from the known data detector 2004. The signaling information area is located from the first segment of data block B4 within the data group to a part of the second segment as shown in FIG. 58. Namely, in the present invention, 276 (=207+69) bytes of the data block B4 of each data group are assigned to an area for inserting signaling information. In other words, the signaling information area includes 207 bytes of the first segment of the data block B4 and first 69 bytes of the second segment of the data block B4. The first known data sequence (i.e., first training sequence) is inserted into the last two segments of the data block B3, and the second known data sequence (i.e., second training sequence) is inserted into the second and third segments of the data block B4. At this time, since the second known data sequence is received subsequently to the signaling information area, the signaling decoder 2013 can decode the signaling information of the signaling information area by extracting the same from the data output from the demodulator 2002 or the channel equalizer 2003.

The power controller 5000 receives M/H frame associated information from the signaling decoder 2013, so as to control the power of the tuner and the demodulator. The power controller 5000 may also receive power controlling information from the operation controller 2000 in order to control the power of the tuner and the demodulator.

According to the embodiment of the present invention, the power controller 5000 turns the power on at a slot having a group of a parade assigned thereto, the parade including a mobile service that is requested (or wanted) by the user, assigned thereto, so as to receive data. And, also according to the embodiment of the present invention, the power controller 5000 may turn the power off at the other slots.

By using the known data sequences when performing timing recovery or carrier recovery, the demodulator 2002 may enhance its demodulating performance. Similarly, by using the known data, the equalizer 2003 may also enhance its enhancing performance. Furthermore, the decoding result of the block decoder 2005 may be fed-back to the equalizer 2003, so as to enhance the equalizing performance.

When the data, which are channel-equalized by the equalizer 2003 and inputted to the block decoder 2005, correspond to data processed with both block encoding and trellis encoding by the transmitting system (e.g., data within the RS frame), trellis decoding and block decoding may be performed on the corresponding data as inverse processes of the transmitting system. However, if the data correspond to data that are only trellis decoded and not block decoded by the transmitting system (e.g., main service data), only trellis decoding is performed.

The data that are trellis decoded and block decoded by the block decoder 2005 are outputted to the RS frame decoder 2006. More specifically, among the data existing in the group, the block decoder 2005 removes the known data, the data used for trellis initializing, the signaling information data, the MPEG header, and the RS parity data that were added by the RS encoder/non-systematic RS encoder or the non-systematic RS encoder of the transmitting system. Thereafter, the block decoder 2005 outputs the processed data to the RS frame decoder 2006. More specifically, only the data of the RS frame assigned to the group are outputted to the RS frame decoder 2006. For example, the data of the primary RS frame assigned to the primary group division of the group and the data of the overlay RS frame assigned to the secondary group division of the group are outputted to the RS frame decoder 2006.

Meanwhile, the data trellis-decoded by the block decoder 2005 are outputted to the data deinterleaver of the main service data processing unit 2008. At this point, the data that are trellis-decoded by the block decoder 2005 and outputted to the data deinterleaver may include main service data as well as the data within the RS frame and signaling information. Also, the RS parity data that are added after passing through the pre-processor 230 of the transmitting system may also be included in the data being outputted to the data deinterleaver.

If the inputted data correspond to data that are only trellis encoded and not block encoded by the transmitting system, the block decoder 2005 either performs Viterbi (or trellis) decoding on the input data, thereby outputting a hard decision value, or performs hard-decision on a soft-decision value, thereby outputting the processed result.

When the inputted data correspond to data processed with both block encoding and trellis encoding by the transmitting system, the block decoder 2005 outputs a soft decision value of the input data.

More specifically, if the input data are processed with block encoding by the block processor 302 of the transmitting system and processed with trellis encoding by the trellis encoding module 256 of the transmitting system, the block decoder 2005 performs trellis decoding and block decoding as inverse processes of the transmitting system. At this point, the block processor of the transmitting system may be considered as an outer encoder, and the trellis encoding module may be considered as an inner encoder.

When decoding such concatenated codes, in order to maximize the decoding performance of the outer code, it is preferable that the decoder of the inner code outputs a soft decision value.

Meanwhile, since the main service data processing unit 2008 consists of blocks required for receiving main service data, the main service data processing unit 2008 may not be required in a receiving system structure for receiving only the mobile service data.

The data deinterleaver included in the main service data processing unit 2008 deinterleaves the data outputted from the block decoder 2005, as an inverse process of the data interleaver included in the transmitting system, and outputs the deinterleaved data to the RS decoder. The data being inputted to the data deinterleaver include not only the main service data but also mobile service data, known data, RS parity, MPEG header, and so on. The RS decoder performs a systematic RS decoding process on the deinterleaved data, thereby outputting the processed data to the derandomizer. The derandomizer receives the data outputted from the RS decoder and generates a pseudo random byte identical to that of the randomizer of the transmitting system. Thereafter, the derandomizer performs a bitwise XOR (exclusive OR) on the generated pseudo random byte, so as to insert an MPEG sync byte at the beginning of each packet, thereby outputting 188-byte packet units.

The RS frame decoder 2006 receives the data of the RS frame that was assigned to each group, so as to configure the corresponding RS frame. Then, the RS frame decoder 2006 performs CRC-RS decoding in the configured RS frame units. For example, the present invention may refer to the TPC data decoded by the signaling decoder 2013 in order to configure the CMM primary RS frame, the CMM secondary RS frame, the EMM primary RS frame, the EMM secondary RS frame, and the super RS frame. At this point, the primary RS frame is configured by gathering (or collecting) data assigned to the primary group division within the group, and the secondary RS frame and the overlay RS frame are configured by gathering (or collecting) data assigned to the secondary group division within the group.

The RS frame decoder 2006 adds a 1-byte MPEG sync byte, which was removed during the RS frame encoding process, to the mobile service data packet within the error-corrected RS frame, thereby performing derandomizing on the processed data.

The above-described embodiment of the present invention is even more effective when applied to portable and mobile receivers, which require robustness against frequent channel changes and noise.

Most particularly, the present invention may use a portion of the channel capacity or the entire channel capacity to which the data for main services have been transmitted, so as to transmit data for mobile services. Then, the receiving system may receive such data and process the received data.

Figure 59:
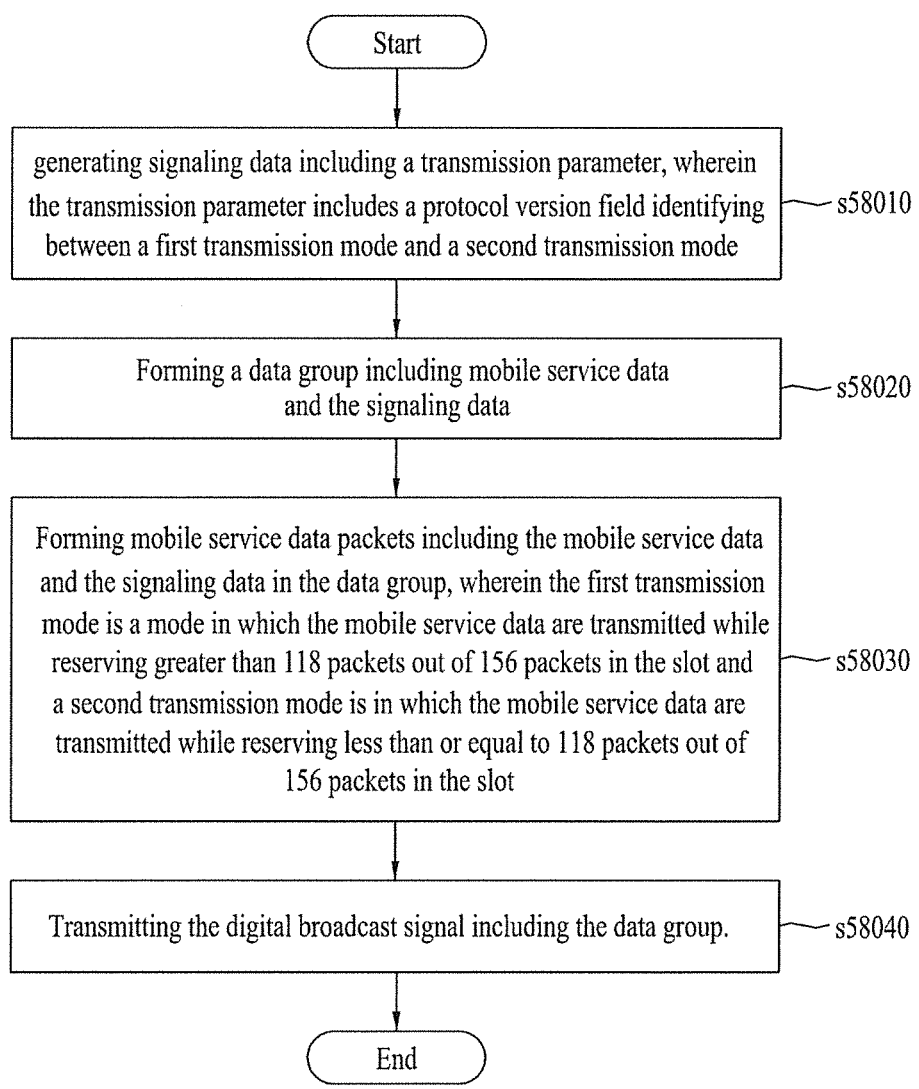
FIG. 59 illustrates a flow chart showing the process steps for processing mobile service data including signaling data for SFCMM according to an embodiment of the present invention.

FIG. 59 illustrates a flow chart showing the process steps for processing mobile service data including signaling data for SFCMM according to an embodiment of the present invention.

A signaling encoder within the transmitter generates a transmission parameter. At this point, the generated transmission parameter includes a protocol version field. The protocol version information according to the embodiment of the present invention includes information identifying whether the data being transmitted are specified for CMM or for SFCMM (s58010). By using this information, the receiver may differentiate data of CMM from data of SFCMM so as to perform the data processing procedure. For example, referring to the above-described protocol version, a CMM receiver may omit the processing of transmission parameters that are required only for SFCMM. By using the same processing method, in a broadcasting system adopting SFCMM, a CM receiver may maintain backward compatibility.

A group formatter within the transmitter generates a data group including the generated transmission parameter and mobile service data (s58020).

A packet formatter within the transmitter packetizes data included in the generated data group (s58030). Therefore, the packets being outputted from the packet formatter include the transmission parameter and mobile service data. As described above, the transmission parameter may indicate whether the system is being operated as a CMM system or an SFCMM system. More specifically, the transmission parameter includes information identifying whether the digital broadcasting system is using more than 118 data packets of a total of 156 data packets that can be included in a single slot for mobile services, or whether the digital broadcasting system is using 118 data packets or less for mobile services.

The packetized data undergo an additional processing procedure for transmission, thereby being transmitted to the receiver through a transmission unit (s58040).

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for transmitting broadcast signals, the method comprising:
    FEC (Forward Error Correction) encoding broadcast data for broadcast service;
    encoding the FEC encoded broadcast data using a specific code rate;
    encoding signaling information including transmission parameters and service acquisition data, the service acquisition data carrying cross-layer information to enable fast service acquisition and the transmission parameters including code rate information specifying the specific code rate;

generating data frames including the encoded broadcast data and the signaling information; and transmitting the broadcast signals including the data frames, wherein signaling information further includes information specifying a transmission mode, wherein the data frames include a plurality of data units, wherein each of the data units includes known data used for channel equalization at a receiver, and wherein the signaling information further includes information specifying neighboring data units that include the known data.

2. The method of claim 1, wherein:

the signaling information further includes information specifying a number of broadcast data included in the data frames; and the number of the broadcast data is scalable.

3. The method of claim 1, wherein the signaling information further includes version information indicating a version of the service acquisition data.

4. An apparatus for transmitting broadcast signals, the apparatus comprising:

a first encoder configured to FEC (Forward Error Correction) encode broadcast data for broadcast service;

a second encoder configured to encode the FEC encoded broadcast data using a specific code rate;

a signaling encoder configured to encode signaling information including transmission parameters service acquisition data, the service acquisition data carrying cross-layer information to enable fast service acquisition and the transmission parameters including code rate information specifying the specific code rate;

a generating unit configured to generate data frames including the encoded broadcast data and the signaling information; and a transmission unit configured to transmit the broadcast signals including the data frames, wherein the signaling information further includes information specifying a transmission mode, wherein the data frames include a plurality of data units, wherein each of the data units includes known data used for channel equalization at a receiver, and wherein the signaling information further includes information specifying neighboring data units that include the known data.

5. The apparatus of claim 4, wherein:

the signaling information further includes information specifying a number of broadcast data included in the data frames; and the number of the broadcast data is scalable.

6. The apparatus of claim 4, wherein the signaling information further includes version information indicating a version of the service acquisition data.

* * * * *